(12) United States Patent
Kumagai et al.

(10) Patent No.: US 8,856,717 B2
(45) Date of Patent: Oct. 7, 2014

(54) SHIELDED PATTERN GENERATION FOR A CIRCUIT DESIGN BOARD

(75) Inventors: Kazunori Kumagai, Kawasaki (JP); Eiichi Konno, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 25 days.

(21) Appl. No.: 12/883,445

(22) Filed: Sep. 16, 2010

(65) Prior Publication Data

US 2011/0061039 A1 Mar. 10, 2011

Related U.S. Application Data

(63) Continuation of application No. PCT/JP2008/056326, filed on Mar. 31, 2008.

(51) Int. Cl.
G06F 17/50 (2006.01)
H05K 3/00 (2006.01)
H05K 1/02 (2006.01)

(52) U.S. Cl.
CPC .......... *G06F 17/5077* (2013.01); *H05K 3/0005* (2013.01); *H05K 1/0219* (2013.01); *H05K 2201/09618* (2013.01)
USPC ........... 716/126; 716/118; 716/119; 716/132; 716/110

(58) Field of Classification Search
None
See application file for complete search history.

(56) References Cited

U.S. PATENT DOCUMENTS 6,496,957 B1 * 12/2002 Kumagai .................. 716/112
7,752,591 B2 7/2010 Matsumoto
8,166,443 B2 4/2012 Aoki et al.

FOREIGN PATENT DOCUMENTS

| JP | 5-299878 | 11/1993 |
|---|---|---|
| JP | 8-106489 | 4/1996 |
| JP | 10-134101 | 5/1998 |
| JP | 11-163539 | 6/1999 |
| JP | 2001-175695 | 6/2001 |
| JP | 2001-357094 | 12/2001 |
| JP | 2003-186931 | 7/2003 |
| JP | 2003-198146 | 7/2003 |
| JP | 2008-26953 | 2/2008 |
| WO | 2007/077623 | 7/2007 |

OTHER PUBLICATIONS

International Search Report mailed May 1, 2008 for International Application No. PCT/JP2008/056326.

Japanese Office Action mailed Jul. 3, 2012 issued in corresponding Japanese Patent Application No. 2010-505155.

* cited by examiner

*Primary Examiner* — A. M. Thompson
(74) *Attorney, Agent, or Firm* — Staas & Halsey LLP

(57) ABSTRACT

A circuit board design aid is achieved by generating a shield pattern for a wiring pattern including a pattern element in a circuit board by increasing a width of a geometry of the pattern element by an amount corresponding to a shield pattern spacing set as a preset pattern generation condition. A prohibition region is generated based on a geometry of an element for which a clearance check is to be performed located around the wiring pattern and a clearance condition between the element for performing a clearance check and the wiring pattern. Then, the shield pattern is generated by excluding the geometry of the prohibition region from the geometry of the basic shield pattern element.

19 Claims, 65 Drawing Sheets

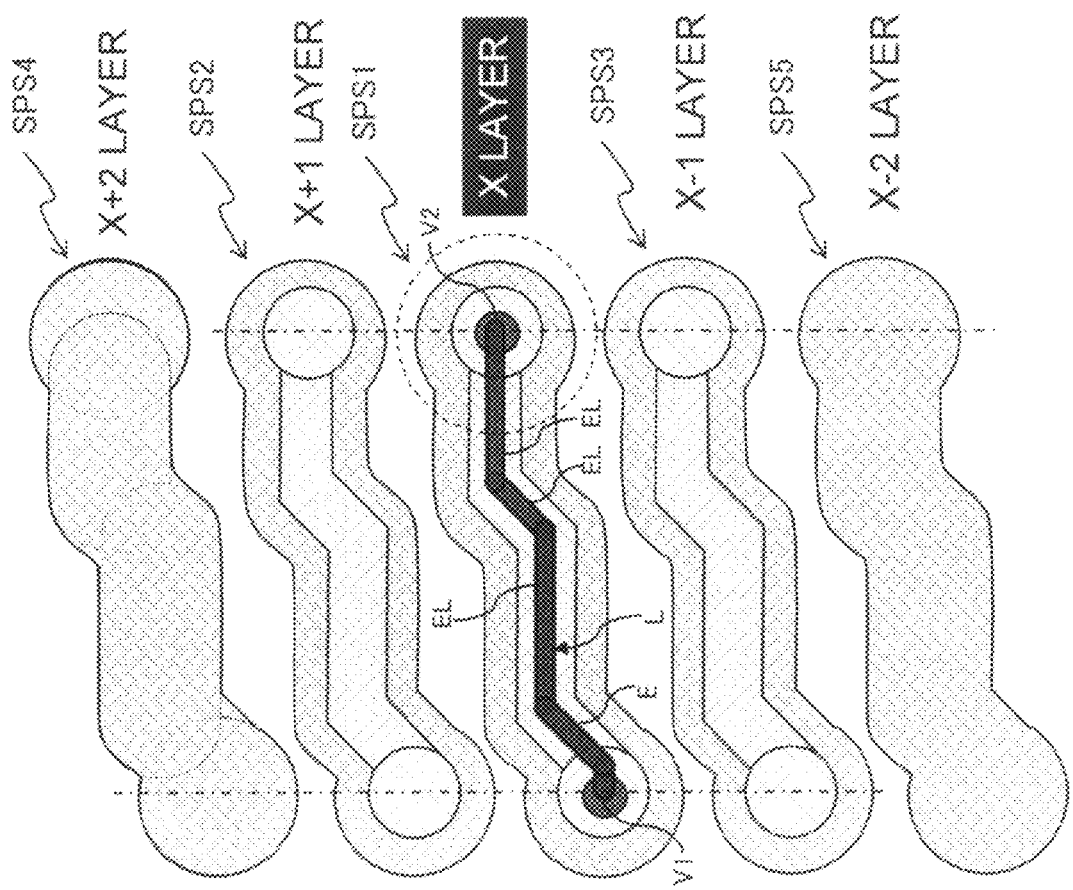
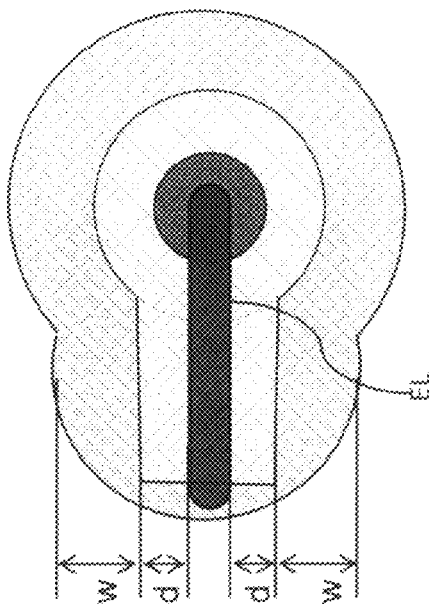
FIG. 6A
FIG. 6B

FIG. 8

| TYPE | ALLOWED NET | GEOMETRY | LAYER |
|---|---|---|---|
| PATTERN PROHIBITED | NONE | RECTANGLE (LOWER LEFT COORDINATE (2225, 2300), UPPER RIGHT COORDINATE (2975, 2900)) | L1 |

| NET NAME PAIR | PATTERN TYPE | SPACING REFERENCE VALUE |
|---|---|---|
| SIG-1, SIG-2 | LINE VS. LINE | 100 |
| SIG-1, SIG-2 | LINE VS. PLANE PATTERN | 100 |
| SIG-1, SIG-2 | LINE VS. VIA | 100 |
| SIG-1, SIG-2 | LINE VS. PART PIN | 100 |
| SIG-1, SIG-2 | LINE VS. LAND/HOLE | 100 |
| SIG-1, SIG-2 | PLANE PATTERN VS. PLANE PATTERN | 100 |
| SIG-1, SIG-2 | PLANE PATTERN VS. VIA | 100 |
| SIG-1, SIG-2 | PLANE PATTERN VS. PART PIN | 100 |
| SIG-1, SIG-2 | PLANE PATTERN VS. LAND/HOLE | 100 |
| SIG-1, SIG-2 | VIA VS. VIA | 100 |
| SIG-1, SIG-2 | VIA VS. PART PIN | 100 |
| SIG-1, SIG-2 | VIA VS. LAND/HOLE | 100 |
| SIG-1, SIG-2 | PART PIN VS. PART PIN | 100 |
| SIG-1, SIG-2 | PART PIN VS. LAND/HOLE | 100 |
| SIG-1, SIG-2 | LAND/HOLE VS. LAND/HOLE | 100 |
| SIG-1, GND | LINE VS. LINE | 100 |
| SIG-1, GND | LINE VS. PLANE PATTERN | 100 |
| SIG-1, GND | LINE VS. VIA | 100 |
| SIG-1, GND | LINE VS. PART PIN | 100 |
| SIG-1, GND | LINE VS. LAND/HOLE | 100 |
| SIG-1, GND | PLANE PATTERN VS. PLANE PATTERN | 100 |
| SIG-1, GND | PLANE PATTERN VS. VIA | 100 |
| SIG-1, GND | PLANE PATTERN VS. PART PIN | 100 |
| SIG-1, GND | PLANE PATTERN VS. LAND/HOLE | 100 |
| SIG-1, GND | VIA VS. VIA | 100 |
| SIG-1, GND | VIA VS. PART PIN | 100 |
| SIG-1, GND | VIA VS. LAND/HOLE | 100 |
| SIG-1, GND | PART PIN VS. PART PIN | 100 |
| SIG-1, GND | PART PIN VS. LAND/HOLE | 100 |
| SIG-1, GND | LAND/HOLE VS. LAND/HOLE | 100 |
| SIG-2, GND | LINE VS. LINE | 100 |
| SIG-2, GND | LINE VS. PLANE PATTERN | 100 |
| SIG-2, GND | LINE VS. VIA | 100 |
| SIG-2, GND | LINE VS. PART PIN | 100 |
| SIG-2, GND | LINE VS. LAND/HOLE | 100 |
| SIG-2, GND | PLANE PATTERN VS. PLANE PATTERN | 100 |
| SIG-2, GND | PLANE PATTERN VS. VIA | 100 |
| SIG-2, GND | PLANE PATTERN VS. PART PIN | 100 |
| SIG-2, GND | PLANE PATTERN VS. LAND/HOLE | 100 |
| SIG-2, GND | VIA VS. VIA | 100 |
| SIG-2, GND | VIA VS. PART PIN | 100 |
| SIG-2, GND | VIA VS. LAND/HOLE | 100 |
| SIG-2, GND | PART PIN VS. PART PIN | 100 |
| SIG-2, GND | PART PIN VS. LAND/HOLE | 100 |
| SIG-2, GND | LAND/HOLE VS. LAND/HOLE | 100 |

| NET NAME | GEOMETRY | LINE WIDTH | LAYER |
|---|---|---|---|
| SIG-1 | LINE SEGMENT (START COORDINATE (2300, 1850), END COORDINATE (3000, 1850)) | 100 | L8 |
| SIG-1 | LINE SEGMENT (START COORDINATE (3000, 1850), END COORDINATE (3650, 2500)) | 100 | L8 |
| SIG-1 | LINE SEGMENT (START COORDINATE (3650, 2500), END COORDINATE (4350, 2500)) | 100 | L8 |

| NET NAME | GEOMETRY | LAYER |
|---|---|---|
| SIG-2 | CIRCLE (CENTER COORDINATE (6200, 2000), RADIUS (150)) | L1~L12 |
| SIG-1 | CIRCLE (CENTER COORDINATE (2300, 1850), RADIUS (150)) | L1~L12 |
| SIG-1 | CIRCLE (CENTER COORDINATE (4350, 2500), RADIUS (150)) | L1~L12 |

| NET NAME | GEOMETRY | LAYER |
|---|---|---|
| GND | POLYGON (CONSTITUTING ELEMENT COUNT (7), ELEMENT E1(LINE SEGMENT (START COORDINATE (2515, 2030), END COORDINATE (2956, 2030))), ELEMENT E2(ARC (START COORDINATE (2956, 2030), END COORDINATE (2809, 2300), CENTER COORDINATE (2300, 1850))), ELEMENT E3(LINE SEGMENT (START COORDINATE (2809, 2300), END COORDINATE (2225, 2300))), ELEMENT E4(LINE SEGMENT (START COORDINATE (2225, 2300), END COORDINATE (2225, 2525))), ELEMENT E5(ARC (START COORDINATE (2225, 2525), END COORDINATE (2956, 1670), CENTER COORDINATE (2300, 1850))), ELEMENT E6(LINE SEGMENT (START COORDINATE (2956, 1670), END COORDINATE (2515, 1670))), ELEMENT E7(ARC (START COORDINATE (2515, 1670), END COORDINATE (2515, 2030), CENTER COORDINATE (2300, 1850)))) | L8 |
| GND | POLYGON (...) | L8 |
| GND | POLYGON (...) | L8 |
| GND | POLYGON (...) | L8 |
| GND | POLYGON (...) | L8 |
| GND | POLYGON (...) | L8 |
| GND | POLYGON (...) | L8 |

| NET NAME | GEOMETRY | LINE WIDTH | LAYER |
|---|---|---|---|
| SIG-1 | LINE SEGMENT (START COORDINATE (2300, 1850), END COORDINATE (3000, 1850)) | 100 | L8 |
| SIG-1 | LINE SEGMENT (START COORDINATE (3000, 1850), END COORDINATE (3650, 2500)) | 100 | L8 |
| SIG-1 | LINE SEGMENT (START COORDINATE (3650, 2500), END COORDINATE (4350, 2500)) | 100 | L8 |
| GND | ARC (START COORDINATE (2025, 2243), END COORDINATE (2593, 1470), CENTER COORDINATE (2300, 1850)) | 400 | L8 |
| GND | LINE SEGMENT (...) | 400 | L8 |
| GND | ARC (...) | 400 | L8 |
| GND | LINE SEGMENT (...) | 400 | L8 |
| GND | ARC (...) | 400 | L8 |
| GND | LINE SEGMENT (...) | 400 | L8 |
| GND | ARC (...) | 400 | L8 |

66-1, 66-2, 66-3, 66-4, 66-5, 66-6, 66-7, 66-8, 66-9, 66-10

SHIELDED PATTERN GENERATION FOR A CIRCUIT DESIGN BOARD

CROSS-REFERENCE TO RELATED APPLICATION

This application is a continuation Application of a PCT international application No. PCT/JP2008/056326 filed on Mar. 31, 2008 in Japan, the entire contents of which are incorporated by reference.

FIELD

The embodiments discussed herein are related to a technique for generating a shield pattern in a circuit board.

BACKGROUND

In recent years, compliance with the electro-magnetic compatibility (EMC) is increasingly becoming important in electronic circuits. In addition, the ratio of faster speed signals in an electronic circuit is rapidly increased due to increase in pin counts in recent large scale integrations (LSIs) and increase in the size of ball grid arrays (BGAs). Accordingly, in design of electronic apparatuses, reliable and efficient compliance with the EMC is desired.

A shield pattern is a design technique effective to reduce the radiation noises (electromagnetic noises) in a circuit board. For example, Patent Reference 1 and Patent Reference 2 listed below disclose a technique that automatically generates a shield pattern by automatically generating a ground line (guard pattern, ground guard wiring) around a signal line. In addition, Patent Reference 3 and Patent Reference 4 listed below disclose multi-layered circuit boards having a shield pattern in a layer above or below a signal line.

However, due to scaling and increase in the density of a circuit board, there are more cases in which an element that interferes with generation of a shield (obstruct) in the vicinity of a signal line to be shielded. This is increasingly making generation of a shield pattern completely encircle a signal line to be shielded difficult without causing any clearance error with the nearby obstruct.

In addition, the location of an element as described above that interferes with a shield pattern is often prohibited from being moved for the reason of easy of production and electrical properties. When there is an obstruct the location of which is prohibited from being changed, disposing as many shield patterns as possible around a signal line is desired, without causing any clearance error with this obstruct.

Patent Reference 1: Japanese Laid-Open Patent Publication No. H08-106489
Patent Reference 2: Japanese Laid-Open Patent Publication No. 2003-186931
Patent Reference 3: Japanese Laid-Open Patent Publication No. H05-299878
Patent Reference 4: Japanese Laid-Open Patent Publication No. 2003-198146

SUMMARY

However, conventional shield pattern automatic generation techniques stop generating shield patterns or do not generate some of shield patterns causing a clearance error when the clearance error occurs between a shield pattern and a nearby obstruct. Accordingly, there are issues wherein no shield pattern may be generated even in a location where no clearance error occurs, for example, which requires manual generation, thereby decreasing the design efficiency.

In addition, in conventional shield pattern automatic generation techniques, when a clearance error occurs between a shield pattern and a nearby obstruct, there are cases in which the clearance error is eliminated by changing the wiring route, editing (modifying) the wiring pattern. However, since there are more cases in which a clearance error occurs between a shield pattern and a nearby obstruct, quite a number of shield patterns are not generated due to the clearance error with the obstruct even when automatically generating a shield pattern after editing the wiring pattern. This requires repeating of editing of the wiring pattern and automatic generation of a shield pattern, which is time consuming, reducing the design efficiency.

According to an aspect of the invention, a circuit board design aid apparatus that generates a shield pattern for a wiring pattern includes at least one pattern element in a circuit board, the apparatus including: a basic shield pattern element generation section configured to generate a basic shield pattern element based on a geometry of the pattern element and a preset pattern generation condition; a prohibition region generation section configured to generate a prohibition region based on a geometry of an element for which a clearance check is to be performed located around the wiring pattern and a clearance condition between the element for performing a clearance check and the wiring pattern; and a shield pattern geometry generation section configured to generate the shield pattern by excluding the geometry of the prohibition region from a geometry of the basic shield pattern element.

In addition, a method for generating a shield pattern that generates a shield pattern for a wiring pattern includes at least one pattern element in a circuit board, the apparatus including: generating a basic shield pattern element based on a geometry of the pattern element and a preset pattern generation condition; generating a prohibition region based on a geometry of an element for which a clearance check is to be performed located around the wiring pattern and a clearance condition between the element for performing a clearance check and the wiring pattern; and generating the shield pattern by excluding the geometry of the prohibition region from a geometry of the basic shield pattern element.

In addition, a computer readable storage medium storing a circuit board design aid program for making a computer to generate a shield pattern for a wiring pattern includes at least one pattern element in a circuit board, the program making the computer to function as: a basic shield pattern the element generating section configured to generate a basic shield pattern element based on a geometry of the pattern element and a preset pattern generation condition; a prohibition region generation section configured to generate a prohibition region based on a geometry of an element for which a clearance check is to be performed located around the wiring pattern and a clearance condition between the element for performing a clearance check and the wiring pattern; and a shield pattern geometry generation section configured to generate the shield pattern by excluding the geometry of the prohibition region from a geometry of the basic shield pattern element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 6A and 6B are diagrams illustrating a shield pattern as one embodiment;

FIG. 8 is a diagram illustrating an example of prohibition region information of a circuit board design aid apparatus as one embodiment;

FIG. 9 is a diagram illustrating an example of reference information of a circuit board design aid apparatus as one embodiment;

FIG. 10 is a diagram illustrating an example of line information of a circuit board design aid apparatus as one embodiment;

FIG. 11 is a diagram illustrating an example of via information of a circuit board design aid apparatus as one embodiment;

FIG. 12 is a diagram illustrating an example of surface pattern information of a circuit board design aid apparatus as one embodiment;

FIG. 13 is a diagram illustrating another example of line information of a circuit board design aid apparatus as one embodiment;

DESCRIPTION OF EMBODIMENTS

Hereinafter, embodiments will be described with reference to the drawings.

Figure 1:
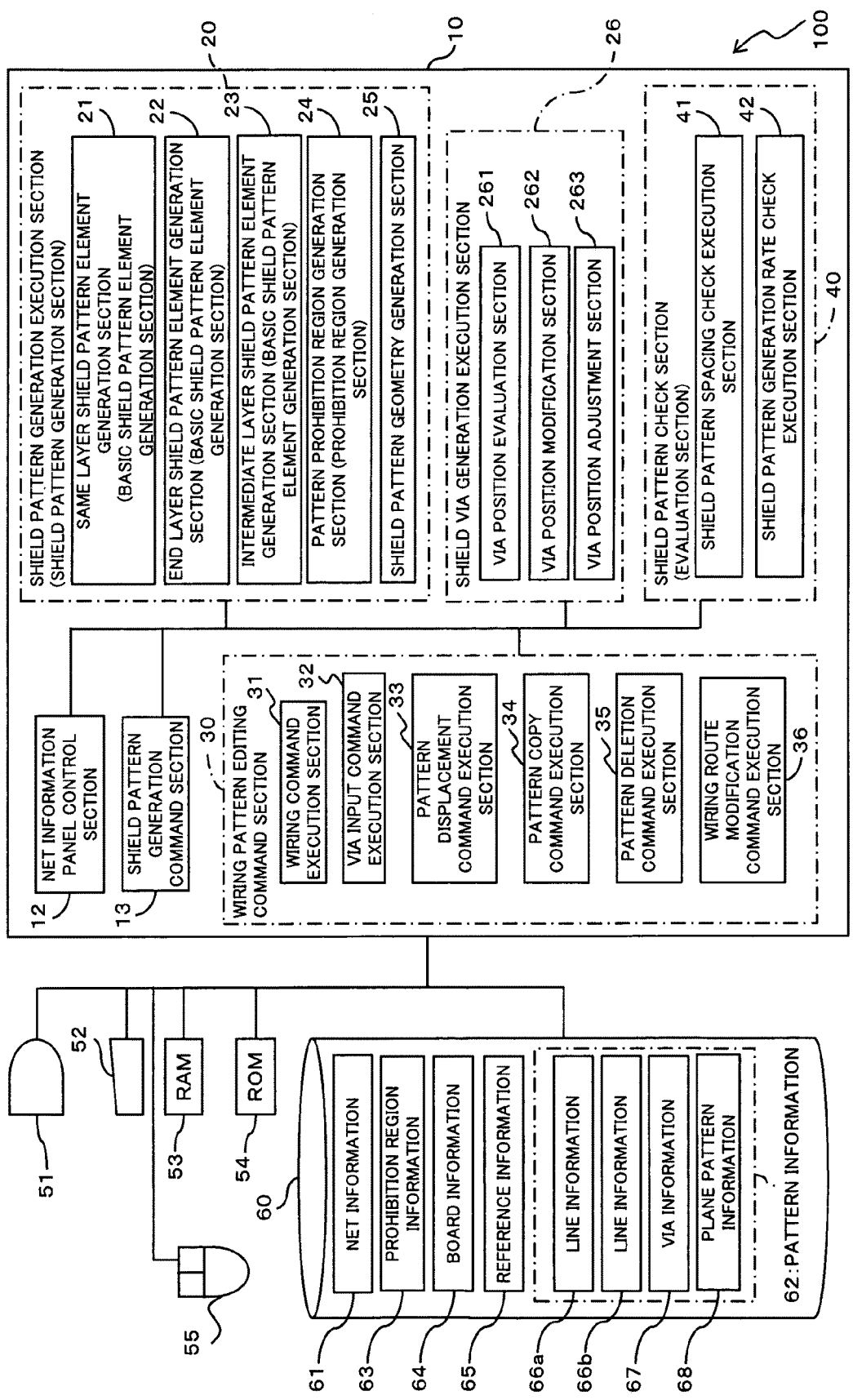
FIG. 1 is a diagram schematically illustrating the configuration of a circuit board design aid apparatus as one embodiment.
Figure 2:
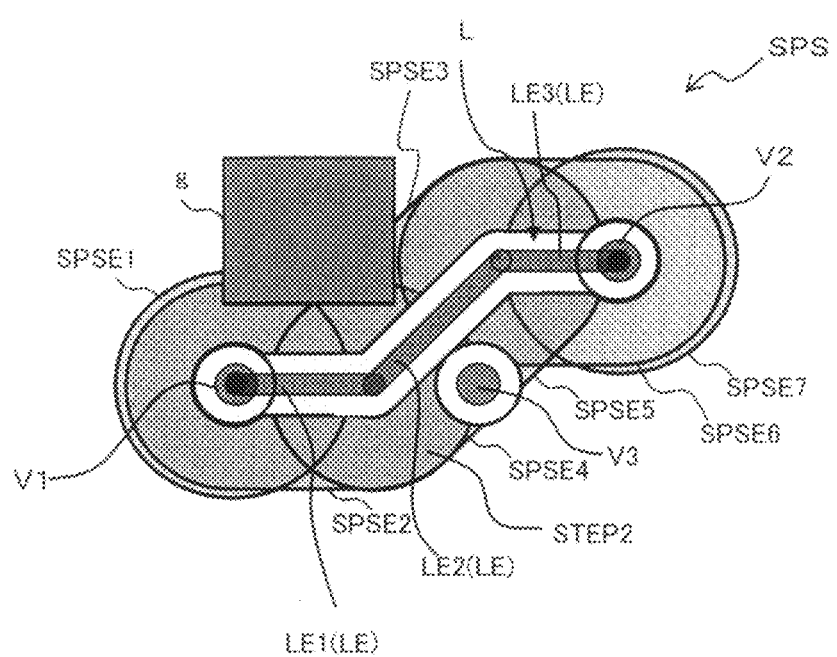
FIG. 2 is a diagram illustrating an example of a shield pattern generated by a circuit board design aid apparatus as one embodiment.
Figure 3:
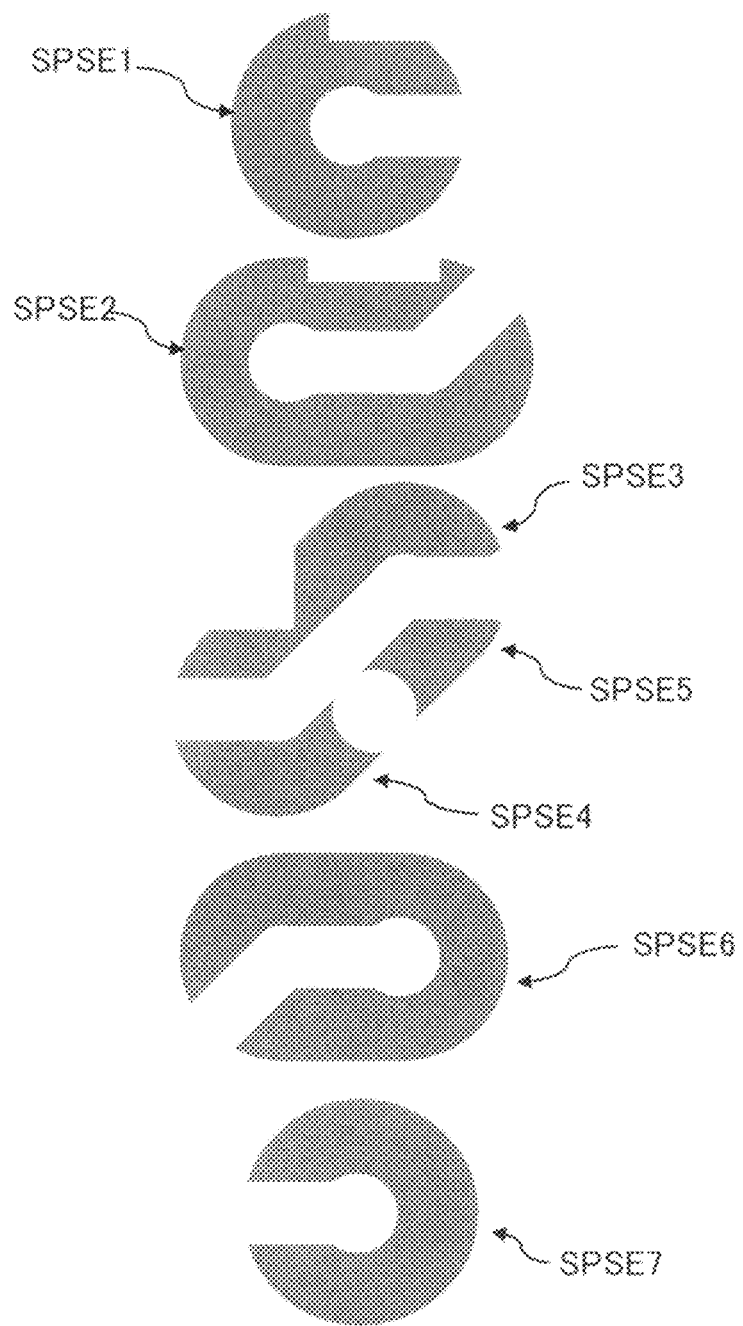
FIG. 3 is a diagram illustrating an example of a shield pattern generated by a circuit board design aid apparatus as one embodiment.
Figure 4:
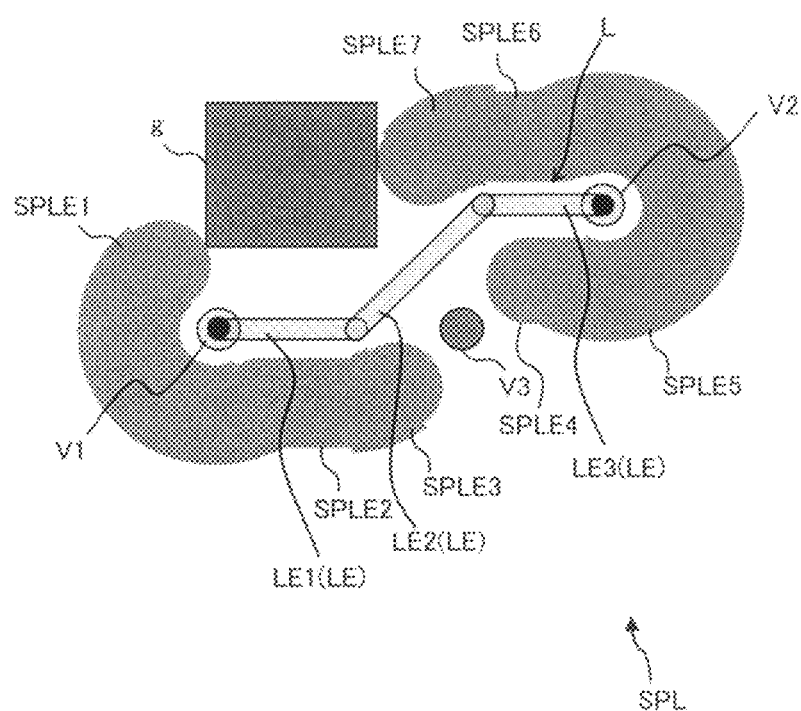
FIG. 4 is a diagram illustrating an example of a shield pattern generated by a circuit board design aid apparatus as one embodiment.
Figure 5:
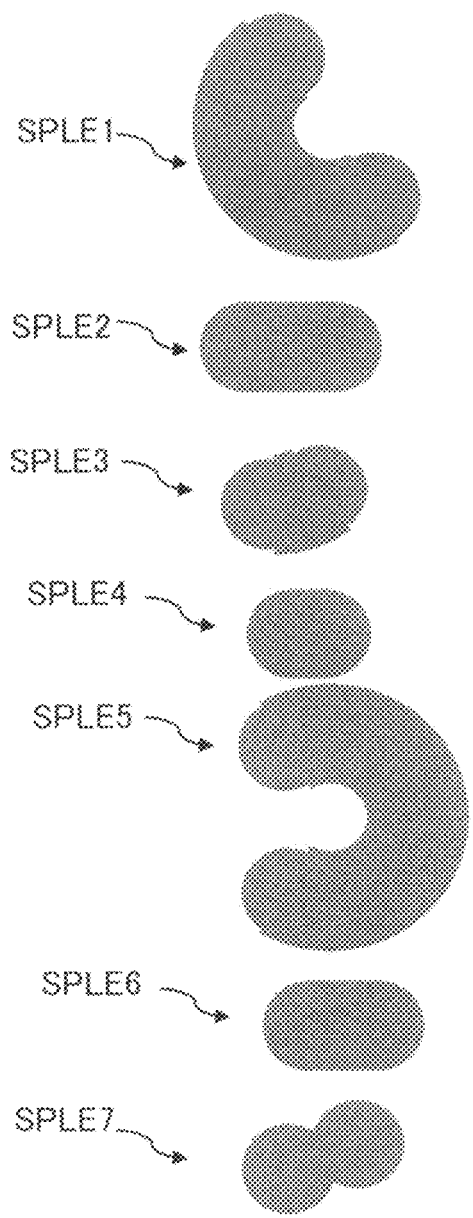
FIG. 5 is a diagram illustrating an example of a shield pattern generated by a circuit board design aid apparatus as one embodiment.

FIG. 1 is a diagram schematically illustrating the configuration of a circuit board design aid apparatus as one embodiment. In addition, FIGS. 2-5 are diagrams illustrating an example of a shield pattern generated by a circuit board design aid apparatus 100. FIG. 2 is a diagram illustrating an example of a surface pattern. FIG. 3 is a diagram breaking up the surface pattern illustrated in FIG. 2. FIG. 4 is a diagram illustrating an example of a line pattern. FIG. 5 is a diagram breaking up the line pattern illustrated in FIG. 4.

The circuit board design aid apparatus 100 is adapted to generate a shield pattern (guard pattern) SP for a wiring pattern L layout on a printed circuit board (circuit board; not illustrated). Types of such a shield pattern (shield pattern types) generated includes a surface pattern SPS as depicted in FIG. 2 and a line pattern SPL as depicted in FIG. 3.

Here, the line pattern SPL is a shield pattern SP having a geometry represented by a line segment and a line width, or an arc and a line width (line). The surface pattern SPS is a shield pattern SP having a geometry represented by a polygon, which is a group of apexes, or partially represented by an arc (surface).

Here, the surface pattern SPS depicted in FIG. 2 is made up of a combination of a plurality of shield patterns elements SPSE1-SPSE7, as depicted in FIG. 3. The line pattern SPL depicted in FIG. 4 is made up of a combination of a plurality of shield patterns elements SPLE1-SPLE7, as depicted in FIG. 5.

In addition, the wiring pattern L is made up by continuously connecting a plurality of wiring pattern elements LE. For example, in the example depicted in FIG. 2, FIG. 4 or the like, the wiring pattern L is made by continuously connecting three wiring pattern elements LE1-LE3, and a via V1 and a via V2 is connected to two ends of the wiring pattern L, respectively.

Furthermore, in the example depicted in FIG. 2, FIG. 4 or the like, a via V3 is formed on the surface pattern SPS, and a rectangular member g is located at the opposing position with respect to the wiring pattern L.

Note that, hereinafter, the reference symbols LE1-LE3 are used when a reference to a specific one of the plurality of wiring pattern elements is required to be made while reference symbol LE is used when reference is made to any one of the wiring pattern elements. Furthermore, the reference symbol V1-V3 is used for referring to a specific one of the plurality of vias while reference symbol V is used when reference is made to any of the vias.

Furthermore, hereinafter, the reference symbols SPSE1-SPSE7 are used when a reference to a specific one of the plurality of the shield pattern element constituting the surface pattern SPS is required to be made while reference symbol SPSE is used when reference is made to any one of the shield pattern elements.

In addition, hereinafter, the reference symbols SPLE1-SPLE7 are used when a reference to a specific one of the plurality of the shield pattern element constituting the line pattern SPL is required to be made while reference symbol SPLE is used when reference is made to any one of the shield pattern elements.

Wiring patterns L, shield patterns SP, vias V, part pins, lands, and the like are formed on a printed circuit board. In addition, hereinafter, a section formed on the printed circuit board in which a current (signal) flows is sometimes referred to as a "pattern", for the sake of brevity.

Although multiple wiring patterns L are formed on a printed circuit board, a part of the wiring patterns L will be described in this embodiment for the sake of brevity.

Each of various elements such as wiring patterns L, wiring pattern elements LE, shield patterns SP (SPL, SPS), shield pattern elements SPLE and SPSE, vias V, build-up vias BV (which will be described later) and prohibition regions (which will be described later) in the circuit board design aid apparatus 100 will be handled as data and the geometry thereof is handled as geometry data for various for various types of processing, such as computation, generation storage. For the sake of brevity, they may be represented as wiring patterns L, wiring pattern elements LE, shield patterns SP (SPL, SPS), shield pattern elements SPLE and SPSE, vias V, build-up vias BV, and prohibition regions and the like, and geometry data related to these geometries are simply referred to as "geometries".

FIGS. 6A and 6B are diagrams illustrating a shield pattern. FIG. 6A is a diagram illustrating an example of a shield pattern formed across a plurality of interconnection layers. FIG. 6B is a partially enlarged diagram of the shield pattern.

In this embodiment, a printed circuit board is a multi-layered circuit board including a plurality of interconnection layers. A wiring pattern L is formed on one layer among the plurality of interconnection layers ("the X layer" in the example depicted in FIG. 6A), and a surface pattern SPS1 is formed on the same layer as the wiring pattern (the X layer), surrounding the wiring pattern L in the plane direction of the interconnection layer (in the horizontal direction on plane of the paper of the drawing in FIGS. 6A and 6B).

For the wiring pattern L, a surface pattern SPS2 is formed on a (X+1) layer, a surface pattern SPS4 is formed on a (X+2) layer, a surface pattern SPS3 is formed on a (X−1) layer, and a surface pattern SPS5 is formed on a (X−2) layer.

In other words, the wiring pattern L is surrounded (encircled) by the plurality of shield patterns (the surface pattern SPS1-SPS5) formed across multiple interconnection layers, which can prevent signals transmitted on the wiring pattern L from being affected by external factors.

In addition, the surface pattern SPS1, as depicted in FIG. 6B, is formed around the wiring pattern L, along the wiring pattern L having a width (shield pattern width) w (micrometers) spaced apart from the wiring pattern L by a shield pattern spacing "d" (micrometers).

Note that the region between the wiring pattern L and the shield pattern formed around the wiring pattern L (region represented by the shield pattern spacing "d") is handled as a region for which generation of shield pattern is prohibited (prohibition region; details of which will be described later).

Furthermore, in the example depicted in FIG. 6A, the shield patterns formed on the (X+2) layer and the (X−2) layer (surface patterns SPS4 and SPS5) define end layers (upper and lower ends) of the shield patterns formed on the multiple interconnection layers (five layers, i.e., (X+2) layer, (X+1) layer, X layer, (X−1) layer, and (X−2) layer), relating to the same wiring pattern L, as set forth previously.

The surface patterns SPS4 and SPS5 are formed as a region of a logical OR of the wiring pattern L, the via V, the prohibition region, and the surface pattern SPS1 formed on the X layer.

Note that, hereinafter, shield patterns defining end layers (upper and lower ends) among shield patterns formed on the multiple interconnection layers, relating to the same wiring pattern L (the same net), such as shield patterns formed on the (X+2) layer and the (X−2) layer, may be referred to as "top and bottom layer shield patterns" or "end layer shield patterns".

In addition, the end layer shield pattern located on the top of the printed circuit board (located in the top side on stack direction of the interconnection layer) among the top and bottom layer shield patterns maybe referred to as the "top shield pattern", and the interconnection layer having the top shield pattern generated therefor is referred to as "top shield pattern generation layer". Similarly, the end layer shield pattern located on the bottom of the printed circuit board (located in the bottom side on stack direction of the interconnection layer) among the top and bottom layer shield patterns may be referred to as the "bottom shield pattern", and the interconnection layer having the top shield pattern generated therefor is referred to as "bottom shield pattern generation layer".

Furthermore, in the example depicted in FIG. 6A, on the (X−1) layer and the (X+1) layer, the regions defined by the wiring pattern L and the prohibition region on the X layer is specified as prohibition regions, and the surface patterns SPS2 and SPS3 having the same outline geometry as the outline geometry of the surface pattern SPS1 on the X layer are formed around such prohibition regions.

Although the surface pattern SPS is formed as a shield pattern in the example depicted in FIGS. 6A and 6B, this is not limiting. At least one of a same layer shield pattern and intermediate layer shield patterns may be formed in a line pattern SPL. However, the end layer shield patterns formed in the (X+2) layer and the (X−2) layer are preferably formed using surface patterns SPS for the purpose of surrounding the wiring pattern L.

The circuit board design aid apparatus 100 is configured as a computer (information processing apparatus) including a display 51, a keyboard 52, a RAM 53, a ROM 54, a mouse 55, a storing section 60, and a CPU 10, as depicted in FIG. 1.

The display 51 is adapted to display various pieces of information and instructions, and is adapted to display various input screens for input operations by an operator. The ROM 54 is a storage device in which various types of data and programs are stored used by the CPU 10 which will be described later for computations. The RAM 53 is a storage device used by the CPU 10 for temporarily storing data and programs upon executing various controls and computations.

The keyboard 52 and the mouse 55 are input devices used by the operator for entering various pieces of information and instructions. The operator enters various pieces of information and instructions to the circuit board design aid apparatus 100 by performing select operations on a input screen displayed on the display 51 by typing the keyboard 52 or using the mouse (pointing device) 55.

The storing section 60 is a storage device for storing various types of data and programs used by the CPU 10 for executing various controls and computations and storing results of computations performed by the CPU 10, and various readable and writable devices, such as a hard disk drive (HDD) and a semiconductor storage device, may be used, for example.

The storing section 60 is adapted to store net information 61, pattern information 62, prohibition region information 63, board information 64, and reference information 65 in predetermined regions thereof, as depicted in FIG. 1.

In this embodiment, identification information, called "net", is provided to each of various types of patterns (such as wiring pattern L, via V, surface pattern SPS, line pattern SPL) formed on the printed circuit board. For example, the net is specified for each signal transmitted on that pattern.

In the circuit board design aid apparatus 100, a shield pattern SP is generated for each net. When the operator specifies a net for which a shield pattern SP is to be generated (net for generating a shield pattern) and a shield pattern type (surface pattern SPS or line pattern SPL) on a net selection screen 511 (see FIG. 46; details of which will be described later) or the like displayed on the display 51 using the mouse 55, the keyboard 52, or the like, a shield pattern SP is generated for the wiring pattern L constituting the net.

Figure 7:
FIG. 7 is a diagram illustrating an example of a net pattern of a circuit board design aid apparatus as one embodiment.

FIG. 7 is a diagram illustrating an example of the net information 61 of a circuit board design aid apparatus 100 as one embodiment. FIG. 8 is a diagram illustrating an example of prohibition region information 63. FIG. 9 is a diagram illustrating an example of reference information 65. FIG. 10 is a diagram illustrating an example of line information 66a (66, pattern information 62). FIG. 11 is a diagram illustrating an example of via information 67 (pattern information 62). FIG. 12 is a diagram illustrating an example of surface pattern information 68. FIG. 13 is a diagram illustrating an alternative example of line information 66b (pattern information 62).

The net information 61 is information indicating a generation condition or the like of a shield pattern to be generated by relating them to a net. As depicted in FIG. 7, a shield required, a shield net name, a shield pattern width, a shield pattern spacing, a top shield pattern generation layer number, and a shield related element address are related to a net name.

The net name is used as identification information for identifying a net, and is a signal name of corresponding (transmitted) signal, for example. In this embodiment, three nets are net, each having net names of SIG-1, SIG-2, and GND.

The shield required is information indicating whether or not a shield pattern is to be generated for the pattern constituting that net. In the example depicted in FIG. 7, "1" is set when generation of a shield pattern is required whereas "0" is set when no shield pattern is required.

The shield net name is the net name of the shield pattern to be generated for the net, and in the example depicted in FIG. 7, for the net indicated by the net name SIG-1, a shield pattern indicated by the net name GND is set. Note that, hereinafter, the shield pattern indicated by the net name GND may be referred to as the "shield pattern GND".

The shield pattern width is the width w of the shield pattern to be generated (shield pattern generation condition; see FIG. 6B), and is specified in the unit of micrometers, for example. The shield pattern spacing is the spacing d between the wiring pattern L (wiring pattern element LE) and the shield pattern to be generated (shield pattern generation condition; see FIG. 6B), and is specified in the unit of micrometers, for example.

The top shield pattern generation layer number is information indicating an interconnection layer on which the top shield pattern is to be generated, and specifies the interconnection layer on which the top shield pattern is to be formed using a offset with reference to the layer on which the wiring pattern L is formed. For example, in the example depicted in FIG. 7, the top shield pattern is to be formed on the interconnection layer two layers above the layer on which the wiring pattern L is formed.

The bottom shield pattern generation layer number is information indicating an interconnection layer on which the bottom shield pattern is to be generated, and specifies the interconnection layer on which the bottom shield pattern is to be formed using a offset with reference to the layer on which the wiring pattern L is formed. For example, in the example depicted in FIG. 7, the bottom shield pattern is to be formed on the interconnection layer two layers below the layer on which the wiring pattern L is formed.

When no top shield pattern or bottom shield pattern is generated, information indicating that no such shield pattern is to generated (the string of "no shield" for example) or a blank is set in the top shield pattern generation number or bottom shield pattern generation number.

The shield related element address information indicating a location where surface pattern information (pattern information; see FIG. 8) is stored for each of shield pattern elements SPSE constituting the shield pattern (surface pattern SPS), and is an address of the storage location of each piece of information in the storing section 60, for example. The surface pattern information will be described later.

In the example depicted in FIG. 7, it is illustrated that the shield pattern GND has a shield pattern width of 400 μm, a shield pattern spacing of 130 μm, wherein the top shield pattern generation layer is formed on an interconnection layer two layers above the interconnection layer on which the wiring pattern L is formed (top shield pattern generation layer=2), and the bottom shield pattern generation layer is formed on an interconnection layer two layers below (bottom shield pattern generation layer=2). It is also illustrated that the shield pattern GND is configured to have seven shield pattern element (addresses 1-7).

Note that the net to which the shield required is set to "0," no shield net name, shield pattern width, shield pattern spacing, or top shield pattern generation layer number is set, and "0s" are set for these items.

In addition, in the circuit board design aid apparatus 100, wiring pattern elements LE constituting the same wiring pattern L constituting the same net, as well as shield pattern elements SPSE constituting the same surface pattern SPS and shield pattern elements SPLE constituting the same line pattern SPL are specified with the net indicted by the net name GND (ground).

Although net information 61 is configured by relating a shield required, a shield net name, a shield pattern width, a shield pattern spacing, a top shield pattern generation layer number, and a shield related element address to a net name in this embodiment, this is not limiting. For example, identification information internally used by a system (circuit CAD or the like) for managing a net, or a identification information set and used by a design engineer for convenience upon designing may be used, and the embodiment may be modified without departing the spirit of the present invention.

The above-described net information 61 can be a circuit CAD (computer aided design) upstream of the circuit board design aid apparatus 100, for example, and the information may be entered by an operator or the like.

The board information 64 is information related to a printed circuit board and is information indicating a structure of interconnection layers (layer structure) or pattern generation possible regions (for example, interconnection layers or geometries), for example.

The prohibition region information 63 is information for managing prohibition regions set for the printed circuit board, and is for managing a geometry or range of regions for which generation of patterns is prohibited (prohibition regions) in this embodiment. In this embodiment, even when assigned as a prohibition region, there is a net for which generation of a pattern is allowed (permitted) (allowed net), information for identifying the allowed net is managed relating to the prohibition region.

In the example depicted in FIG. 8, the prohibition region information 63 includes fields of a type, an allowed net, a geometry, and a layer.

The type is information indicating a type of the item generation of which is prohibited, and, in the example depicted in FIG. 8, the type for prohibiting generation of a pattern is registered. The allowed net indicates an allowed net described previously if there is any. The example depicted in FIG. 8 indicates that there is no allowed net.

The geometry indicates the geometry of a prohibition region and a coordinate indicating the region. In the example depicted in FIG. 8, information indicating a rectangle and the coordinate value of the region are indicated. This coordinate value also indicates the position in the printed circuit board. The layer is information indicating an interconnection layer in the printed circuit board, for which the prohibition region is set. Hereinafter, the prohibition region information 63 may be referred to as a prohibition geometry data table.

The reference information 65 is defining a clearance between elements (between pattern types) disposed on the printed circuit board (reference spacing value), and defines a minimum required spacing for each pair of elements upon designing a printed circuit board.

In the example depicted in FIG. 9, the reference information 65 sets a reference spacing value (shield pattern generation condition) between pattern types for respective different nets (net name pairs). For example, it is illustrated that a line in the net SIG-1 and a line net SIG-2 are required to be formed (disposed) with a space of 100 µm or wider. Note that an initial value of zero is to a reference spacing value in the same net.

In the example depicted in FIG. 9, all of the reference spacing values are set with 100, this is not limiting, and this embodiment can be modified.

The pattern information 62 is information related to patterns, and is includes, line information 66*a* and 66*b*, via information 67, and surface pattern information 68, as depicted in FIG. 1, for example.

The line information 66*a* is information related to a wiring pattern L, indicating configuration information of wiring pattern elements LE constituting the wiring pattern L, and is used being related to a surface pattern SPS, for example.

In the example depicted in FIG. 10, the line information 66*a* includes fields of a net name, a geometry, a line width, and a layer. Note that, hereinafter, descriptions of the elements having the same reference symbols as the elements described previously will be emitted since they refer to the same or substantially the same elements described above.

The net name is a net name which the wiring pattern element LE belongs to. The geometry is information indicating the geometry of the wiring pattern element LE, and includes a geometry (line segment) and the coordinates of the start and end points (start coordinate and end coordinate) thereof in the example depicted in FIG. 10.

Note that the term "line segment" indicates a position (coordinate) through which the wiring pattern element LE passes, and is a center line of the wiring pattern element LE, for example. The line width is a line width (pattern width) of the wiring pattern element LE, and the geometry of the wiring pattern element LE is created by widening the line segment (center line) by the value of this line width. The layer is information indicating an interconnection layer on which the wiring pattern element LE is to be formed in the printed circuit board.

In the example depicted in FIG. 10, configuration information on the wiring pattern element LE1 is indicated by reference symbol 66-1. Similarly, information on the wiring pattern element LE2 is indicated by reference symbol 66-2 and information on the wiring pattern element LE3 is indicated by reference symbol 66-3.

Note that information registered as the geometries in the line information 66*a* as described above is not limited to line segments indicated in FIG. 10. For example, when the wiring pattern element LE includes an arc geometry, the start coordinate, the end coordinate, and the center coordinate may be registered, and this embodiment can be modified without departing the spirit of the present invention.

The line information 66*a* is used when a shield pattern is a surface pattern SPS.

The via information 67 is information related to a configuration of a via V (configuration information), and the via information 67 includes fields of a net name, a geometry, and a layer in the example depicted in FIG. 11. Note that, hereinafter, descriptions of the elements having the same reference symbols as the elements described previously will be emitted since they refer to the same or substantially the same elements described above.

The net name is a net name to which the wiring pattern element LE belongs to. The geometry is information indicating the geometry of the via V, and includes a geometry (circle) and the center coordinate and the radius thereof in the example depicted in FIG. 11. The layer is information indicating an interconnection layer through which the via V passes in the printed circuit board.

The surface pattern information 68 is information related to the surface pattern SPS, and includes the configuration information of a shield pattern element SPSE constituting the surface pattern SPS. In the example depicted in FIG. 12, the surface pattern information 68 includes fields of a net name, a geometry, and a layer, and manages a net name, a geometry, and a layer for each shield pattern element SPSE.

In the example depicted in FIG. 12, configuration information on shield pattern element SPSE1 is indicated by reference symbol 68-1. Similarly, configuration information on shield pattern element SPSE2 is indicated by reference symbol 68-2, configuration information on shield pattern element SPSE3 is indicated by reference symbol 68-3, configuration information on shield pattern element SPSE4 is indicated by reference symbol 68-4, configuration information on shield pattern element SPSE5 is indicated by reference symbol 68-5, configuration information on shield pattern element SPSE6 is indicated by reference symbol 68-6, and configuration information on shield pattern element SPSE7 is indicated by reference symbol 68-7.

Note that configuration information on the shield pattern element SPSE1 (see reference symbol 68-1) is depicted in detail in the example depicted in FIG. 12, and details of information on the shield pattern elements SPSE2-SPSE7 is omitted for the sake of brevity.

The geometry is information indicating the geometry of a shield pattern element SPSE, and includes information indicating that the geometry a polygon, the constituting element count (side count), and information specifying each geometry (line type and coordinate value) for each constituting element (side).

For example, the shield pattern element SPSE1 includes a polygon geometry having a seven constituting elements (sides), as depicted in FIG. 3. Thus, in the surface pattern information 68, as depicted by reference symbol 68-1, "polygon (constituting element count (7))" is displayed, and the geometry (line segment, arc) and the coordinate is related to each constituting element e1-e7.

Hereinafter, the surface pattern information 68 may be referred to as the shield pattern geometry data table.

The line information 66*b* is information related to a line (wiring pattern L and line pattern SPL), indicating configuration information of wiring pattern elements LE constituting a wiring pattern L and shield pattern elements SPLE constituting a line pattern SPL, and is related to the line pattern SPL.

In other words, the line information 66*b* includes configuration information on shield pattern elements SPLE constituting a line pattern SPL, as well as wiring pattern elements LE constituting a wiring pattern L managed in the line information 66a described above.

In the example depicted in FIG. 13, configuration information on the wiring pattern element LE1 is indicated by reference symbol 66-1. Similarly, information on the wiring pattern element LE2 is indicated by reference symbol 66-2 and information on the wiring pattern element LE1 is indicated by reference symbol 66-3.

In the example depicted in FIG. 13, information on the shield pattern element SPLE1 is indicated by reference symbol 66-4, information on the shield pattern element SPLE2 is indicated by reference symbol 66-5, information on the shield pattern element SPLE3 is indicated by reference symbol 66-6, information on the shield pattern element SPLE4 is indicated by reference symbol 66-7, information on the shield pattern element SPLE5 is indicated by reference symbol 66-8, information on the shield pattern element SPLE6 is indicated by reference symbol 66-9, and information on the shield pattern element SPLE7 is indicated by reference symbol 66-10.

The line information 66b depicted in FIG. 13 also includes the field of a net name, a geometry, a line width, and layer, similar to the line information 66a depicted in FIG. 10.

Note that configuration information on the shield pattern element SPSLE1 (see reference symbol 66-4) of a plurality of shield patterns elements SPLE is depicted in detail the example depicted in FIG. 13, and details of information on the shield pattern elements SPSLE2-SPSLE7 is omitted for the sake of brevity.

Note that geometries in the line information 66b as described above is not limited to line segments or arcs indicated in FIG. 13, and this embodiment can be modified without departing the spirit of the present invention.

In addition, the pattern information 62 is not limited to line information 66a and 66b, via information 67, and surface pattern information 68 as described above, and may include information on apart pin, land, and hole (such as net, geometry, layer), for example. This embodiment can be modified without departing the spirit of the present invention.

The storing section 60 is adapted to function as a storage section for storing a basic shield pattern element generated by a same layer shield pattern element generation section 21, a top and bottom layer shield pattern element generation section 22, and an intermediate layer shield pattern element generation section 23, which will be described later, and a prohibition region generated by a pattern prohibition region generation section 24 which will be described later, by relating them to a wiring pattern and a net.

The CPU 10 is configured to perform various types of computations and controls, and is adapted to function as a wiring pattern editing command section 30, a net information panel control section 12, a shield pattern generation command section 13, a shield pattern generation execution section 20, and a shield pattern check section 40, which will be described later, when the CPU 10 execute a shield pattern generation program in the circuit board design aid apparatus 100.

Note that programs (firmware) for implementing the functions as the wiring pattern editing command section 30, the net information panel control section 12, the shield pattern generation command section 13, the shield pattern generation execution section 20, and the shield pattern check section 40 are provided in the form of programs recorded on the computer readable recording medium, such as, for example, a flexible disk, a CD (e.g., CD-ROM, CD-R, CD-RW), a DVD (e.g., DVD-ROM, DVD-RAM, DVD-R, DVD+R, DVD-RW, DVD+RW, HD DVD), a Blu ray disk, a magnetic disk, an optical disk, a magneto-optical disk, or the like. The computer then reads a program from that storage medium and uses that program after transferring it to the internal storage device or external storage device or the like. Alternatively, the program may be recorded on a storage device (storage medium), for example, a magnetic disk, an optical disk, a magneto-optical disk, or the like, and the program may be provided from to the storage device to the computer through a communication path.

Upon realizing the functions as the wiring pattern editing command section 30, the net information panel control section 12, the shield pattern generation command section 13, the shield pattern generation execution section 20, and the shield pattern check section 40, programs stored in internal storage devices (the RAM 53 and the ROM 54 in this embodiment) are executed by a microprocessor in a computer (the CPU 10 in this embodiment). In this case, the computer may alternatively read a program stored in the storage medium for executing it.

Note that, in this embodiment, the term "computer" may be a concept including hardware and an operating system, and may refer to hardware that operates under the control of the operating system. Alternatively, when an application program alone can make the hardware to be operated without requiring an operating system, the hardware itself may represent a computer. The hardware includes at least a microprocessor, e.g., CPU, and a means for reading a computer program recorded on a storage medium and, in this embodiment, the circuit board design aid apparatus 100 (information processing apparatus) includes a function as a computer.

Furthermore, in this embodiment, as the storage medium other than a flexible disk, a CD, a DVD, a Blu ray disk, a magnetic disk, an optical disk, or a magneto-optical disk, an IC card, a ROM cartridge, a magnetic tape, a punch card, an internal storage device (memory, such as a RAM or ROM) of the computer, an external storage device or the like, or any medium that is readable by the computer, including a printed medium having a code, such as a bar code, is printed thereon, may be used.

The net information panel control section 12 is a function to manage net information 61, and is adapted to modify (edit) and register of fields (shield required, shield net name, and the like; see FIG. 7) in net information 61.

The shield pattern generation command section 13 is adapted to perform various commands for generating a shield pattern, which will be described later. The shield pattern generation execution section 20 makes the shield pattern generation command section 13 to perform actual processing upon generating a shield pattern SP.

The shield pattern generation command section 13 is adapted to generate a shield pattern (surface pattern SPS, line pattern SPL, shield pattern element SPSE, shield pattern element SPLE) on a printed circuit board by obtaining a related command from a command library stored in the storing section 60 and performing it, for example. In addition, the shield pattern generation command section 13 is adapted to control various option related to generation of the shield pattern (shield generation option control section).

The wiring pattern editing command section 30 is adapted to perform a function (command) for generating a wiring pattern L (wiring pattern element LE) on a printed circuit board and editing a generated wiring pattern L (wiring pattern element LE), and includes a wiring command execution section 31, a via input command execution section 32, a pattern displacement command execution section 33, a pattern copy command execution section 34, and pattern deletion command execution section, and a wiring route modification command execution section 36, as depicted in FIG. 1.

The wiring command execution section 31 is adapted to execute a command for generating a wiring pattern L (wiring pattern element LE) on a printed circuit board. The via input command execution section 32 is adapted to execute a command for generating a via on the printed circuit board.

The pattern displacement command execution section 33 is adapted to displace a wiring pattern L (wiring pattern element LE) on the printed circuit board. The pattern copy command execution section 34 is adapted to copy a wiring pattern L (wiring pattern element LE). In addition, the pattern deletion command execution section 35 is adapted to delete a wiring pattern L (wiring pattern element LE).

The wiring route modification command execution section 36 is adapted to modify the wiring of a wiring pattern L (wiring pattern element LE) that has been generated on the printed circuit board, and is adapted to perform displacement, deforming, deletion, or the like, of the wiring pattern L by displacing the position the wiring pattern L passes, for example.

Note that the functions of the shield pattern generation command section 13 and the wiring pattern editing command section 30 described above can be executed using various known commands, and details thereof will not be described.

The shield pattern generation execution section (basic shield pattern element generation section) 20 is adapted to generate a shield pattern, and includes a same layer shield pattern element generation section 21, a top and bottom layer shield pattern element generation section 22, an intermediate layer shield pattern element generation section 23, a pattern prohibition region generation section 24, a shield pattern geometry generation section 25, and a shield via generation execution section 26.

Figure 14:
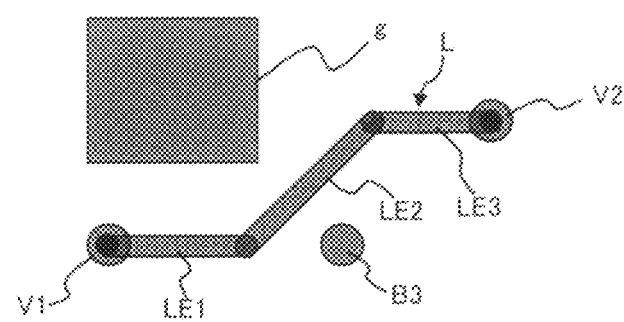
FIG. 14 is a diagram illustrating a technique for generating a surface pattern in a circuit board design aid apparatus as one embodiment.
Figure 15:
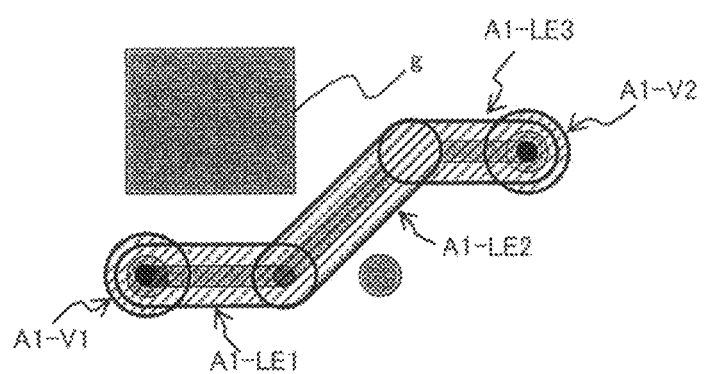
FIG. 15 is a diagram illustrating a technique for generating a surface pattern in a circuit board design aid apparatus as one embodiment.
Figure 16:
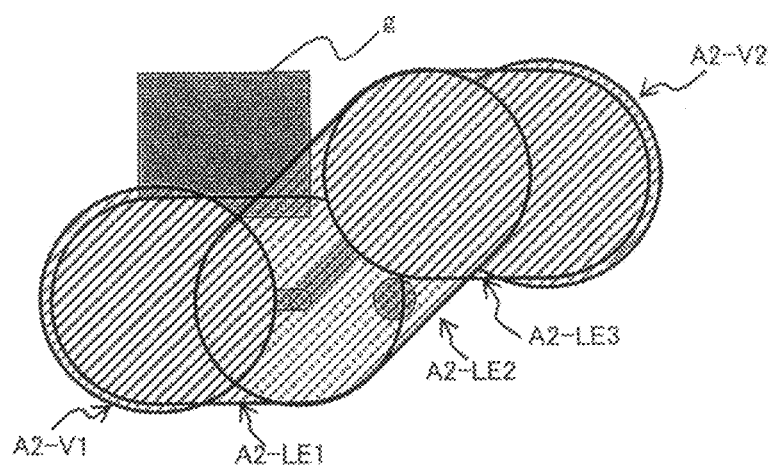
FIG. 16 is a diagram illustrating a technique for generating a surface pattern in a circuit board design aid apparatus as one embodiment.
Figure 17:
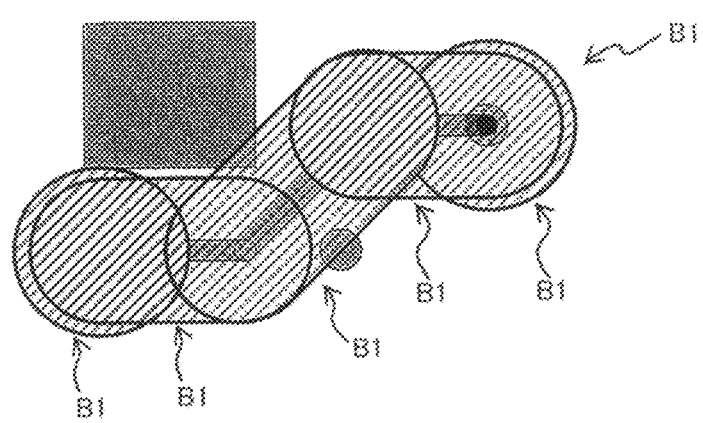
FIG. 17 is a diagram illustrating a technique for generating a surface pattern in a circuit board design aid apparatus as one embodiment.
Figure 18:
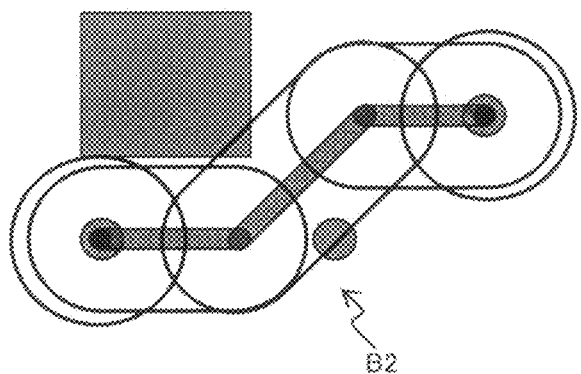
FIG. 18 is a diagram illustrating a technique for generating a surface pattern in a circuit board design aid apparatus as one embodiment.
Figure 19:
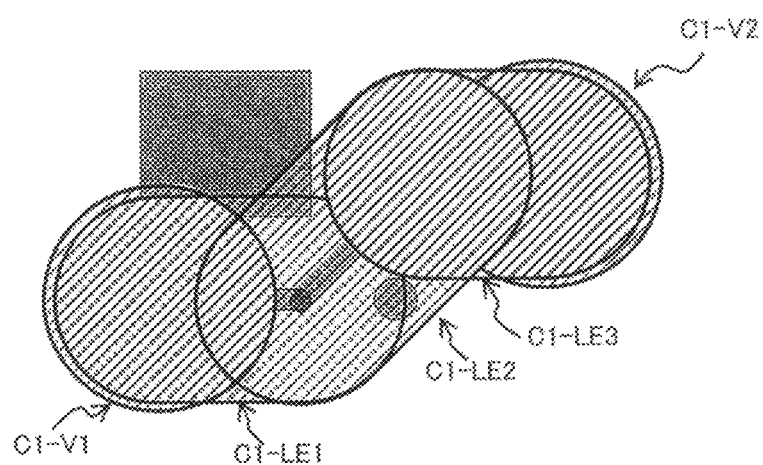
FIG. 19 is a diagram illustrating a technique for generating a surface pattern in a circuit board design aid apparatus as one embodiment.
Figure 20:
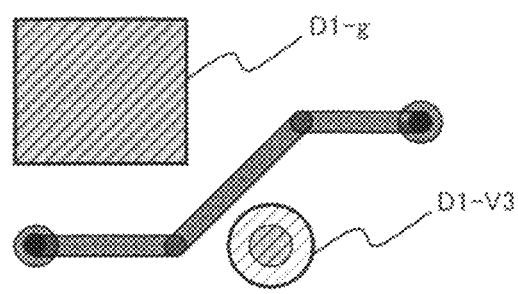
FIG. 20 is a diagram illustrating a technique for generating a surface pattern in a circuit board design aid apparatus as one embodiment.
Figure 21:
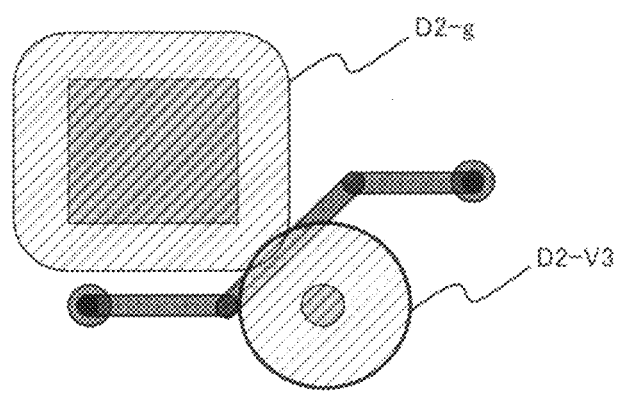
FIG. 21 is a diagram illustrating a technique for generating a surface pattern in a circuit board design aid apparatus as one embodiment.
Figure 22:
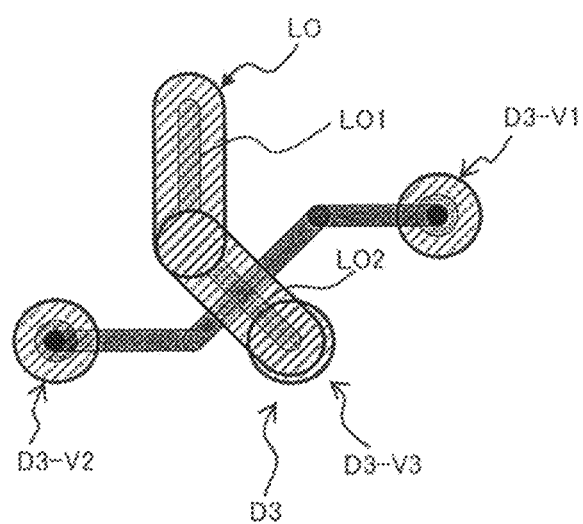
FIG. 22 is a diagram illustrating a technique for generating a surface pattern in a circuit board design aid apparatus as one embodiment.
Figure 23:
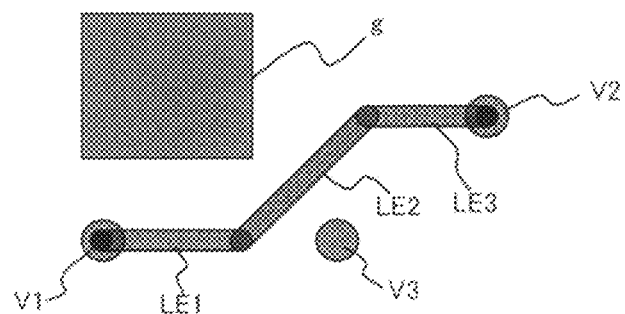
FIG. 23 is a diagram illustrating a technique for generating a surface pattern in a circuit board design aid apparatus as one embodiment.

FIGS. 14-26 are diagrams illustrating generation of a surface pattern SPS in the circuit board design aid apparatus 100 as one embodiment of the present invention. FIGS. 14-16 are diagrams illustrating generation of same layer shield pattern element SPSE. FIGS. 17 and 18 are diagrams illustrating generation of a same layer shield pattern element SPSE. FIG. 19 is a diagram illustrating generation of a top and bottom layer shield pattern elements SPSE generated by the top and bottom layer shield pattern element generation section 22 thereof. FIGS. 20-22 are diagrams illustrating generation of a prohibition region generated by the pattern prohibition region generation section 24 thereof. FIGS. 23-26 are diagrams illustrating generation of an allowed net thereof.

The same layer shield pattern element generation section 21 is adapted to generate basic shield pattern elements A2, B2 on the same layer as a wiring pattern L (same layer shield pattern). The same layer shield pattern element generation section 21 is adapted to obtain a wiring pattern L (wiring pattern element LE) of a net for generating a shield pattern (see FIG. 14), and to generate a geometry A2, B2 of a basic shield pattern element based on the geometry of each of the wiring pattern elements LE1-LE3 and the vias V1 and V2 forming the wiring pattern L.

Note that, hereinafter, each of the wiring pattern elements LE1-LE3 and the vias V1 and V2 forming the wiring pattern L may be referred to as "the wiring pattern element LE", for the sake of convenience.

For example, for generating a surface pattern SPS, the same layer shield pattern element generation section 21 is adapted to generate geometries (the geometries A1-LE1 to A1-LE3, A1-V1, and A1-V2) by magnifying each wiring pattern element LE by a shield pattern spacing "d" (see net information 61 in FIG. 7) on the plane on which the wiring pattern L is formed in interconnection layer of the printed circuit board (see FIG. 15).

More specifically, in the example depicted in FIG. 15, the same layer shield pattern element generation section 21 is adapted to generate a geometry A1-LE1 by magnifying the wiring pattern element LE1 by the shield pattern spacing "d".

Similarly, the same layer shield pattern element generation section 21 is adapted to generate a geometry A1-LE2 by magnifying the wiring pattern element LE2 by the shield pattern spacing "d", to generate a geometry A1-LE3 by magnifying the wiring pattern element LE3 by the shield pattern spacing "d", to generate a geometry A1-LE2 by magnifying the wiring pattern element LE2 by the shield pattern spacing "d", to generate a geometry A1-V1 by magnifying the via V1 by the shield pattern spacing "d", and to generate a geometry A1-V2 by magnifying the via V2 by the shield pattern spacing "d".

Note that the reference symbols A1-LE1 to A1-LE3, A1-V1, and A1-V2 are used when a reference to a specific one of the multiple geometries obtained by magnifying each wiring pattern element LE by the shield pattern spacing "d" in the same layer shield pattern element generation section 21, while reference symbol A1 is used when reference is made to any one of the geometries.

In other words, the same layer shield pattern element generation section 21 is adapted to generate geometries A1 by magnifying each wiring pattern element LE by the shield pattern spacing "d" on the plane on which the wiring pattern L is formed in interconnection layer of the printed circuit board.

In addition, the same layer shield pattern element generation section 21 is adapted to register the geometries A1 to prohibition region information 63.

Furthermore, the same layer shield pattern element generation section 21 is further adapted to generate geometries A2 (shield pattern element SPSE) by magnifying each geometry A1 by the shield pattern width "w" (see the net information 61 in FIG. 7) (see FIG. 16).

More specifically, in the example depicted in FIG. 16, the same layer shield pattern element generation section 21 generates a geometry A2-LE1 by magnifying the geometry A1-LE1 by the shield pattern width "w".

Similarly, the same layer shield pattern element generation section 21 is adapted to generate a geometry A2-LE2 by magnifying the geometry A1-LE2 by the shield pattern width "w", to generate a geometry A2-LE3 by magnifying the geometry A1-LE3 by the shield pattern width "w", to generate a geometry A2-V1 by magnifying the geometry A1-V1 by the shield pattern width "w", and to generate a geometry A2-V2 by magnifying the geometry A1-V2 by the shield pattern width "w".

Note that the reference symbols A2-LE1 to A2-LE3, A2-V1, and A2-V2 are used when a reference to a specific one of the multiple geometries obtained by magnifying each geometry A1 by the shield pattern width "w", while reference symbol A2 is used when reference is made to any one of the geometries.

In other words, the same layer shield pattern element generation section 21 is adapted to generate geometries A2 by magnifying each geometry A1 by the shield pattern width "w" on the plane on which the wiring pattern L is formed in interconnection layer of the printed circuit board.

The same layer shield pattern element generation section 21 is also adapted to register each geometry A2 generated to surface pattern information 68 (shield pattern geometry table).

On the other hand, upon generating a line pattern SPL, the same layer shield pattern element generation section 21 is adapted to generate geometries B1 by magnifying each wiring pattern element LE by the value obtained by dividing the sum of the shield pattern spacing "d" and the shield pattern width "w" by two (d+w/2) (see FIG. 17).

The same layer shield pattern element generation section 21 is also adapted to register each geometry B2 generated to surface pattern information 68 (shield pattern geometry table).

Furthermore, the same layer shield pattern element generation section 21 is adapted to divide the periphery of each geometry B1 into a line segment geometry, a circle geometry, and arc geometry, as depicted in FIG. 18. The same layer shield pattern element generation section 21 is also adapted to register peripheral geometries divided in this manner as to line information 66b (shield pattern geometry table) as geometries B2.

The top and bottom layer shield pattern element generation section (end layer shield pattern element generation section) 22 is adapted to generate a basic shield pattern element C1 for a top shield pattern or bottom shield pattern (hereinafter, simply referred to as top or bottom layer shield pattern) on an interconnection layer (for example, (X+2) layer or (X−2) layer) that is different from the interconnection layer (for example, X layer) on which the wiring pattern L is formed.

The top and bottom layer shield pattern element generation section 22 is adapted to obtain a wiring pattern L (such as a wiring pattern element LE) of a net for generating a shield pattern (see FIG. 14), and to generate a basic shield pattern element C1 on an interconnection layer different from the layer of the wiring pattern L, based on wiring pattern elements LE forming the wiring pattern L.

More specifically, the top and bottom layer shield pattern element generation section 22 is adapted to generate geometries (geometries C1-LE1 to C1-LE3, C1-V1, and C1-V2) by magnifying each wiring pattern element LE by the sum of the shield pattern spacing "d" (see the net information 61 in FIG. 7) and the shield pattern width "w" (d+w) on the direction on the plane on an interconnection layer different from the layer of the wiring pattern L, as depicted in FIG. 19.

More specifically, in the example depicted in FIG. 19, the top and bottom layer shield pattern element generation section 22 is adapted to generate a geometry C1-LE1 by magnifying the wiring pattern element LE1 by the shield pattern spacing "d" and the shield pattern width "w" (d+w), to generate a geometry C1-LE2 by magnifying the wiring pattern element LE2 by the shield pattern spacing "d" and the shield pattern width "w" (d+w), to generate a geometry C1-LE3 by magnifying the wiring pattern element LE3 by the shield pattern spacing "d" and the shield pattern width "w" (d+w), to generate a geometry C1-V1 by magnifying the via V1 by the shield pattern spacing "d" and the shield pattern width "w" (d+w), and to generate a geometry C1-V2 by magnifying the via V2 by the shield pattern spacing "d" and the shield pattern width "w" (d+w).

Note that, hereinafter, the reference symbols C1-LE1 to C1-LE3, C1-V1, and C1-V2 are used when a reference to a specific one of the multiple geometries obtained by magnifying each wiring pattern element LE by the shield pattern spacing "d" and the shield pattern width "w", while reference symbol C1 is used when reference is made to any one of the geometries.

In other words, the top and bottom layer shield pattern element generation section 22 is adapted to generate geometries C1 by magnifying each wiring pattern element LE by the shield pattern spacing "d" and the shield pattern width "w" on the plane on which the wiring pattern L is formed in interconnection layer of the printed circuit board.

In addition, the same layer shield pattern element generation section 21 is adapted to register the geometries V1 to surface pattern information 68.

The intermediate layer shield pattern element generation section 23 is adapted to generate geometries A2 and B2 of a basic shield pattern described above on an interconnection layer between the interconnection layer on which the wiring pattern L is formed and an interconnection layer on which the top or bottom shield pattern is formed (intermediate layer). Note that generation of geometries A2 and B2 by in the intermediate layer shield pattern element generation section 23 is the same as that by the same layer shield pattern element generation section 21, and detailed description thereof will be omitted.

The pattern prohibition region generation section 24 is adapted to generate a geometry of a prohibition region wherein generation of a shield pattern is prohibited. The pattern prohibition region generation section 24 is adapted to set a prohibition region based on the position or geometry or the like of other components or the like (elements) located around the wiring pattern L, for example.

More specifically, for example, when generating a surface pattern SPS, the pattern prohibition region generation section 24 is adapted to check whether there are any elements on the same layer to which a clearance check is to be performed, located around the geometry A2 generated by the same layer shield pattern element generation section 21, and to obtain the geometries of these elements if any, by looking up the pattern information 62 and the board information 64.

Then the pattern prohibition region generation section 24 is adapted to, based on the result of the check, store geometries that are obtained by magnifying the geometries of these elements (element geometries) on the plane on which the wiring pattern L is formed in interconnection layer of the printed circuit board by a preset clearance condition into the pattern prohibition region generation section 24, as prohibition regions, as depicted in FIG. 20.

Note that clearance condition can be obtained from the above-described reference information 65. In addition, the reference spacing value in the same net may be set to "0."

In the example depicted in FIG. 20, for an element g located in the vicinity of the wiring pattern L, a prohibition region having the same as that of the element g is formed as a geometry D1-g. Furthermore, in the example depicted in FIG. 20, for a via V3 that is also located in the vicinity of the wiring pattern L, a geometry obtained by magnifying the radius of the geometry of the via V3 by a preset clearance condition (100) is also formed as a prohibition region (geometry D1-V3).

In addition, hereinafter, the reference symbols D1-g, D1-V3, and the like are used when a reference to a specific one of a plurality of geometries of the prohibition regions related to the surface pattern SPS is required to be made while reference symbol D1 is used when reference is made to any one of the geometries.

More specifically, for example, when generating a line pattern SPL, the pattern prohibition region generation section 24 checks whether there are any elements on the same layer to which a clearance check is to be performed, located around the geometry B1, and to obtain the geometries of these elements if any, by looking up the pattern information 62 and the board information 64.

Then the pattern prohibition region generation section 24 is adapted to, based on the result of the check, store geometries that are obtained by magnifying the geometries of these elements (element geometries) into the pattern prohibition region generation section 24, as prohibition regions, as depicted in FIG. 20.

In the example depicted in FIG. 21, the pattern prohibition region generation section 24 is adapted to generate geometries D2-g and D2-V3 by magnifying the element g and the via V3, respectively, on the plane on which the wiring pattern L is formed in interconnection layer of the printed circuit board by a value obtained by adding a half of the shield pattern width "w" to the shield pattern spacing "d" (the shield pattern spacing "d"+shield pattern width/2).

In addition, hereinafter, the reference symbols D2-g, D2-V3, and the like are used when a reference to a specific one of a plurality of the prohibition regions related to the line pattern SPL is required to be made while reference symbol D1 is used when reference is made to any one of the prohibition regions.

In addition, for example, when generating a top shield pattern or a bottom shield pattern, the pattern prohibition region generation section 24 checks whether there are any elements on the shield pattern generation layer (the layer on which the top shield pattern or the bottom shield pattern is generated) to which a clearance check is to be performed, located around the geometry C1, and to obtain the geometries of these elements if any, by looking up the pattern information 62 and the board information 64.

For example, FIG. 22 illustrates an example in which a wiring pattern LO is formed so as to intersect the wiring pattern L on the interconnection layer on which a top shield pattern (shield pattern element SPSE) is formed.

In the example depicted in FIG. 22, the wiring pattern LO includes a wiring pattern element LOE1 and a wiring pattern element LOE2, and one end of the wiring pattern element LOE2 is connected to a via V3. The pattern prohibition region generation section 24 generates geometries as a prohibition region by magnifying each of the wiring pattern elements LOE1 and LOE2 and the via V3 by the respective reference spacing with the shield pattern, by looking up the reference information 65.

In other words, in the example depicted in FIG. 22, a geometry D3-LO1 is generated by magnifying the wiring pattern element LOE1 by the reference spacing thereof with shield pattern, a geometry D3-LO2 is generated by magnifying the wiring pattern element LOE2 by the reference spacing thereof with shield pattern, and a geometry D3-V3 is generated by magnifying the via V3 by the reference spacing thereof with shield pattern.

Note that, hereinafter, the reference symbols D3-LO1, D3-LO1, D3-V3, and the like are used when a reference to a specific one of a plurality of geometries of the prohibition regions generated based on the wiring pattern LO is required to be made while reference symbol D3 is used when reference is made to any one of the geometries.

In addition, the pattern prohibition region generation section 24 is adapted to set an allowed net when setting a prohibition region. The "allowed net" means a net to which generation of a pattern is allowed (permitted) irrespective of a prohibition region.

Figure 24:
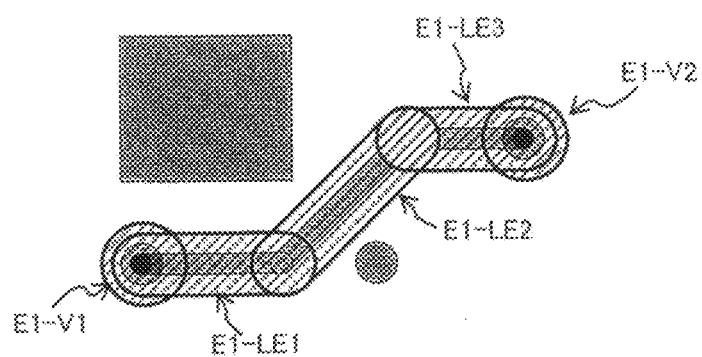
FIG. 24 is a diagram illustrating a technique for generating a surface pattern in a circuit board design aid apparatus as one embodiment.

The pattern prohibition region generation section 24 obtains each wiring pattern element LE or the like of the net for generating a shield pattern (see FIG. 23), and generates geometries E1-LE1 to E1-LE3, E1-V1, and E1-V2 by magnifying each wiring pattern element LE by the shield pattern spacing "d", as depicted in FIG. 24.

Note that, hereinafter, the reference symbols E1-LE1 to E1-LE3, E1-V1, and E1-V2 are used when a reference to a specific one of the multiple geometries obtained by magnifying each wiring pattern element LE by the shield pattern spacing "d" in the pattern prohibition region generation section 24, while reference symbol E1 is used when reference is made to any one of the geometries.

In addition, the pattern prohibition region generation section 24 is adapted to check whether there are any elements on the same layer to which a clearance check is to be performed, located around the geometry E1, and to obtain the geometries of the identified elements if any.

Figure 25:
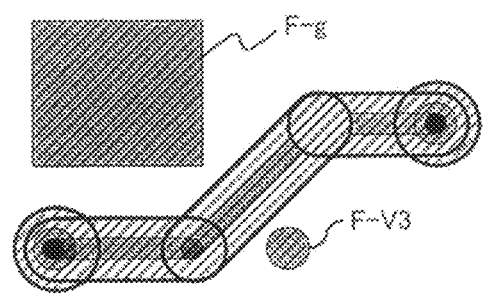
FIG. 25 is a diagram illustrating a technique for generating a surface pattern in a circuit board design aid apparatus as one embodiment.
Figure 26:
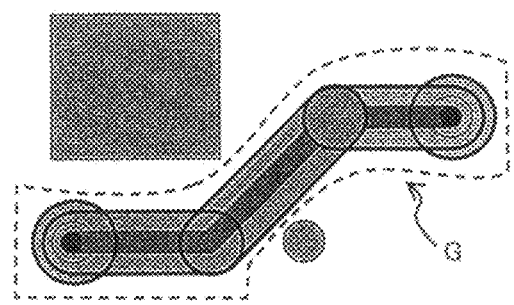
FIG. 26 is a diagram illustrating a technique for generating a surface pattern in a circuit board design aid apparatus as one embodiment.

More specifically, the element g and the via V3 are located around the wiring pattern L in the example depicted in FIG. 25, and the pattern prohibition region generation section 24 obtains a geometry F-g of the element g and a geometry F-V3 of the via V3 by looking up the pattern information 62.

Note that, hereinafter, the reference symbols F-g and F-V3 are used when a reference to a specific one of the multiple geometries of elements to which a clearance check is to be performed in the pattern prohibition region generation section 24, while reference symbol F is used when reference is made to any one of the geometries.

Furthermore, the pattern prohibition region generation section 24 is adapted to obtain a geometry G by excluding the geometry F from the above-described geometry E1 (see FIG. 26), set a net to be shielded (net for which the wiring pattern L is formed) or a net group handled as a bundle as an allowed net, and register it as a prohibition region in a pattern prohibition region type.

Note that the data address of the registered prohibition region element is stored as a shield related element address of the net for generating a shield pattern. In addition, the processing for excluding a geometry from another in the circuit board design aid apparatus 100 can be done using various known techniques, and details thereof will not be described.

Then, the pattern prohibition region generation section 24 is adapted to store the generated geometries D1, D2, and D3 into the pattern prohibition region generation section 24 as prohibition regions. In addition, the pattern prohibition region generation section 24 is adapted to register all geometries G in the prohibition region information 63 (prohibition geometry data table).

The shield pattern geometry generation section 25 is adapted to generate a shield pattern based on geometries (geometries A2, B2, and C1) of the basic shield pattern elements generated by the same layer shield pattern element generation section 21, the top and bottom layer shield pattern element generation section 22, and the intermediate layer shield pattern element generation section 23, and geometries (geometries D1, D2, and D3) of the prohibition regions generated by the pattern prohibition region generation section 24.

Figure 27:
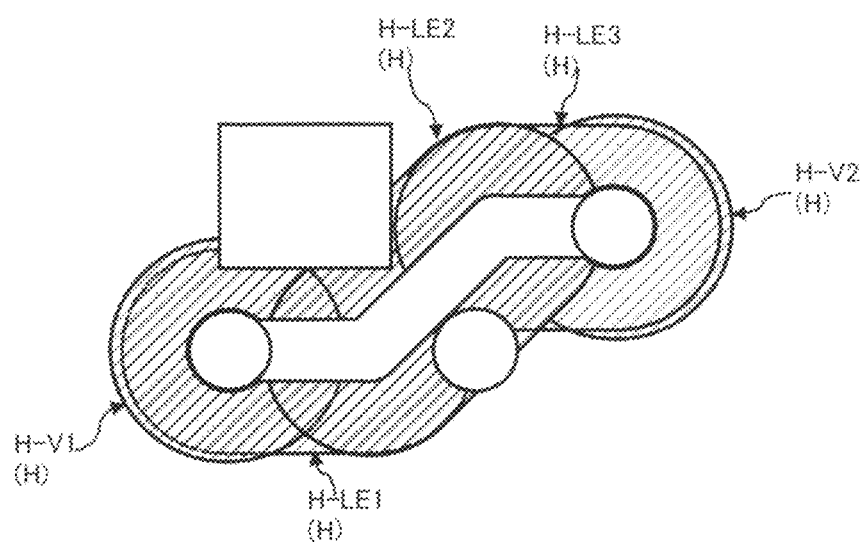
FIG. 27 is a diagram illustrating a technique for generating a shield pattern for a surface pattern according to a surface pattern in a circuit board design aid apparatus as one embodiment.
Figure 28:
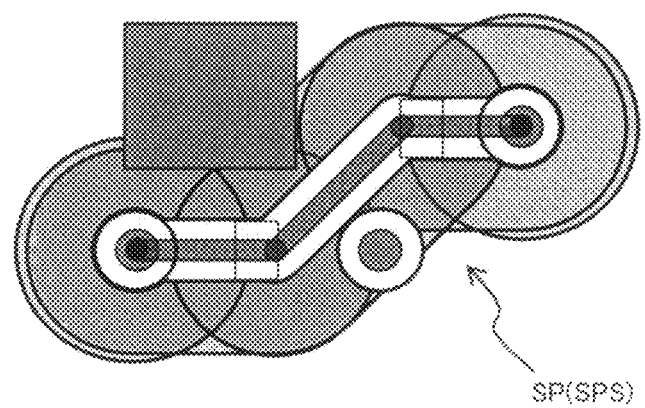
FIG. 28 is a diagram illustrating a technique for generating a shield pattern for a surface pattern according to a surface pattern in a circuit board design aid apparatus as one embodiment.

FIGS. 27 and 28 are diagrams illustrating generation of a shield pattern according to a surface pattern in the circuit board design aid apparatus 100 as one embodiment. FIG. 27 is a diagram illustrating generation of shield pattern elements by the shield pattern geometry generation section 25 thereof. FIG. 28 is a diagram illustrating an example of a shield pattern SP generated.

The shield pattern geometry generation section 25 is adapted to generate a shield pattern by excluding the geometries (geometries D1, D2, and D3) of the prohibition regions generated by the pattern prohibition region generation section 24 from the geometries (geometries A2, B2, and C1) of the basic shield pattern elements generated by the same layer shield pattern element generation section 21, the top and bottom layer shield pattern element generation section 22, and the intermediate layer shield pattern element generation section 23.

For example, when generating a same layer shield pattern SPS of a surface pattern, the shield pattern geometry generation section 25 is adapted to generate a geometry H of the shield pattern element SPSE by excluding the geometry (geometry D1; see FIG. 20) of all prohibition regions having the common layer concerned (interconnection layer) from each basic shield pattern element A2 (see FIG. 16).

More specifically, the shield pattern geometry generation section 25 checks whether there is any overlap of each basic shield pattern A2 generated by the same layer shield pattern element generation section 21 with any prohibition regions formed on the same layer as that basic shield pattern A2 among prohibition regions generated by the pattern prohibition region generation section 24.

If there is any basic shield pattern A2 overlapping with a prohibition region, the shield pattern geometry generation section 25 is adapted to generate each geometry H of the shield pattern element SPSE (surface pattern element) by eliminating (subtracting; excluding) the overlapping portion from that basic shield pattern A2.

Note that elimination (subtraction; exclusion) of overlapping portion by the shield pattern geometry generation section 25 can be achieved by a Boolean operation (subtraction) and the like, for example.

In the example depicted in FIG. 27, geometries H generated based on the vias V1 and V2 are referred to by H-V1, H-V2, and the geometries H generated based on the wiring pattern elements LE1-LE3 are referred to by H-LE1 to H-LE3.

Then, the shield pattern geometry generation section 25 is adapted to register each geometry H (surface pattern element) depicted in FIG. 27 into the surface pattern information 68 as shield pattern element.

Note that, when registering each geometry H (surface pattern element) depicted in FIG. 27 to the surface pattern information 68 as a shield pattern element, portions formed as separate components upon the elimination of an overlapping portion are registered as separate shield pattern elements SPSE. For example, a geometry H-LE2 is registered being divided into three portions, namely, shield pattern elements SPSE3-SPSE5.

In this manner, a same layer shield pattern (surface pattern SPS) that does not interfere with the member g and the via V3 located in the vicinity of the wiring pattern L is generated in the circuit board design aid apparatus 100, as depicted in FIG. 28.

Figure 29:
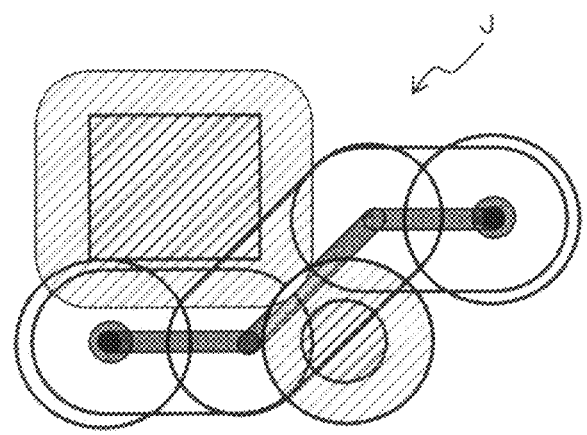
FIG. 29 is a diagram illustrating a technique for generating a shield pattern for a line pattern according to a surface pattern in a circuit board design aid apparatus as one embodiment.
Figure 30:
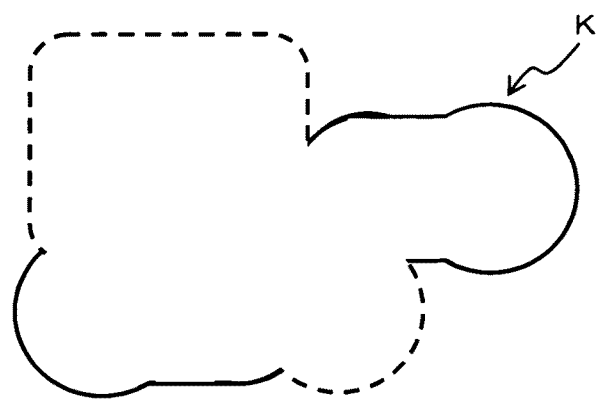
FIG. 30 is a diagram illustrating a technique for generating a shield pattern for a line pattern according to a surface pattern in a circuit board design aid apparatus as one embodiment.
Figure 31:
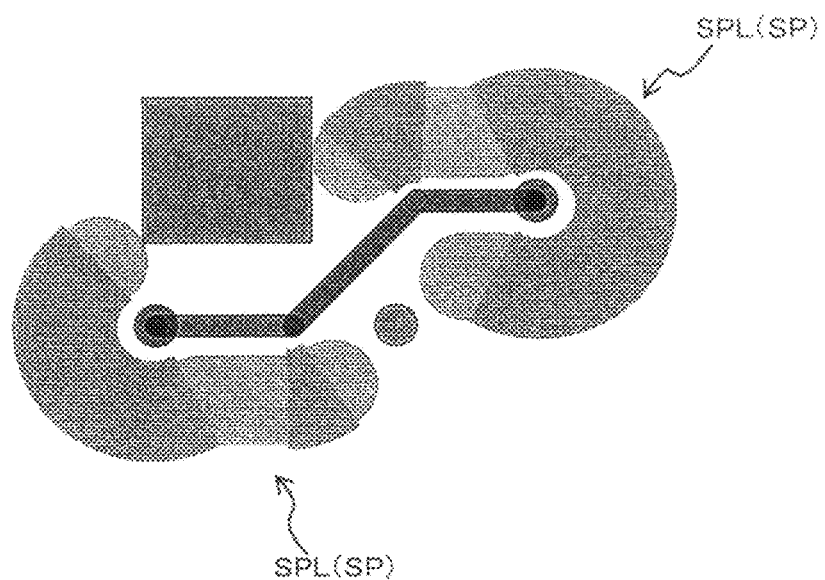
FIG. 31 is a diagram illustrating a technique for generating a shield pattern for a line pattern according to a surface pattern in a circuit board design aid apparatus as one embodiment.

FIGS. 29-31 are diagrams illustrating generation of a shield pattern according to a line pattern in the circuit board design aid apparatus 100 as one embodiment. FIG. 29 is a diagram illustrating generation of shield pattern elements by the shield pattern geometry generation section 25 thereof. FIG. 31 is a diagram illustrating an example of a shield pattern SP generated.

When generating a same layer shield pattern of a line pattern SPL, the shield pattern geometry generation section 25 is adapted to generate a geometry H of the shield pattern element SPLE by excluding the geometry (geometry D2; see FIG. 20) of all prohibition regions having the common layer concerned (interconnection layer) from the geometry B2 generated by the same layer shield pattern element generation section 21 (see FIG. 18).

More specifically, the shield pattern geometry generation section 25 checks whether there is any overlap of the geometry B2 generated by the same layer shield pattern element generation section 21 with other elements formed on the same layer as the wiring pattern L among prohibition regions generated by the pattern prohibition region generation section 24.

If there is any geometry B2 overlapping with a prohibition region, the shield pattern geometry generation section 25 is adapted to generate a center line geometry K of the shield pattern element SPLE (line pattern element) by eliminating (subtracting; excluding) the overlapping portion from that geometry B2, as depicted in FIG. 30.

Then, the shield pattern geometry generation section 25 is adapted to form, for each element (line segment, arc) constituting this center line geometry K (see FIG. 30), a line pattern SPL (shield pattern SP, shield pattern element SPLE) by forming a line width of the line shield pattern width "w" having the center line geometry K as a center line (see FIG. 31), by looking up the net information 61 or the like.

In this manner, a same layer shield pattern (shield pattern SP, line pattern SPL) that does not interfere with the member g and the via V3 located in the vicinity of the wiring pattern L is generated in the circuit board design aid apparatus 100, as depicted in FIG. 31.

Although each shield pattern SP (line pattern SPL, shield pattern element SPLE) is formed by generating a center line geometry K of a shield pattern element SPLE (line pattern element), and by forming a line width having the line shield pattern width "w" with respect to the center line K in this embodiment, this is not limiting.

For example, instead of a center line K, an outline geometry on one end of a shield pattern element SPLE (line pattern element) may be generated, and a shield pattern element SPLE may be formed by forming a line width having the line shield pattern width "w" with respect to this outline. This embodiment can be modified without departing the spirit of the present invention.

Figure 32:
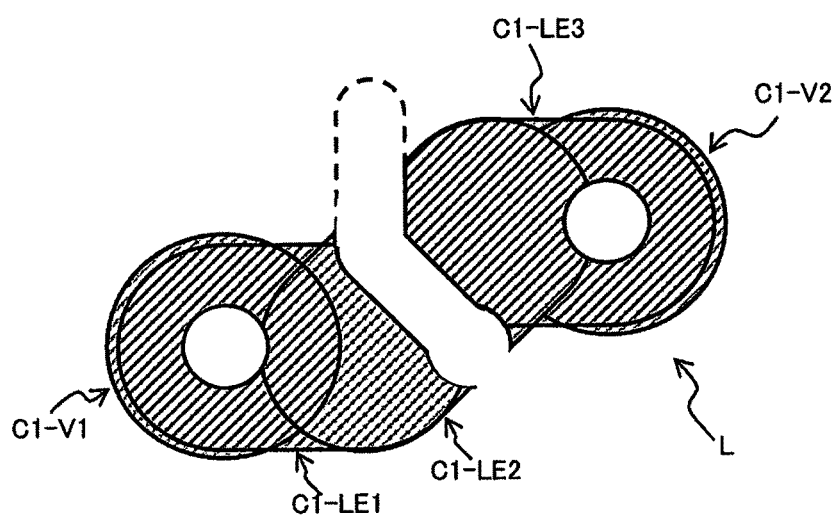
FIG. 32 is a diagram illustrating a technique for generating an top and bottom layer shield patterns in a circuit board design aid apparatus as one embodiment.
Figure 33:
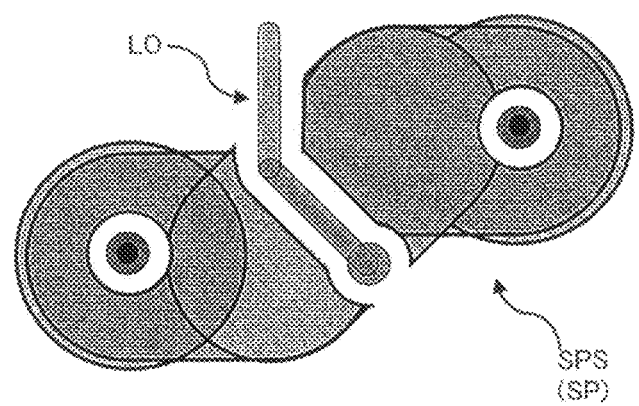
FIG. 33 is a diagram illustrating a technique for generating an top and bottom layer shield patterns in a circuit board design aid apparatus as one embodiment.

FIGS. 32 and 33 are diagrams illustrating generation of an upper or lower shield pattern in the circuit board design aid apparatus 100 as one embodiment. FIG. 32 is a diagram illustrating generation of shield pattern elements by the shield pattern geometry generation section 25 thereof. FIG. 33 is a diagram illustrating an example of a shield pattern SP generated.

When generating a top or bottom layer shield pattern SP, the shield pattern geometry generation section 25 is adapted to generate a geometry L of the shield pattern element SPSE by excluding the geometry (geometry D3; see FIG. 22) of all prohibition regions having the common layer concerned (interconnection layer) from the geometry C1 generated by the top and bottom layer shield pattern element generation section 22 (see FIG. 19).

More specifically, the shield pattern geometry generation section 25 checks whether or not there is any overlap of each basic shield pattern C1 generated by the top and bottom layer shield pattern element generation section 22 with any prohibition regions formed on the same layer as that basic shield pattern C1 among prohibition regions generated by the pattern prohibition region generation section 24.

If there is any basic shield pattern C1 overlapping with a prohibition region, the shield pattern geometry generation section 25 is adapted to generate each geometry L of the shield pattern element SPSE (surface pattern element) by eliminating (subtracting; excluding) the overlapping portion from that basic shield pattern C1.

In the example depicted in FIG. 32, geometries L generated based on the vias V1 and V2 are referred to by C1-V1, C1-V2, and the geometries H generated based on the wiring pattern elements LE1-LE3 are referred to by C1-LE1 to C1-LE3.

Then, the shield pattern geometry generation section 25 is adapted to register each geometry L (surface pattern element) depicted in FIG. 32 into the surface pattern information 68 as shield pattern element, together with the wiring layer.

In this manner, a top or bottom layer shield pattern (surface pattern SPS) that does not interfere with the wiring pattern LO is generated in the circuit board design aid apparatus 100, as depicted in FIG. 33.

Note that the shield pattern geometry generation section 25 also checks whether there is any overlap of the geometry A2 or B2 related to a intermediate layer generated by the above-described intermediate layer shield pattern element generation section 22 with other elements formed on the same layer as the geometry A2 or B2 among prohibition regions generated by the pattern prohibition region generation section 24.

If there is any geometry A2 or B2 overlapping with a prohibition region, the shield pattern geometry generation section 25 is adapted to generate a center line geometry K of the shield pattern element SPLE (surface pattern element) or a shield pattern element SPSE by eliminating (subtracting; excluding) the overlapping portion from that geometry A2 or B2, as depicted in FIG. 2.

In addition, for respective shield patterns generated for different nets, the shield pattern geometry generation section 25 is adapted to perform a combination operation (exclusion operation) on any shield patterns and prohibition regions that intersect or overlap on the same interconnection layer.

Figure 34:
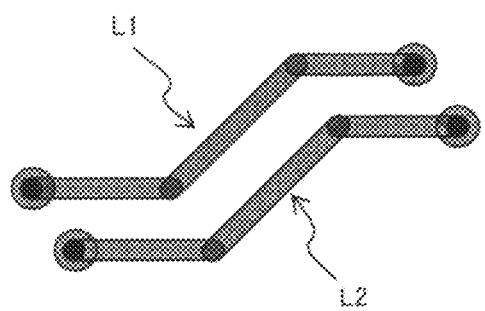
FIG. 34 is a diagram illustrating combining processing by shield pattern geometry generating section in a circuit board design aid apparatus as one embodiment.
Figure 35:
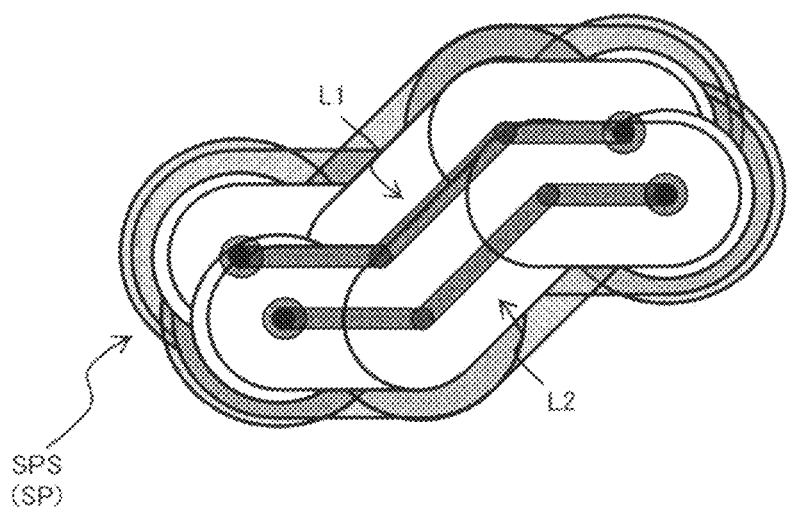
FIG. 35 is a diagram illustrating combining processing by shield pattern geometry generating section in a circuit board design aid apparatus as one embodiment.
Figure 36:
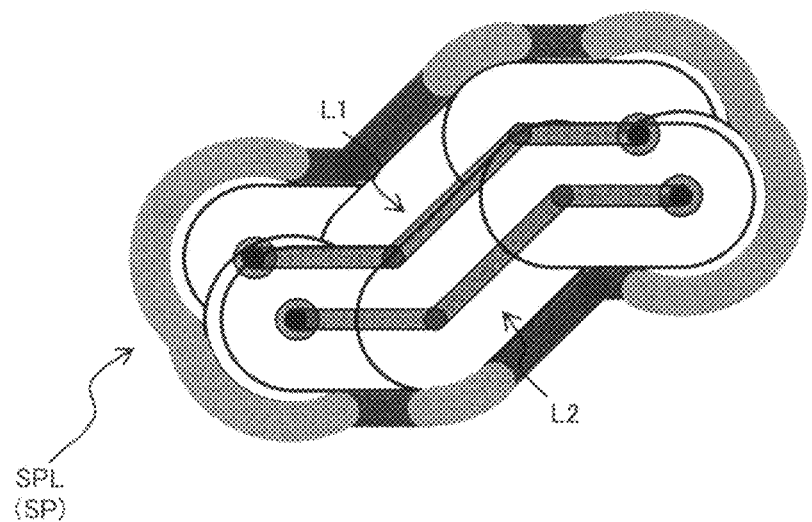
FIG. 36 is a diagram illustrating combining processing by shield pattern geometry generating section in a circuit board design aid apparatus as one embodiment.

FIGS. 34-36 are diagrams illustrating a combination operation by the shield pattern geometry generation section 25 in the circuit board design aid apparatus 100 of one embodiment. FIG. 34 is a diagram illustrating an example of two wiring patterns L1 and L2 formed adjacent to the same interconnection layer. FIG. 35 is a diagram illustrating an example of a surface pattern SPS which undergoes the combination operation. FIG. 36 is a diagram illustrating an example of a line pattern SPL combined.

For example, as depicted in FIG. 34, the two wiring patterns L1 and L2 are located in the adjacent positions on the same interconnection layer of the same printed circuit board, and different nets are set for the two wiring patterns L1 and L2, the shield pattern geometry generation section 25 is adapted to exclude prohibition regions for shield patterns for the different nets.

When an exclusion operation is performed after accumulating calculated shield pattern geometries and geometries of prohibition regions in a working table (not illustrated) and a shield pattern and registering the results to the storage device (data section) 60 is requested, such as when invoked by the shield pattern generation command section 13, they are registered as line elements or surface pattern elements at this time.

In contrast, when it is instructed that the results be not registered to the storing section 60, such as when invoked by the pattern editing command section 30 for the purpose of obtaining an expected geometry of a shield pattern, the obtained geometry is temporality stored in a temporary geometry table (not illustrated).

In addition, the shield pattern geometry generation section 25 is also adapted to take an allowed net (geometry G) into consideration when generating a shield pattern, and, when an allowed net is set for the prohibition region information 63, is adapted to allow generation of a pattern for the net (allowed net).

Furthermore, the shield pattern geometry generation section 25 is adapted to register the generated shield pattern to the pattern information 62.

In addition, the shield pattern geometry generation section 25 is adapted to generate a surface pattern SPS (shield pattern SP) by combining (uniting) a plurality of shield patterns elements SPSE1-SPSE7, or to generate a line pattern SPL (shield pattern SP) by combining (uniting) a plurality of shield patterns elements SPLE1-SPLE7, wherein such an operation is achieved by a Boolean operation (AND), for example.

The shield via generation execution section (via generation section) 26 is adapted to generate a build-up via (shield via, via) BV across shield patterns generated on multiple interconnection layers, within a region of a shield pattern (basic shield pattern element) SP, and is adapted to function as a via position determining section 261, a via position modification section 262, and a via position adjustment section 263, as depicted in FIG. 1.

Figure 37:
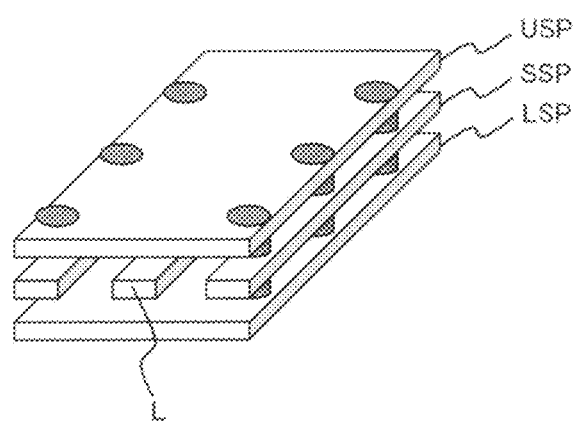
FIG. 37 is a diagram illustrating an example of the configuration of the via generated by a shield via generation execution section of a circuit board design aid apparatus as one embodiment.

FIG. 37 is a diagram illustrating an example of the configuration of the via generated by a shield via generation execution section of the circuit board design aid apparatus 100 as one embodiment.

The shield via execution generation section 26 is adapted to generate, when multiple layers of shield patterns SP are generated for the wiring pattern L as depicted in FIG. 37 (three layers of a top shield pattern USP, a bottom shield pattern LSP, and a same layer shield pattern SSP in the example depicted in FIG. 37), a build-up via BV at a location connecting to the shield patterns only across layers which are the same net as the shield patterns SP, and the shield patterns SP are generated.

The via position evaluation section 261 is adapted to evaluate whether or not the position of the generated build-up via is appropriate by comparing the position of the generated build-up via with the position of other elements (elements for performing a clearance check) on the printed circuit board.

In the circuit board design aid apparatus 100, the shield via generation execution section 26 can place a series of vias spaced apart with predetermined spacing on the shield pattern SP, and, for example, is adapted to generate build-up vias at a predetermined spacing (shield via spacing) BV on a placement line generated based on the outline geometry of the wiring pattern L.

Figure 38:
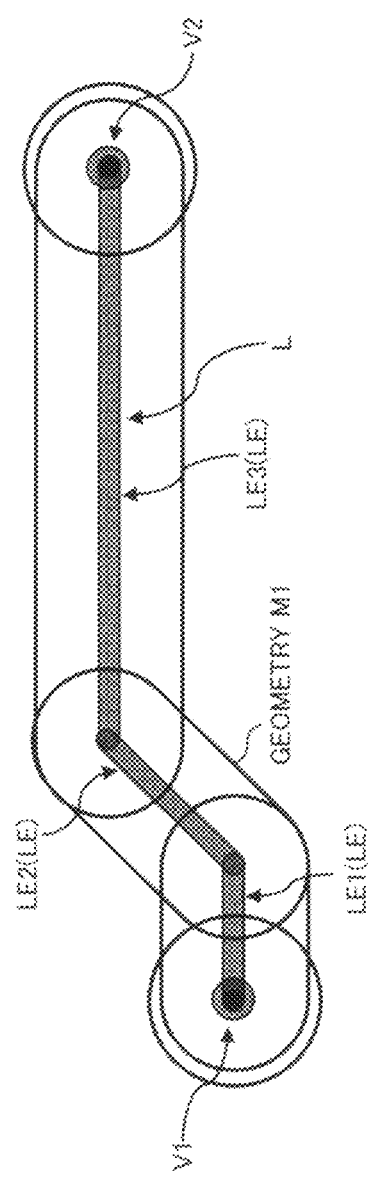
FIG. 38 is diagram illustrating a technique for setting a build-up via generation position candidate in a circuit board design aid apparatus as one embodiment.
Figure 39:
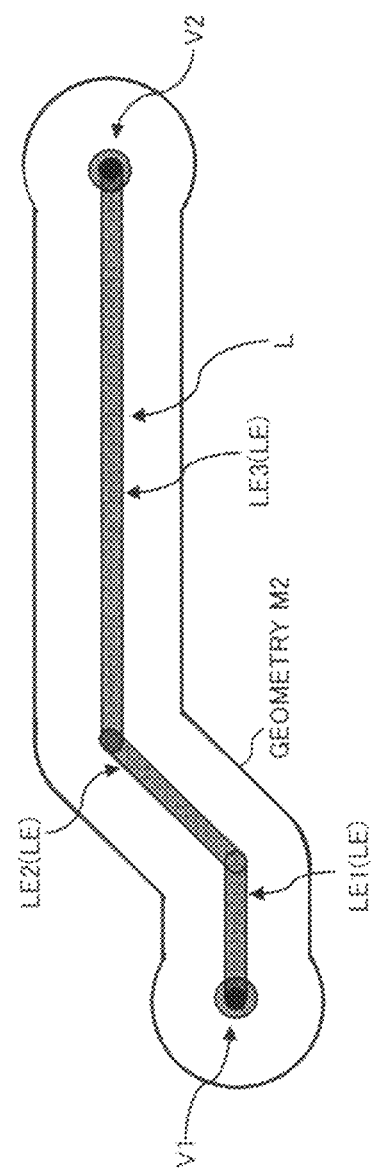
FIG. 39 is diagram illustrating a technique for setting a build-up via generation position candidate in a circuit board design aid apparatus as one embodiment.

FIGS. 38 and 39 are diagrams illustrating a technique for setting a build-up via generation position candidate in the circuit board design aid apparatus 100 as one embodiment.

The shield via generation execution section 26 is adapted to obtain each wiring pattern element LE related to the net for which a shield via (build-up via BV) is to be generated, and generate a geometry M1 by magnifying each wiring pattern element LE on the plane on which the wiring pattern L is formed in interconnection layer of the printed circuit board by the value obtained by adding a via conductor radius D to the shield pattern spacing "d" (d+D) (see FIG. 38).

Then, the shield via generation execution section 26 is adapted to combine these geometries M1 for each interconnection layer to generate as an outline geometry M2 thereof, and to generate a build-up via BV with a predetermined spacing (shield via spacing) on that geometry M2 (see FIG. 39).

In addition, when determining a generation position of the build-up via BV, the shield via generation execution section 26 may obtain a generation position candidate (candidate position), determines whether or not the generation position candidate is appropriate by the via position evaluation section 261, and generate a build-up via BV when the generation position candidate for a build-up via BV is determined as appropriate.

The via position evaluation section 261 is adapted to evaluate whether or not a candidate position for a build-up via BV is appropriate, and is adapted to check a clearance between the candidate position for a build-up via BV and other elements on the printed circuit board in the process of sequentially placing vias with a predetermined spacing on the shield pattern SP by the shield via generation execution section 26. Note that this clearance may be register to the reference information 65 in advance, for example.

The via position modification section 262 is adapted to modify (correct) the position of a build-up via the position of which was determined by the via position evaluation section 261 as inappropriate.

Figure 40:
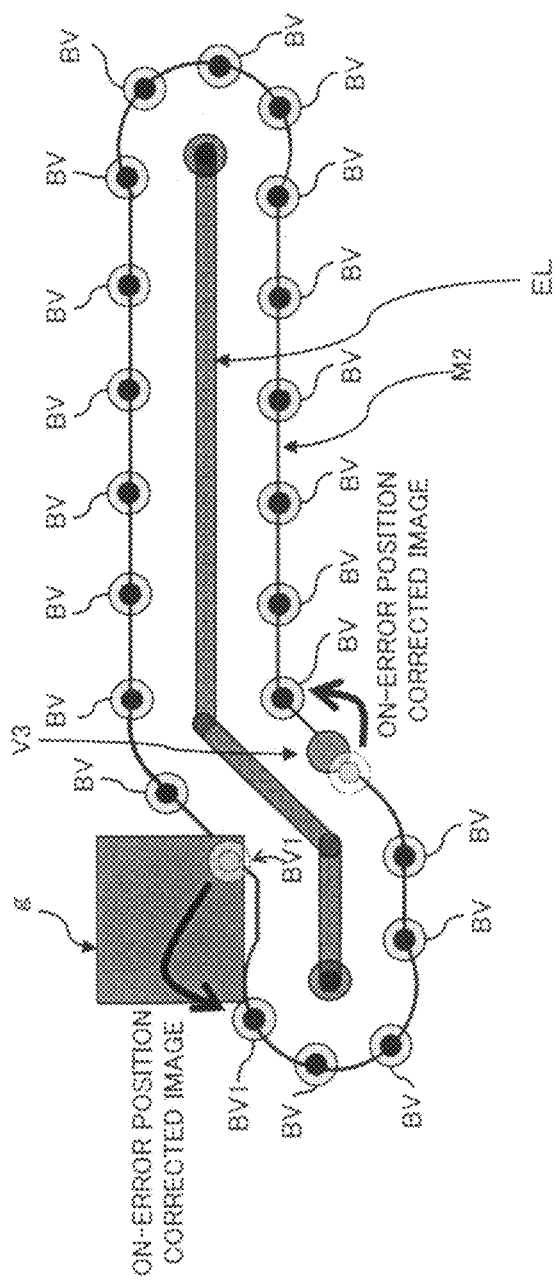
FIG. 40 is diagram illustrating a technique for correcting a via position by a via position modification section in a circuit board design aid apparatus as one embodiment.

FIG. 40 is diagram illustrating a technique for correcting a via position by the via position modification section 262 in the circuit board design aid apparatus 100 as one embodiment.

In the example depicted in FIG. 40, when the via position evaluation section 261 detects that a element g and a build-up via BV1 interfere with each other, the via position modification section 262 is adapted to correct the position of the build-up via BV1 to a position satisfying the clearance condition with the element g.

For example, for the wiring pattern L, when the shield via generation execution section 26 sequentially determines the positions of build-up vias BV with a predetermined spacing around the wiring pattern L, and if a provisional position of a build-up via BV is determined, the via position evaluation section 261 compares the placement position candidate of the build-up via BV and each of the positions of elements for which a clearance check is to be performed around the wiring pattern L.

When the preset clearance condition (such as the distance between the build-up via BV and each element) is not satisfied, the via position modification section 262 discard the placement position candidate of that build-up via BV, and sets a placement position candidate to a different position satisfying the clearance condition with elements for which a clearance check is to be performed on the placement line around the wiring pattern L.

Note that in this embodiment, correction of a via position by the via position modification section 262 may be referred to as a "on-error position correction function". In addition, in the circuit board design aid apparatus 100, an operator can enable or disable such an on-error position correction function. For example, when the operator sets (provides an input) to enable or disable the on-error position correction function on a setting screen (not illustrated) displayed on the display 51 using the keyboard 52 and/or the mouse 55, the setting is stored into a predetermined storing region in the RAM 53 or the storing section 60.

The via position adjustment section 263 is adapted to adjust the position of a via in one array so that the via is equally distant from two neighboring vias in another array in the process of placing vias with a specific spacing on the shield pattern.

Figure 41:
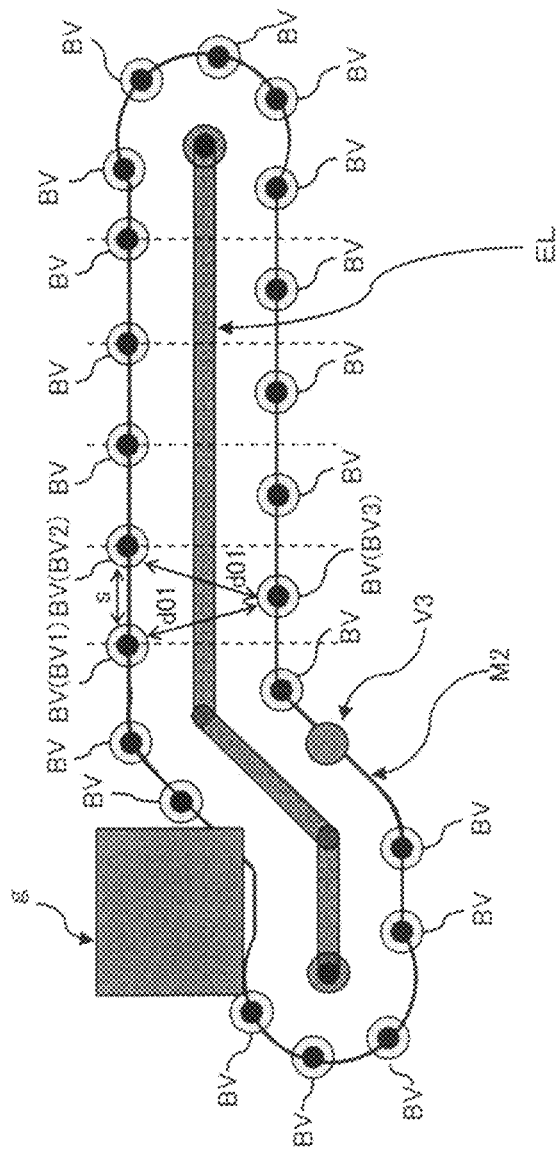
FIG. 41 is a diagram illustrating an example of via positions adjusted by a via position adjustment section in a circuit board design aid apparatus as one embodiment.

FIG. 41 is a diagram illustrating an example of a via position adjusted by the via position adjustment section 263 in a circuit board design aid apparatus 100 as one embodiment.

As depicted in FIG. 41, the via position adjustment section 263 is adapted to place a build-up via BV to a position on one side of a pair of opposing side with respect to the wiring pattern L such that the via BV (VB3, for example) on the opposing side is equally distant (d01, d01) from two neighboring build-up vias BV (VB1 and VB2, for example) with a predetermined spacing (s) on the placement line of build-up vias BV formed around the wiring pattern L, on one side of a pair of opposing side with respect to the wiring pattern L.

Note that in this embodiment, adjustment of a via position by the via position correction section 263 may be referred to as a "via array correction function". In addition, in the circuit board design aid apparatus 100, an operator can enable or disable such a via array correction function. For example, when the operator sets (provides an input) to enable or disable the via array correction function on a setting screen (not illustrated) displayed on the display 51 using the keyboard 52 and/or the mouse 55, the setting is stored into a predetermined storing region in the RAM 53 or the storing section 60.

The shield pattern check section (evaluation section) 40 is adapted to perform an evaluation of a shield pattern formed on the printed circuit board (shield pattern check), and includes a shield pattern spacing check execution section 41 and a shield pattern generation rate check execution section 42.

The shield pattern spacing check execution section 41 is adapted to check a spacing between each wiring pattern element LE constituting a net, such as a wiring pattern L or a via V, and a generated shield pattern SP (shield pattern spacing check).

The shield pattern spacing check execution section 41 is adapted to evaluate the geometry of a shield pattern SP by comparing a spacing P between each wiring pattern element LE and a shield pattern element SPSE, SPSL with a preset reference value.

Figure 42:
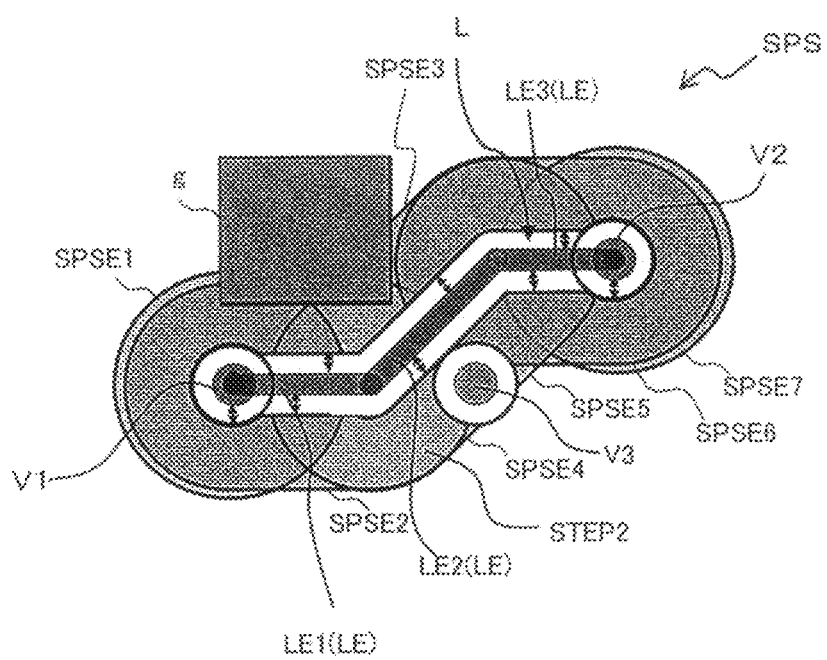
FIG. 42 is a diagram illustrating a technique for a spacing check for a surface pattern according to a surface pattern in a circuit board design aid apparatus as one embodiment.
Figure 43:
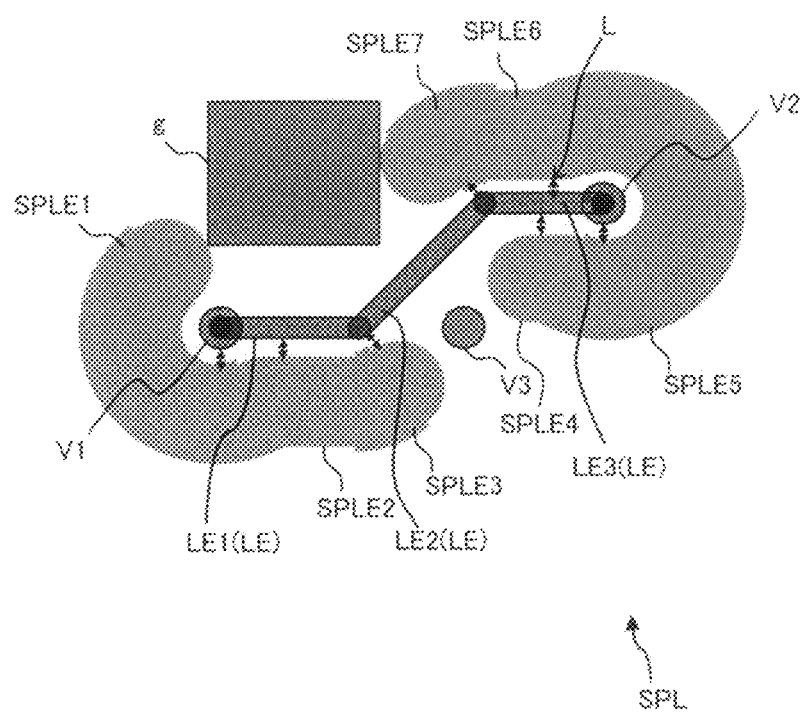
FIG. 43 is a diagram illustrating a technique for a spacing check for a surface pattern according to a line pattern in a circuit board design aid apparatus as one embodiment.

FIG. 42 is a diagram illustrating a spacing check on a surface pattern SPS in the circuit board design aid apparatus 100 as one embodiment. FIG. 43 is a diagram illustrating a spacing check on a line pattern SPL therein. As depicted in FIG. 42 and FIG. 43, the shield pattern spacing check execution section 41 is adapted to evaluate a spacing between each wiring pattern element LE and a shield pattern element SPSE or SPSL.

In the circuit board design aid apparatus 100, the shield pattern spacing check execution section 41 can perform any types of evaluation: one is a spacing deficit check for evaluating whether a spacing P between each wiring pattern element LE and a shield pattern element SPSE or SPSL is too smaller than a preset reference value (first reference value), and the other is a spacing excess check for evaluating whether or not the spacing P is too closer than a preset reference value (second reference value).

In addition, when a tolerance value is set for a spacing deficit check with a shield pattern, the shield pattern spacing check execution section 41 is adapted not to determine the location close to this tolerance value as an error.

Furthermore, the shield pattern spacing check execution section 41 has a shield pattern missing check function for identifying a shield pattern SP that is located in positions where to shield pattern SP is generated or that is farther from a defined spacing, and is adapted to detect locations where a generation ratio of top or bottom layer shield patterns is low. Furthermore, when a tolerance value is set for a shield pattern missing check, the shield pattern spacing check execution section 41 is adapted not to determine the location that is distant by at least this tolerance value as an error.

The shield pattern generation rate check execution section 42 is adapted to evaluate a generated shield pattern SP by comparing ratio R (shield pattern generation ratio) of the area of the geometry (geometry A2, B2, C1) of the area of a shield pattern SP generated by the shield pattern geometry generation section 25 (geometry of a shield pattern actually generated) with respect to a basic shield pattern element generated by the same layer shield pattern element generation section 21, the top and bottom layer shield pattern element generation section 22 and the intermediate layer shield pattern element generation section 23 (area of a required shield pattern geometry) with a preset reference value.

The shield pattern generation rate check execution section 42 issues an error when the shield pattern generation ratio is smaller than the reference value.

For example, for top and bottom layer shield patterns, the shield pattern generation rate check execution section 42 is adapted to compare a ratio R1 (shield pattern generation ratio) of the area of a shield pattern SP generated by the shield pattern geometry generation section 25 (geometry area of a shield pattern actually generated) with respect to the area of basic shield pattern element (geometry C1) generated by the top and bottom layer shield pattern element generation section 22 (required shield pattern geometry area) with a preset reference value.

That is, for top and bottom layer shield patterns, the shield pattern generation rate check execution section 42 is adapted to evaluate an inclusion ratio (area ratio) required for the shield.

In addition, for same layer shield patterns and intermediate layer shield patterns, the shield pattern generation rate check execution section 42 is adapted to compare a ratio R2 (shield pattern generation ratio) of the length of the overlapping portion with a shield pattern SP generated by the shield pattern geometry generation section 25 on the periphery (length of the portion shielded by shield pattern actually generated) with respect to the value generated based on the periphery length of a basic shield pattern element (geometry A2, B2) generated by the same layer shield pattern element generation section 21 or the intermediate layer shield pattern element generation section 23 (required shield pattern geometry periphery length) with a preset reference value.

Figure 44:
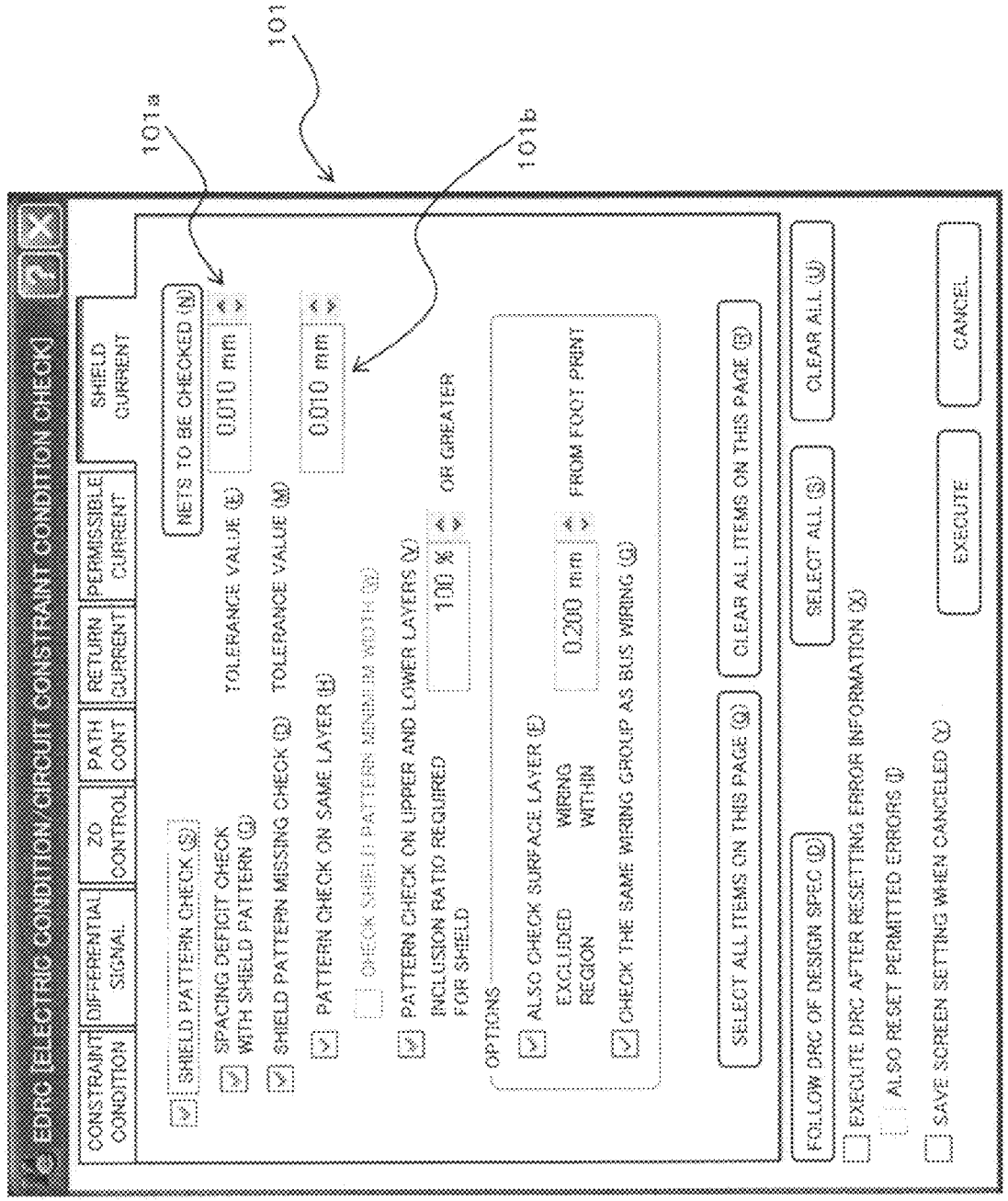
FIG. 44 is a diagram illustrating an example of a input screen for entering various conditions for a shield pattern check in a circuit board design aid apparatus as one embodiment.

FIG. 44 is a diagram illustrating an example of a input screen for entering various conditions for a shield pattern check in the circuit board design aid apparatus 100 as one embodiment.

The example depicted in FIG. 44, a check of a spacing deficit between a wiring pattern L and a shield pattern, and a shield pattern missing check are available for a shield pattern check function.

In addition, as depicted in FIG. 44, on the shield pattern check command control screen 101, an operator can set the numbers of nets to be checked (N), whether or not a shield pattern spacing check is required, whether or not a shield pattern generation rate check is required, a shield pattern minimum allowable generation ratio, the tolerance value for a spacing deficit check with a shield pattern (see spacing deficit check tolerance; reference symbol 101a), a tolerance value for a shield pattern missing check (see spacing excess check tolerance; reference symbol 101b), and the like.

Note that a "spacing deficit check with a shield pattern" is for detecting locations where spacing between a wiring pattern L and a generated shield pattern SP is not enough, and a shield pattern spacing deficit error is issued when the spacing between the wiring pattern L and the generated shield pattern SP is smaller than a preset reference value (reference spacing value). Note that a shield pattern spacing deficit error may be issued in various manners, for example, an error may displayed on the display 51 or the like, or data thereon may be accumulated in an error log.

In addition, a "shield pattern missing check" means determination of a generation ratio of a shield pattern based on the ratio of locations where no shield pattern is generated, and determination of locations having lower generation ratios can also be detected.

Furthermore, the shield pattern check section 40 is also able to detect a shield pattern located at a position distant with at least a defined spacing, and determination of locations having lower generation ratios can also be detected in top and bottom layer shield patterns.

Various types of information entered and set on the shield pattern check command control screen 101 is stored into a predetermined storing region in the RAM 53, the storing section 60, or the like.

Figure 45:
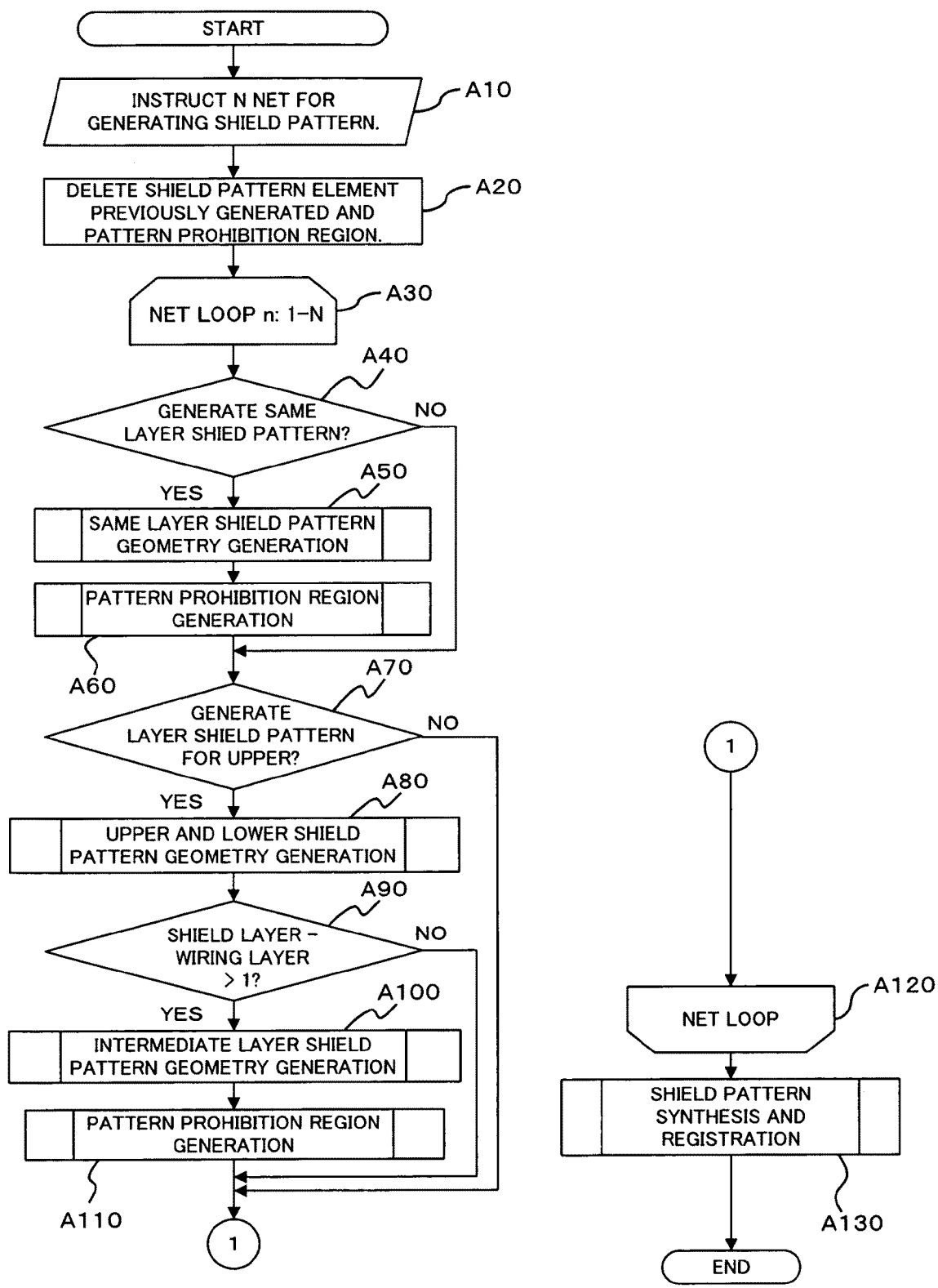
FIG. 45 is a flowchart illustrating a technique for generating a shield pattern in a circuit board design assistance apparatus as one embodiment.

A generation of a shield pattern in the circuit board design aid apparatus 100 as one embodiment configured as set forth above will be described with reference to a flowchart (Steps A10-A130) illustrated in FIG. 45 in view of FIG. 46.

Figure 46:
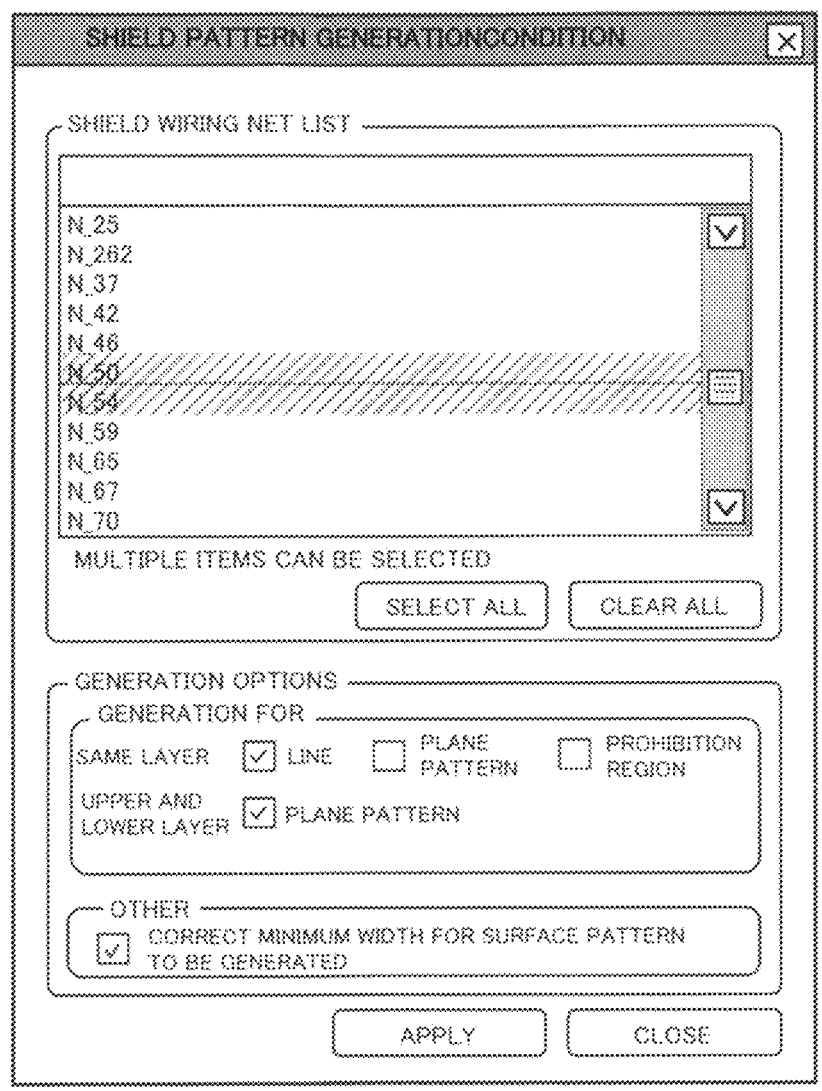
FIG. 46 is a diagram illustrating an example of a net selection screen in a circuit board design aid apparatus.

Note that FIG. 46 is a diagram illustrating an example of a net selection screen in the circuit board design aid apparatus 100.

The net selection screen 511 depicted in FIG. 46 is displayed on the display 51, and is used by an operator for setting conditions for generating a shield pattern through the shield pattern check command control screen 101 using the keyboard 52 and/or the mouse 55.

On the shield pattern check command control screen 101, the operator can select a net to which a shield pattern is to be generated (shield pattern generation net, net to be shielded) in the list of nets displayed as the shield wiring net list.

In addition, on the net selection screen 511, as a generation option of a shield pattern, whether or not a shield pattern and a prohibition region are required, and enabling generation for same layer (including intermediate layer) shield pattern element types (for example, surface pattern or line pattern).

Before generating a shield pattern for a net using the circuit board design aid apparatus 100, the operator selects a net for which a shield pattern is to be generated (shield pattern generation net) on the net selection screen 511 displayed on the display 51 (see FIG. 46) (Step A10).

Note that any information provided on the net selection screen 511 is stored into a predetermined storage region in the RAM 53, the storing section 60, or the like. In addition, in the circuit board design aid apparatus 100, a plurality of nets may be selected as nets for which shield patterns SP are to be generated, and the shield pattern generation execution section 20 stores the number of nets N in a predetermined storage region in the RAM 53 or the storing section 60.

For the selected net (wiring pattern L), if there are any shield pattern elements previously generated or prohibition regions stored thereto, the shield pattern generation execution section 20 deletes such shield pattern elements and prohibition regions (Step A20).

After an initial value of 1 is set to a variable "n" (n is a natural number), the processing in the following Steps A40-A110 is repeated while incrementing "n" until n=N (net loop; Steps A30-A120).

More specifically, the shield pattern generation execution section 20 checks whether or not a same layer shield pattern is to be generated based on the information provided through the net selection screen 511 (Step A40).

Here, when a same layer shield pattern is to be generated (see the "YES" route in Step A40), after generating a basic shield pattern element by the same layer shield pattern element generation section 21 (Step A50), a prohibition region is set by the pattern prohibition region generation section 24 (Step A60). Thereafter, the shield pattern generation execution section 20 checks whether or nor an top or bottom shield pattern is to be generated based on the information provided through the net selection screen 511 (Step A70). When no same layer shield pattern is to be generated (see the "NO" route in Step A40), the flow goes to Step A70.

When a top or bottom layer shield pattern is to be generated (see the "YES" route in Step A70), after generating a basic shield pattern element by the top and bottom layer shield pattern element generation section 22 (Step A80), a prohibition region is set by the pattern prohibition region generation section 24.

Thereafter, a determination is made whether or not the value obtained by subtracting the number of interconnection layers from the number of shield layers in the printed circuit board is greater than 1 (Step A90). If the value is 2 or greater (see the "YES" route in Step A90), it is determined that there is intermediate layer(s). After generation of a basic shield pattern element by the intermediate layer shield pattern element generation section 23 (Step A100), a prohibition region is generated by the pattern prohibition region generation section 24 (Step A110).

Thereafter, the flow goes to the next net after incrementing the value "n" (n=n+1), the processing in the above-described Steps A40-A110 is repeated while incrementing "n" until n=N (net loop; Steps A30-A120).

When no top or bottom layer shield pattern is to be generated (see the "NO" route in Step A70), or when the value obtained by subtracting the number of interconnection layers from the number of shield layers in the printed circuit board is 1 or smaller (see the "NO" route in Step A90), the flow also goes to the next net.

After the processing is completed for all nets, the shield pattern geometry generation section 25 performs shield pattern geometry generation and registration by performing processing, such as exclusion of the prohibition region from the basic shield pattern element (Step A130) and the processing is terminated.

Figure 47:
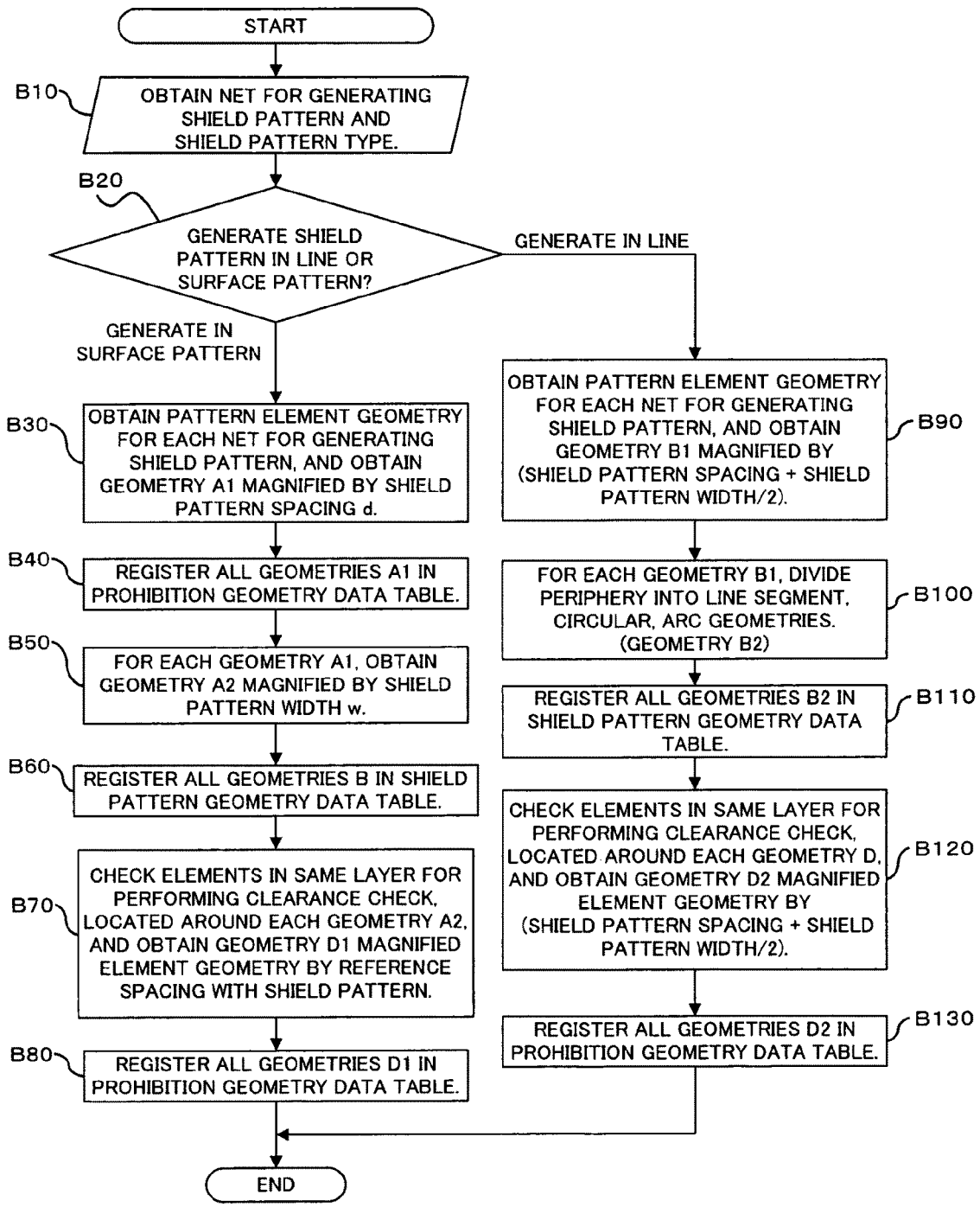
FIG. 47 is a flowchart illustrating a technique for generating a same layer shield pattern in a circuit board design assistance apparatus as one embodiment.

Next, a generation of a same layer shield pattern in the circuit board design aid apparatus 100 as one embodiment will be described with reference to a flowchart (Steps B10-B130) illustrated in FIG. 47.

Before generating a same layer shield pattern, the same layer shield pattern element generation section 21 obtains a net for generating a shield pattern and a shield pattern type (surface pattern SPS or line pattern SPL) based on the information provided through the net selection screen 511 described above (Step B10), and determines whether a shield pattern is to be generated as a surface pattern SPS or a line pattern SPL (Step B20).

When a shield pattern SP is to be generated as a surface pattern SPS (see "Generate in surface pattern" route in Step B20), the same layer shield pattern element generation section 21 obtains each geometry of each wiring pattern element LE in the shield pattern generation net (pattern element geometry), and generates a geometry A1 by magnifying the geometry of the wiring pattern element LE by a shield pattern spacing "d" (see FIG. 15) (Step B30). In addition, the same layer shield pattern element generation section 21 registers information related to the generated geometry A1 into prohibition region information 63 (Step B40).

In addition, for each generated geometry A1, the same layer shield pattern element generation section 21 further generates a geometry A2 by magnifying the geometry A1 by a shield pattern width "w" (see FIG. 16) (Step B50), and registers all of generated geometries A2 into the surface pattern information 68 (Step B60).

Then, the pattern prohibition region generation section 24 checks whether there are any elements on the same layer for performing a clearance check around a geometry A2, generates a geometry D1 by magnifying an identified element geometry if any by a reference spacing with the shield pattern (see FIG. 20) (Step B70), registers all of such geometries D1 into the prohibition region information 63 (Step B80), and the processing is terminated.

On the other hand, when a shield pattern SP is to be generated as a line pattern SPL (see "Generate in line" route in Step B20), the same layer shield pattern element generation section 21 obtains each geometry of each wiring pattern element LE in the shield pattern generation net (pattern element geometry), and generates a geometry A1 by magnifying the geometry of the wiring pattern element LE by (the shield pattern spacing "d"+the shield pattern width "w"/2) (see FIG. 17) (Step B90).

In addition, the same layer shield pattern element generation section 21 generates a geometry B2 by dividing the periphery of each generated geometry B1 into line segment geometries, circle geometries, and arc geometries (Step B100).

Furthermore, the same layer shield pattern element generation section 21 registers the generated geometry B2 into line information 66b (shield pattern geometry table) (Step B110).

Then, the pattern prohibition region generation section 24 checks whether there are any elements on the same layer for performing a clearance check around a geometry B2, generates a geometry D2 by magnifying an identified element geometry if any by (the shield pattern spacing "d"+the shield pattern width "w"/2) (see FIG. 21) (Step B120), registers all of such geometries D2 into the prohibition region information 63 (Step B130), and the processing is terminated.

Figure 48:
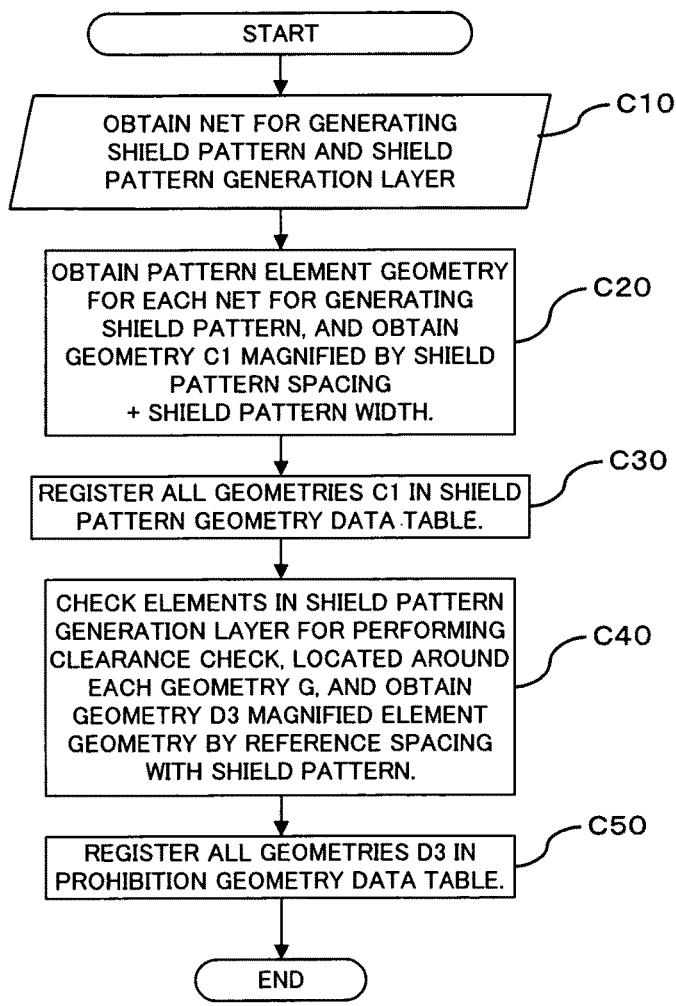
FIG. 48 is a flowchart illustrating a technique for generating a top and bottom layer shield patterns in a circuit board design aid apparatus as one embodiment.

Next, a generation of a top and bottom layer shield pattern in the circuit board design aid apparatus 100 as one embodiment will be described with reference to a flowchart (Steps C10-C50) illustrated in FIG. 48.

Before generating a top or bottom layer shield pattern, the top and bottom layer shield pattern element generation section 22 obtain a net for generating a shield pattern and a shield pattern generation layer for based on the information provided through the net selection screen 511 described above, the net information 61, and the like (Step C10).

The top and bottom layer shield pattern element generation section 22 obtains each geometry of each wiring pattern element LE in the shield pattern generation net (pattern element geometry), and generates a geometry C1 by magnifying the geometry of the wiring pattern element LE by (the shield pattern spacing "d"+the shield pattern width "w") (see FIG. 19) (Step C20). In addition, the top and bottom layer shield pattern element generation section 22 registers information related to the generated geometry C1 into a shield pattern geometry data table (Step C30).

Then, the pattern prohibition region generation section 24 checks whether there are any elements on the same layer for performing a clearance check around a geometry C1, generates a geometry D3 by magnifying a identified element geometry if any by a reference spacing with the shield pattern (see FIG. 22) (Step C40), registers all of such geometries D3 into a prohibition geometry data table (Step C50), and the processing is terminated.

Figure 49:
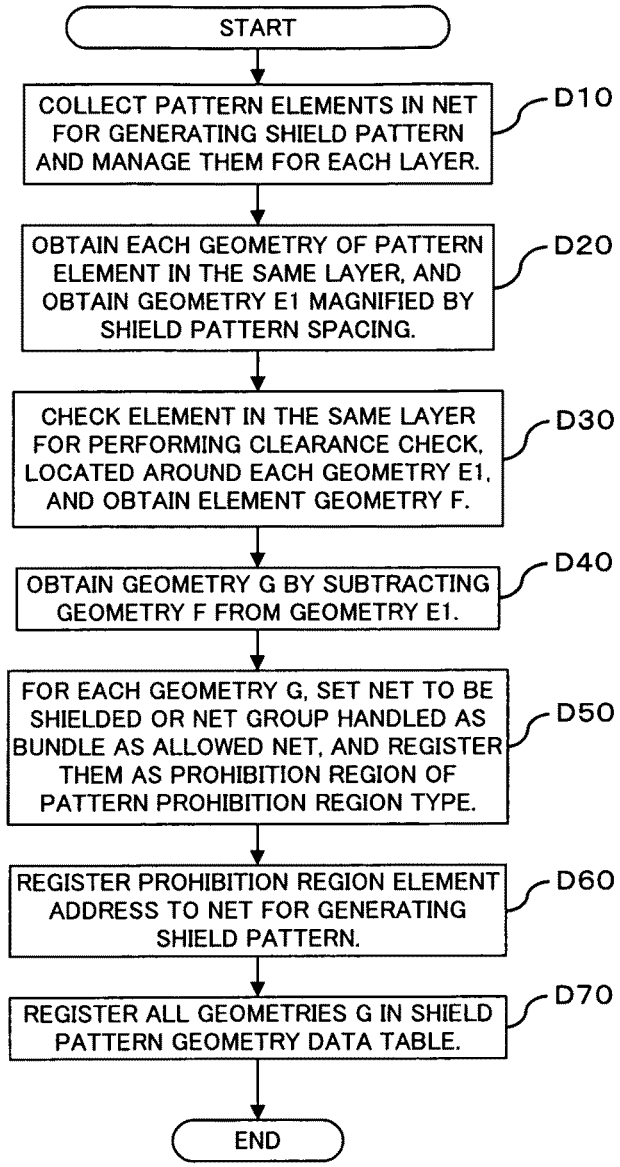
FIG. 49 is a flowchart illustrating a technique for generating a pattern prohibition region in a circuit board design aid apparatus as one embodiment.

Next, a generation of a pattern prohibition region in the circuit board design aid apparatus 100 as one embodiment will be described with reference to a flowchart (Steps D10-D70) illustrated in FIG. 49.

The pattern prohibition region generation section 24 collects wiring pattern elements LE of the net for generating a shield pattern, and manages the wiring pattern elements LE for each interconnection layer (Step D10).

In addition, the pattern prohibition region generation section 24 obtains the geometry of each wiring pattern element LE on the same layer (see FIG. 23), and generates a geometry E1 by magnifying the geometry of each wiring pattern element LE (pattern element geometry) by the shield pattern spacing (see FIG. 24) (Step D20).

Furthermore, the pattern prohibition region generation section 24 checks whether there are any elements on the same layer for performing a clearance check around a geometry E1, and generates the element geometry as a geometry F (see FIG. 25) (Step D30).

Then, the pattern prohibition region generation section 24 generates a geometry G by excluding the geometry F from the geometry E1 (see FIG. 26) (Step D40).

In addition, for generated geometries G, the pattern prohibition region generation section 24 sets a net to be shielded or a net group handled as a bundle as an allowed net, registers a prohibition region of a pattern prohibition region type to the prohibition region information 63 (Step D50). The pattern prohibition region generation section 24 further registers a prohibition region element address to the prohibition region information 63, relating it to the net for generating a shield pattern (Step D60). The generated geometry G is maintained as a shield related element address of that net for generating a shield pattern in the net information 61.

Then, the pattern prohibition region generation section 24 registers all geometries G to the prohibition geometry data table (Step D70), and the processing is terminated.

Figure 50:
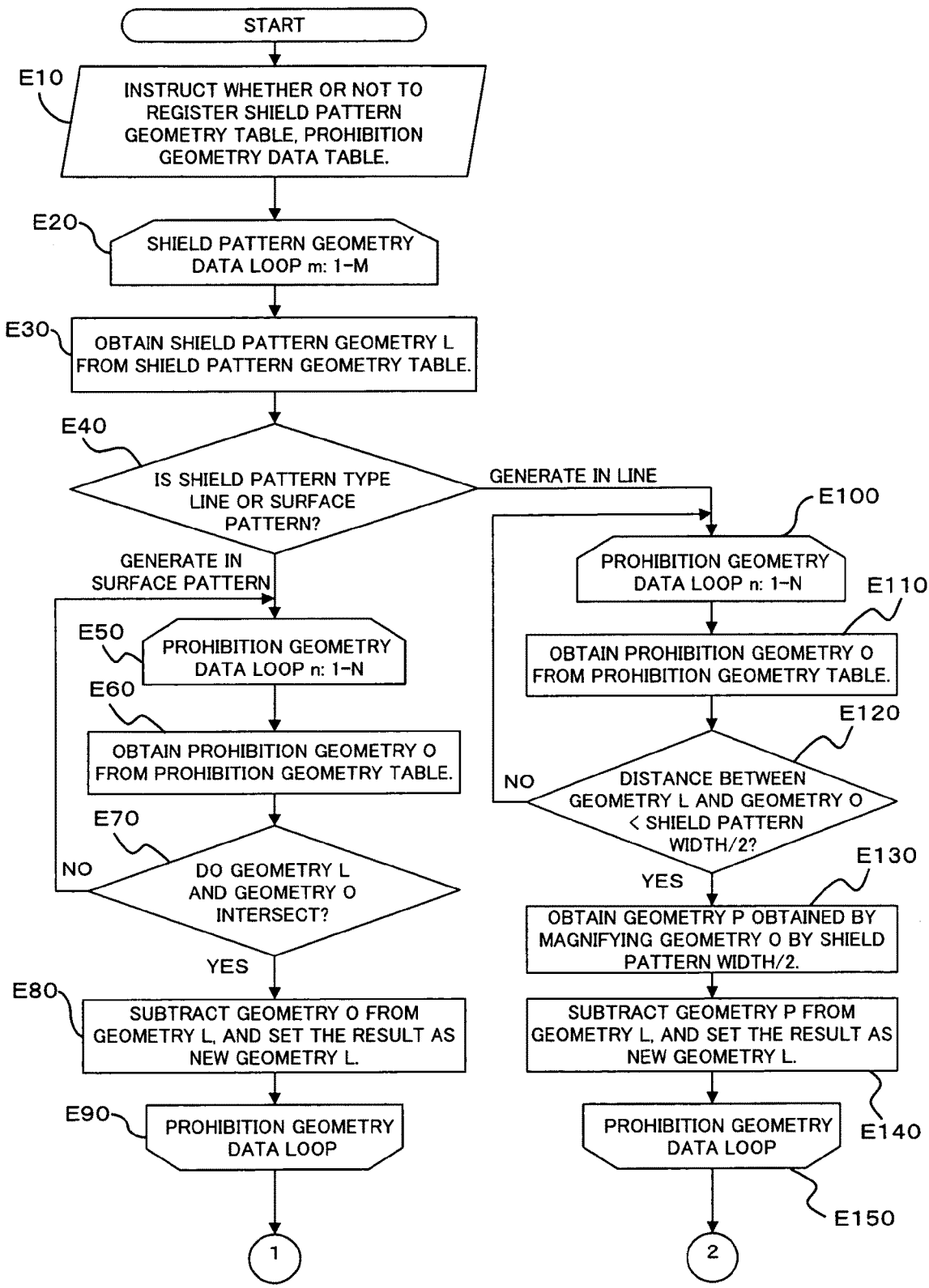
FIG. 50 is a flowchart illustrating a technique for generating a shield pattern geometry in a circuit board design aid apparatus as one embodiment.
Figure 51:
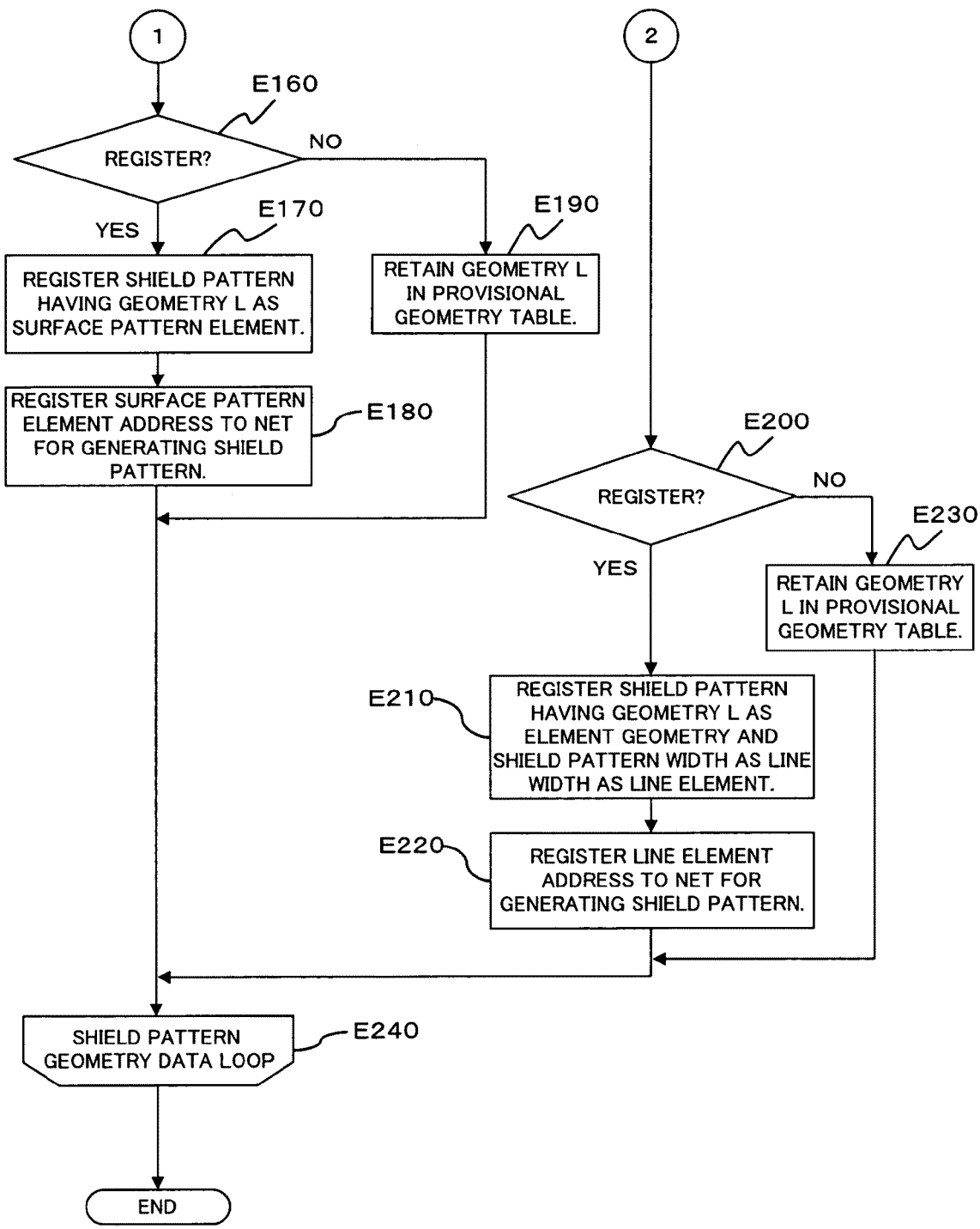
FIG. 51 is a flowchart illustrating a technique for generating a shield pattern geometry in a circuit board design aid apparatus as one embodiment.

Next, a technique for generating a shield pattern in the circuit board design aid apparatus 100 as one embodiment will be described with reference to a flowchart (Steps E10-E240) illustrated in FIG. 50 and FIG. 51. Note that FIG. 50 illustrates processing related to Steps E10-E150, and FIG. 51 illustrates processing related to Steps E160-E240.

Before generating a shield pattern SP, an operator enters (specifies) a shield pattern geometry table (the surface pattern information 68, the line information 66*b*) and a prohibition geometry data table (the prohibition region information 63) that are to be used, and whether registration is required or not using the keyboard 52 and/or the mouse 55 (Step E10).

The shield pattern geometry generation section 25 obtains the number of shield pattern elements SPSE and SPLE M registered in the shield pattern geometry table, and the number of prohibition region geometries N registered in the prohibition region data table.

In addition, in Step E10, the shield pattern geometry generation section 25 also saves the information entered or the information obtained in predetermined storage regions in the RAM 53 or the storing section 60.

Then, an initial value of 1 is set to a variable "m" (m is a natural number), and the processing in the following Steps E30-E230 is repeated while incrementing "m" until m=M (shield pattern geometry data loop; Step E20-E240).

The shield pattern geometry generation section 25 obtains a geometry (shield pattern element geometry) from the shield pattern geometry table specified in Step E10, and sets it as a geometry L (Step E30).

The shield pattern geometry generation section 25 checks whether the type of this shield pattern type is a surface pattern or a line pattern (line) (Step E40), and performs the processing in the prohibition geometry data loop E50-E90 when the shield patterns a surface pattern (see "Generate in surface pattern" route in Step E40).

That is, after an initial value of 1 is set to a variable "n" (n is a natural number), the processing in the following Steps E60-E80 is repeated while incrementing "n" until n=N (shield pattern geometry data loop; Steps E20-E240).

The shield pattern geometry generation section 25 obtains the n$^{th}$ prohibition region geometry from the prohibition region data table as a geometry (prohibition region geometry) O (Step E60), and determines whether or not the geometry L and the geometry O intersect (Step E70). Note that this determination as of whether nor not the two regions (geometries) intersect (overlap) can be made using known techniques in various manners, and any detailed description thereof will be omitted.

When the geometry L and the geometry O intersect (see the "YES" route in Step E70), the geometry O is subtracted from the geometry L, and the resulting geometry is set as a new geometry L (Step E80). Alternatively, when the geometry L and the geometry O do not intersect (see the "NO" route in Step E70), the flow goes to Step E50 wherein the value "n" is incremented (n=n+1) and the flow goes to the next geometry O.

Thereafter, the shield pattern geometry generation section increments the value "n" (n=n+1) to go to the next geometry O, and repeats the processing in the above-described Steps E60-E80 is repeated until n=N (prohibition geometry data loop; Steps E50-E90).

After the prohibition geometry data loop (Steps E50-E90) ends, that is, after a geometry L is checked to determine whether or not it overlaps to any geometries in all prohibition regions registered in the prohibition geometry table and any overlapping portions are removed from the geometry L, the shield pattern geometry generation section 25 then checks the instruction whether registration is required or not that is specified in Step E10 (Step E160).

When registration is instructed (see the "YES" route in Step E160), the shield pattern having the geometry L as a shield pattern element geometry is registered as a surface pattern element in the surface pattern information 68 (Step E170).

Then, the shield pattern geometry generation section 25 registers the address of the storage location of this surface pattern element as a shield related address in the net information 61 relating it to the net for generating a shield pattern (Step E180).

Alternatively, when no register registration is instructed (see the "NO" route in Step E160), the geometry L is saved in temporary geometry table (Step E190).

In contrast, the shield pattern type is determined as a line pattern (see "Generate in line" route in Step E40), the shield pattern geometry generation section 25 performs the processing in the prohibition geometry data loop E110-E230.

That is, after an initial value of 1 is set to a variable "n" (n is a natural number), the processing in the following Steps E110-E140 is repeated while incrementing "n" until n=N (prohibition geometry data loop; Steps E100-E150).

The shield pattern geometry generation section 25 obtains the n$^{th}$ prohibition region geometry from the prohibition region data table as a geometry (prohibition region geometry) O (Step E110), and determines whether or not the distance between the geometry L and the geometry O is less then the value obtained by dividing the shield pattern width "w" by two (w/2) (Step E120).

When the distance between the geometry L and the geometry O is less then the value obtained by dividing the shield pattern width "w" by two (w/2) (see the "YES" route in Step E120), the shield pattern geometry generation section 25 obtains a geometry, as a geometry P, by magnifying the geometry O by the value obtained by dividing the shield pattern width "w" by two (Step E130).

In addition, the shield pattern geometry generation section 25 subtracts the geometry P from the geometry L, and the resulting geometry after subtraction as a new geometry L (Step E140). Alternatively, the distance between the geometry L and the geometry O is equal to or greater than the value obtained by dividing the shield pattern width "w" by two (w/2) (see the "NO" route in Step E120), the flow goes to Step E100 wherein the value "n" is incremented (n=n+1) and the flow goes to the next geometry O.

Thereafter, the shield pattern geometry generation section increments the value "n" (n=n+1) to go to the next geometry O, and repeats the processing in the above-described Steps E110-E150 is repeated until n=N (prohibition geometry data loop; Steps E100-E150).

The shield pattern geometry generation section 25 then checks the instruction whether registration is required or not that is specified in Step E10 (Step E200).

When registration is instructed (see the "YES" route in Step E200), the shield pattern having the geometry L as a shield pattern element geometry and the line width thereof as a shield pattern width "w" is registered as a line pattern element (line element) in the line pattern information 68 (Step E210).

In addition, the shield pattern geometry generation section 25 registers the address of the storage location of this line pattern element as a shield related address in the net information 61 relating it to the net for generating a shield pattern (Step E220).

Alternatively, when no register registration is instructed (see the "NO" route in Step E200), the geometry L is saved in temporary geometry table (Step E230).

Thereafter, the shield pattern geometry generation section increments the value "n" (n=n+1) to go to the next geometry O, for example, and repeats the processing in the above-described Steps E30-E230 is repeated until n=N (shield pattern geometry data loop; Steps E20-E240).

Figure 52:
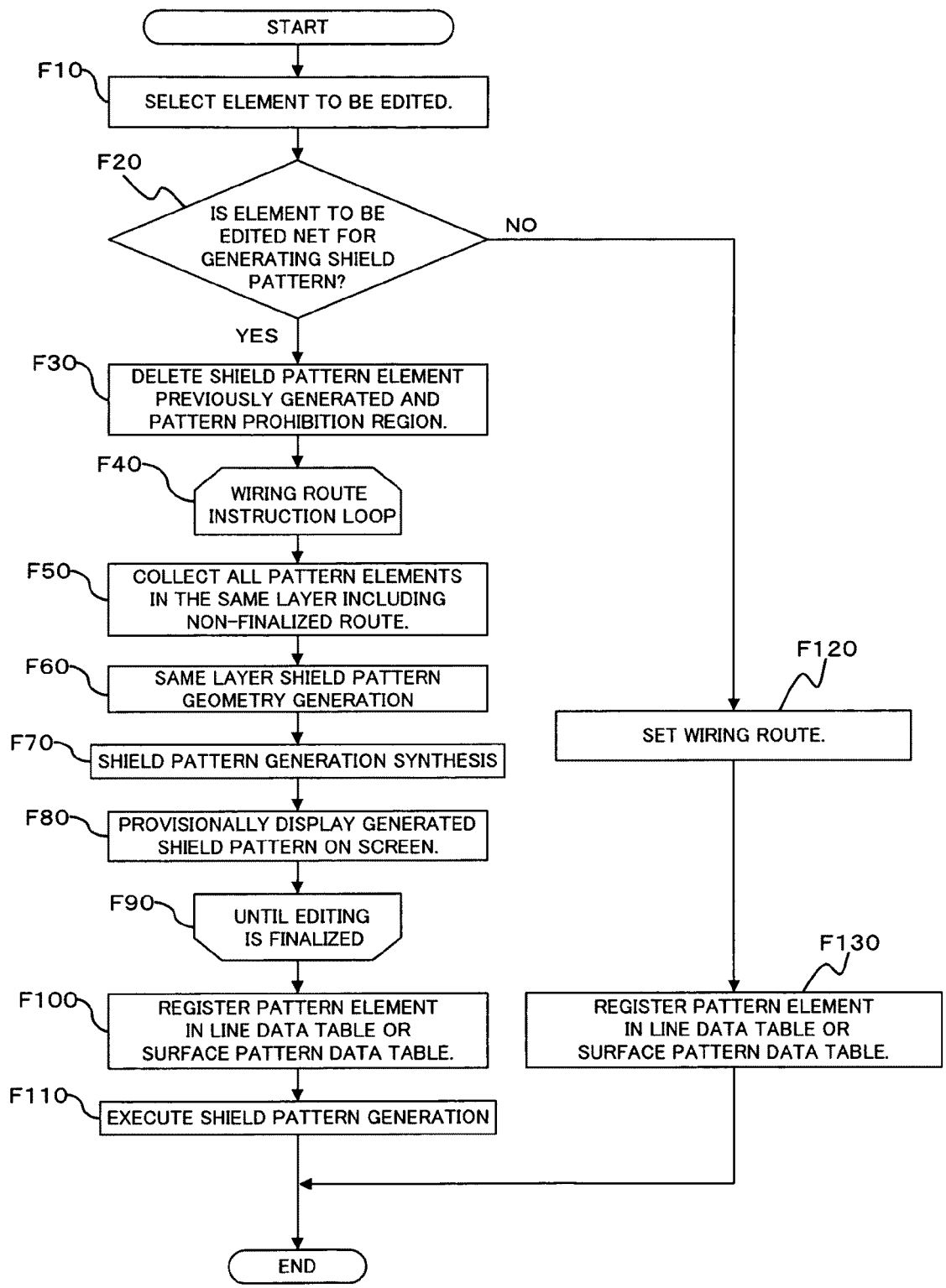
FIG. 52 is a flowchart illustrating a technique for generating a shield pattern related to editing of a wiring pattern according to a surface pattern in a circuit board design aid apparatus as one embodiment.

Next, a generation of a shield pattern related to editing of a wiring pattern L in the circuit board design aid apparatus 100 as one embodiment will be described with reference to a flowchart (Steps F10-F130) illustrated in FIG. 52.

In the circuit board design aid apparatus 100, a wiring pattern L that is generated can be edited by the wiring the pattern editing command section 30. Upon editing such a wiring pattern L, the operator selects an element to be edited using the keyboard 52 and/or the mouse 55 while viewing the display 51 (Step F10).

The shield pattern generation execution section 20 checks whether or not the net of the selected element to be edited is a net for which a shield pattern is to be generated by looking up the pattern information 62 (Step F20).

When the net of the selected element to be edited is a net for which a shield pattern is to be generated (see the "YES" route in Step F20), shield pattern elements and pattern prohibition regions for that net, which are previously generated, are deleted from the line information 66b, the surface pattern information 68, and the prohibition region information 63 (Step F30).

Then, the processing in the following Steps F50-F80 is repeated until editing by the wiring pattern editing command section 30 is completed (editing is finalized) (wiring route instruction loop; Steps F40-F90).

That is, the shield pattern generation execution section 20 collects all of the wiring pattern elements LE on the same layer as the edited wiring pattern element LE, including routes that have not been fixed (Step F50), and generates a same layer shield pattern by the same layer shield pattern element generation section 21 (Step F60), and generates a shield pattern by the shield pattern geometry generation section 25 based on that generated same layer shield pattern (Step F70). In addition, the geometry of the generated shield pattern (shield pattern geometry) is displayed on the display 51 (Step F80).

For example, when the editing is fixed by an operator who makes a input for fixing the editing from the keyboard 52 or the mouse 55, the shield pattern geometry generation section 25 registers the edited wiring pattern element LE to the line information 66a and 66b (line data table) or the surface pattern information 68 (surface pattern data table) (Step F100).

Then, the shield pattern generation execution section 20 performs processing, such as merger of the generated shield pattern geometry to complete the shield pattern (Step F110), and the processing is terminated.

On the other hand, when the net of the selected element to be edited is not the net for which a shield pattern is to be generated (see the "NO" route in Step F20), the wiring pattern editing command section 30 edits and sets a route using the function of the wiring the pattern editing command section 30 (Step F120), the edited wiring pattern element LE is registered to the line information 66a and 66b or the surface pattern information 68 (Step F130) and the processing is terminated.

Figure 53:
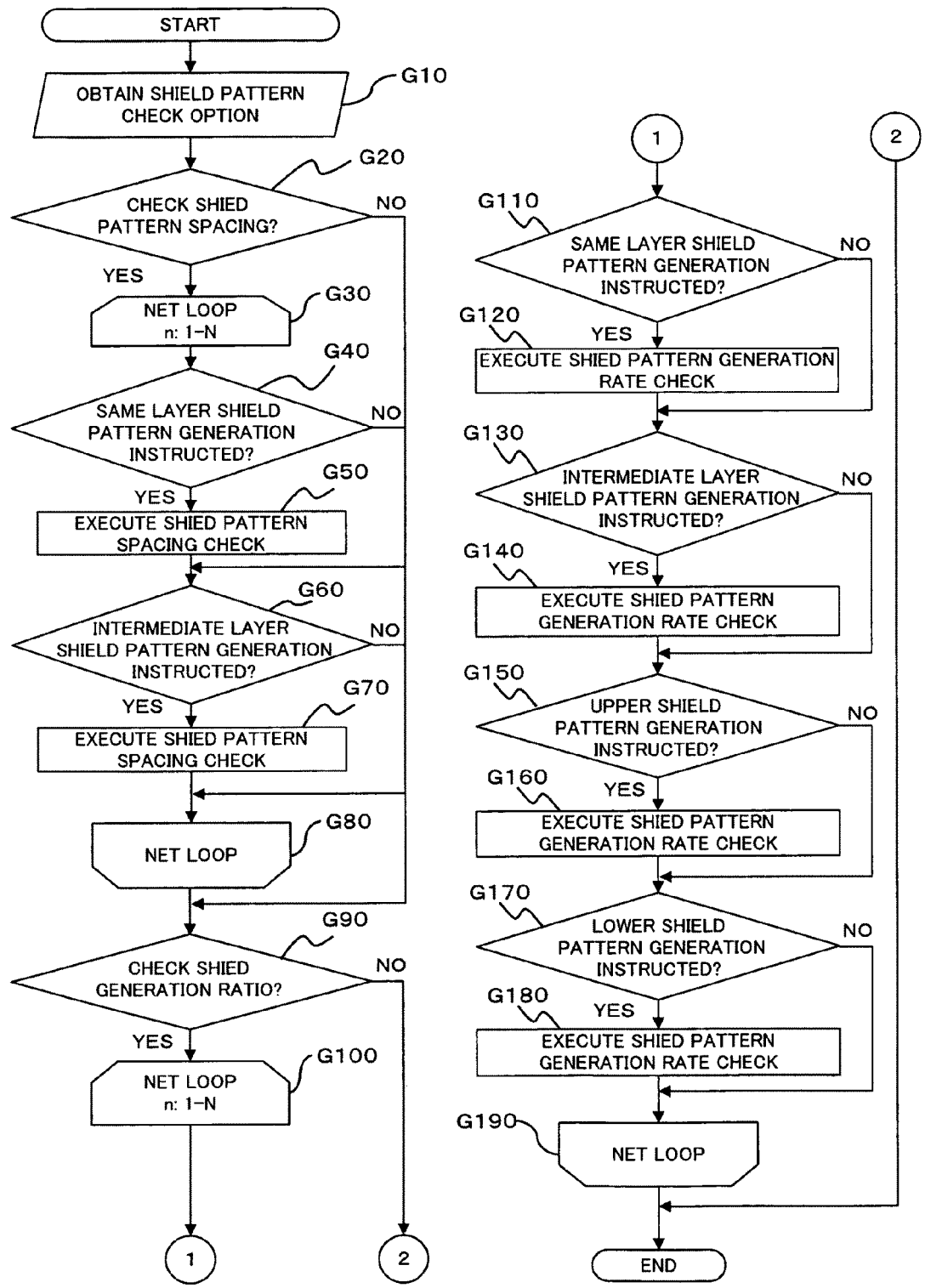
FIG. 53 is a flowchart illustrating an example of a technique for evaluating a shield pattern in a circuit board design assistance apparatus as one embodiment.
Figure 54:
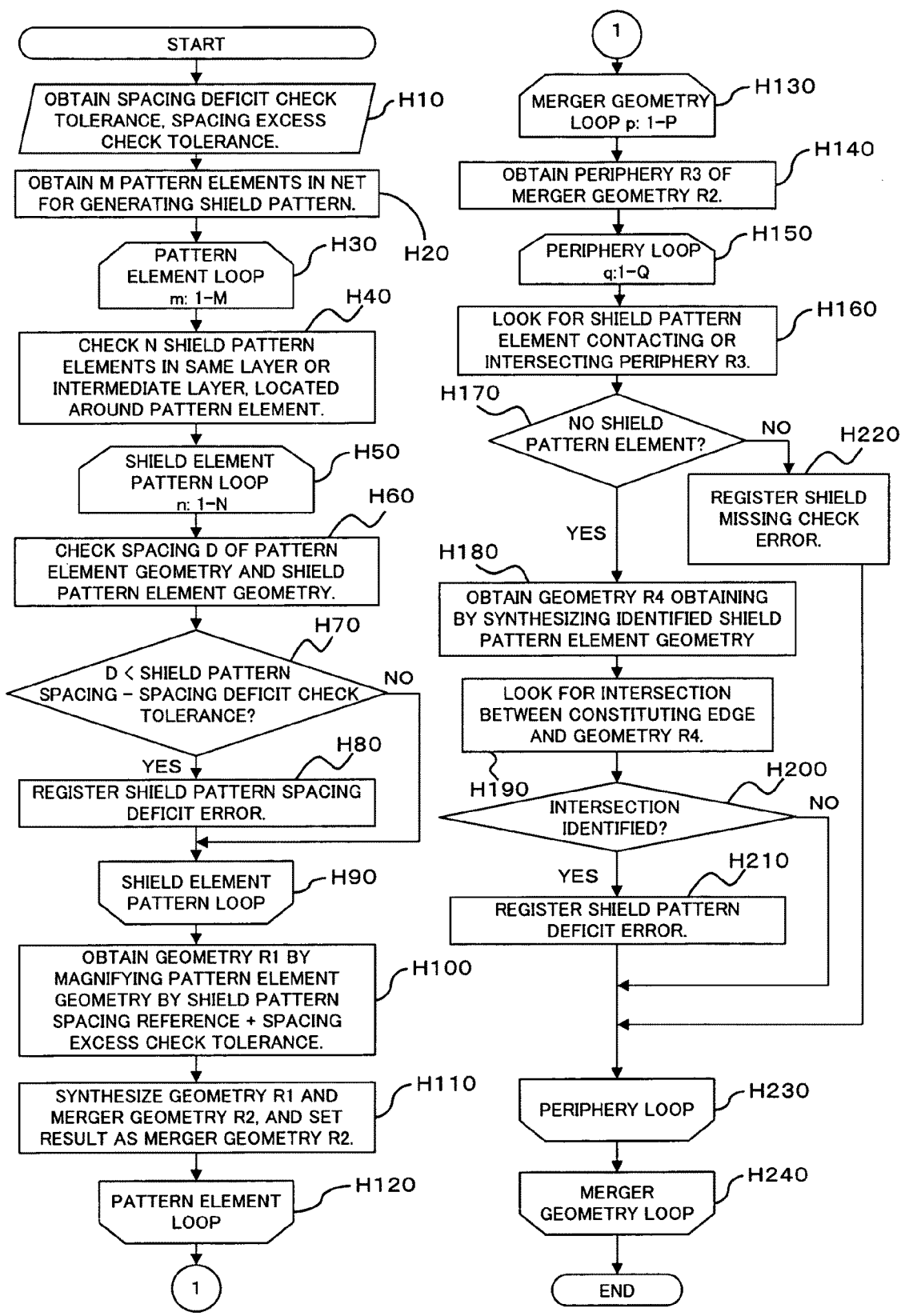
FIG. 54 is a flowchart illustrating an example of a technique for a shield pattern spacing check in a circuit board design assistance apparatus as one embodiment.

Next, an example of an evaluation technique of a shield pattern in the circuit board design aid apparatus 100 as one embodiment will be described with reference to a flowchart (Steps G10-G190) illustrated in FIG. 53.

For evaluating a shield pattern by the shield pattern check section 40, the operator enters various parameters in advance by setting various check options on the shield pattern check command control screen 101 depicted in FIG. 44, using the keyboard 52 and/or the mouse 55 (Step G10).

For example, the operator sets, on this shield pattern check command control screen 101, the number of nets to be checked (N), whether or not a shield pattern spacing check is required, the spacing deficit check tolerance, the spacing excess check tolerance, whether or not a shield pattern generation rate check is required, and the shield pattern minimum allowable generation ratio.

Note that the shield pattern check section 40 is adapted to obtain the number N of selected nets to be checked on this shield pattern check command control screen 101.

The shield pattern check section 40 determines whether or not a shield pattern spacing check is to be performed based on the information entered through the shield pattern check command control screen 101 (Step G20).

Here, when shield pattern spacing check is to be performed (see the "YES" route in Step G20), the shield pattern check section 40 set an initial value of 1 to a variable "n" (n is a natural number) and repeats the processing of the following Steps G40-G70 by incrementing n until n=N (net loop; Steps G30-G80).

More specifically, the shield pattern check section 40 checks whether or not generation of a same layer shield pattern is instructed by looking up the net information 61 or the pattern information 62 (Step G40). When generation of a same layer shield pattern is instructed (see the "YES" route in Step G40), the shield pattern check section 40 performs a shield pattern spacing check by the shield pattern spacing check execution section 41 on this same layer shield pattern (Step G50).

After the shield pattern spacing check on the same layer shield pattern is performed, or when generation of a same layer shield pattern is not instructed (see the "NO" route in Step G40), the shield pattern check section 40 checks whether or not generation of an intermediate layer shield pattern is instructed by looking up the net information 61 or the pattern information 62 (Step G60). When generation of an intermediate layer shield pattern is instructed (see the "YES" route in Step G60), a shield pattern spacing check by the shield pattern spacing check execution section 41 is performed on this intermediate layer shield pattern (Step G70).

After the shield pattern spacing check on the intermediate layer shield pattern is performed, or when generation of an intermediate layer shield pattern is not instructed (see the "NO" route in Step G60), the shield pattern check section 40 increments the value "n" (n=n+1) to go to the next net. Thereafter, the processing of the above-described Steps G40-G70 is repeated until n=N (net loop; Steps G30-G80).

After this net loop ends, or when no shield pattern spacing check is to be performed (see the "NO" route in Step G20), the shield pattern check section 40 determines whether or not shield generation rate check is to be performed based on the information entered through the shield pattern check command control screen 101 (Step G90).

Here, when shield generation rate check is to be performed (see the "YES" route in Step G90), the shield pattern check section 110 set an initial value of 1 to a variable "n" (n is a natural number) and repeats the processing of the following Steps G110-G180 by incrementing n until n=N (net loop; Steps G100-G190).

More specifically, the shield pattern check section 40 checks whether or not generation of a same layer shield pattern is instructed by looking up the net information 61 or the pattern information 62 (Step G110). When generation of a same layer shield pattern is instructed (see the "YES" route in Step G110), the shield pattern check section 40 performs a shield generation rate check by the shield pattern spacing check execution section 42 on this same layer shield pattern (Step G120).

After the shield pattern generation rate check is performed on the same layer shield pattern, or when generation of a same layer shield pattern is not instructed (see the "NO" route in Step G110), the shield pattern check section 40 checks whether or not generation of an intermediate layer shield pattern is instructed by looking up the net information 61 or the pattern information 62 (Step G130).

Here, when generation of an intermediate layer shield pattern is instructed (see the "YES" route in Step G130), a shield pattern generation rate check by the shield pattern generation rate check execution section 42 is performed on this intermediate layer shield pattern (Step G140).

After the shield pattern generation rate check is performed on the intermediate layer shield pattern, or when generation of a intermediate layer shield pattern is not instructed (see the "NO" route in Step G130), the shield pattern check section 40 checks whether or not generation of an upper layer shield pattern is instructed by looking up the net information 61 or the pattern information 62 (Step G150).

Then, when generation of an upper layer shield pattern is instructed (see the "YES" route in Step G150), a shield pattern generation rate check by the shield pattern generation rate check execution section 42 is performed on this upper layer shield pattern (Step G160).

After the shield pattern generation rate check is performed on the upper layer shield pattern, or when generation of a upper layer shield pattern is not instructed (see the "NO" route in Step G150), the shield pattern check section 40 checks whether or not generation of a lower layer shield pattern is instructed by looking up the net information 61 or the pattern information 62 (Step G170).

Then, when generation of a lower layer shield pattern is instructed (see the "YES" route in Step G170), a shield pattern generation rate check by the shield pattern generation rate check execution section 42 is performed on this lower layer shield pattern (Step G180).

After the shield pattern spacing check on the lower layer shield pattern is performed, or when generation of an lower layer shield pattern is not instructed (see the "NO" route in Step G170), the shield pattern check section 110 increments the value "n" (n=n+1) to go to the next net. Thereafter, the processing of the above-described Steps G110-G180 is repeated until n=N (net loop; Steps G110-G190). When the all of the nets are processed, the processing is terminated.

The processing is also terminated when no shield pattern generation rate check is performed (see the "NO" route in Step G90).

Next, a technique for shield pattern spacing check in the circuit board design aid apparatus 100 as one embodiment will be described with reference to a flowchart (Steps H10-H240) with reference to FIG. 55 to FIG. 57.

Figure 55:
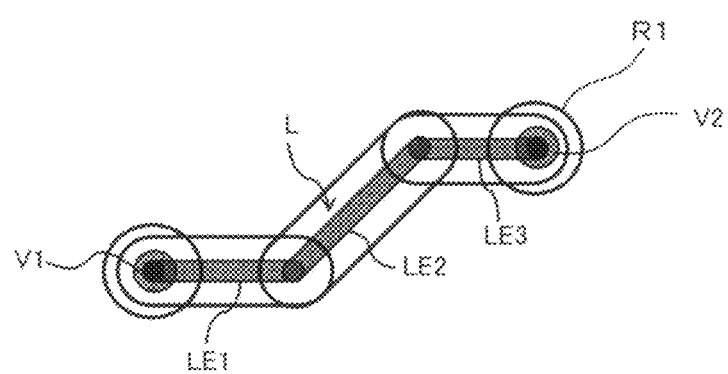
FIG. 55 is a diagram illustrating a technique for checking a spacing in a circuit board design aid apparatus as one embodiment.
Figure 56:
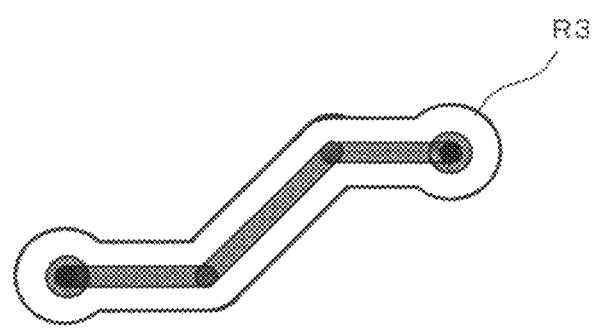
FIG. 56 is a diagram illustrating a technique for checking a spacing in a circuit board design aid apparatus as one embodiment.
Figure 57:
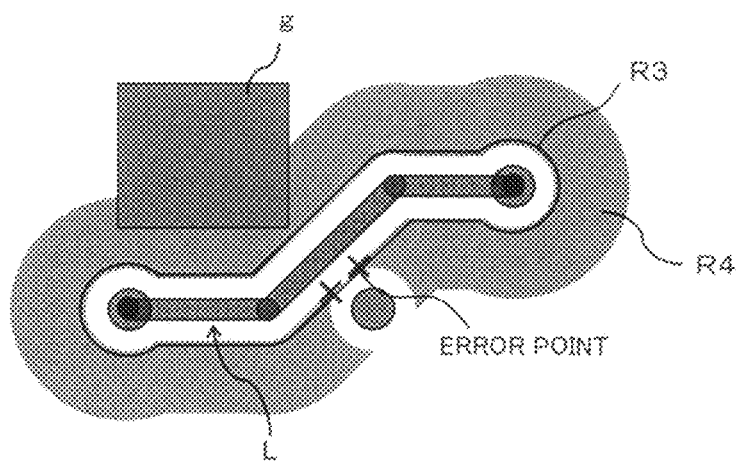
FIG. 57 is a diagram illustrating a technique for checking a spacing in a circuit board design aid apparatus as one embodiment.

Note that FIG. 55 to FIG. 57 are diagrams illustrating a technique for a spacing check in the circuit board design aid apparatus 100 as one embodiment. FIG. 55 is a diagram illustrating an example of the enlarged geometry R1 generated based on the wiring pattern element LE. FIG. 56 is a diagram illustrating an example of a periphery geometry R2 generated based on the enlarged geometry R1. FIG. 57 is a diagram illustrating an example of detected errors therein.

The shield pattern spacing check execution section 41 obtains the spacing deficit check tolerance and the spacing excess check tolerance based on the information entered through the shield pattern check command control screen 101 (see Step G10 in the flowchart depicted in FIG. 53), for example (Step H10).

In addition, the shield pattern spacing check execution section 41 captures M pattern elements of a net for generating a shield pattern by looking up the net information 61 or the pattern information 62 (Step H20).

Then, the shield pattern spacing check execution section 41 sets an initial value of 1 to a variable "m" (m is a natural number), and the processing in the following Steps H40-H110 is repeated while incrementing "m" until m=M (pattern element loop; Steps H30-H120).

That is, the shield pattern spacing check execution section 41 check whether there are any elements in same layer shield pattern or intermediate layer shield pattern that are present around the wiring pattern element LE. In addition, the number of identified shield pattern element is set to N, which is stored in a predetermined storing region, such as the RAM 53, the storing section 60, or the like (Step H40).

Then, the shield pattern spacing check execution section 41 sets an initial value of 1 to a variable "n" (n is a natural number), and the processing in the following Steps H60-H80 is repeated while incrementing "n" until n=N (shield pattern element loop; Steps H50-H90).

More specifically, the spacing D between the $m^{th}$ pattern element geometry and the geometry of $n^{th}$ shield pattern element is determined (Step H60), and checks whether or not this spacing D is smaller than the value of (shield pattern spacing–spacing deficit check error value) (Step H70).

Here, when the spacing D is smaller than the value of (shield pattern spacing–spacing deficit check error value) (see the "YES" route in Step H70), the shield pattern spacing check execution section 41 determines as a shield pattern spacing error and registers information related to that error to a predetermined region (error information storage section) in the storing section 60 or the like (Step H80).

After the information related to this error is registered, or when the spacing D is equal to or greater than the value of (shield pattern spacing–spacing deficit check error value) (see the "YES" route in Step H70), the shield pattern spacing check execution section 41 increments the value "n" (n=n+1) to go to the next shield pattern element, and repeats the processing in the above-described Steps H60-H80 until n=N (shield pattern element loop; Steps H50-H90).

After spacing check with the pattern element geometry is completed for all of the shield pattern elements, the shield pattern spacing check execution section 41 generates a geometry R1 by magnifying $m^{th}$ pattern element geometry by the value of (shield pattern reference spacing value+spacing excess check tolerance value) based on the reference information 65 and the spacing excess check tolerance value, as depicted in FIG. 55 (Step H100).

In addition, the shield pattern spacing check execution section 41 generates a new merged geometry R2 by merging the geometry R1 to the merged geometry R2 (Step H110). At the first loop (m=1) wherein no merged geometry R2 is registered, the geometry R2 equals the geometry R1.

Then, the shield pattern spacing check execution section 41 increments m (m=m+1) to go to the next pattern element, and repeats the processing in the above-described Steps H40-H110 until m=M (pattern element loop; Steps H30-H120).

After the shield pattern spacing check execution section 41 generates the merged geometry R2 for all of the pattern elements, the shield pattern spacing check execution section 41 sets an initial value 1 to a variable p (p is a natural number), and repeats the processing of the following Steps H140-H230 by incrementing n until p=P (merged geometry loop; Steps H130-H240).

That is, the shield pattern spacing check execution section 41 obtains a geometry R3 of each periphery of the geometry R2 generated in the pattern element loop (Steps H30-H120), as depicted in FIG. 56 (Step H140).

Then, the shield pattern spacing check execution section 41 sets an initial value of 1 to a variable "q" (q is a natural number), and the processing in the following Steps H160-H220 is repeated while incrementing "m" until q=Q (pattern element loop; Steps H150-H230).

That is, the shield pattern spacing check execution section 41 checks whether there are any shield pattern elements that contact or intersect with the periphery R3 by looking up the net information 61 or the pattern information 62 (Step H160).

More specifically, the shield pattern spacing check execution section 41 checks whether or the number of shield pattern elements that contact or intersect with the periphery R3 is zero (Step H170). The shield pattern spacing check execution section 41 determines as a shield omit check error when the number of shield pattern elements that contact or intersect with the periphery R3 is zero (see the "YES" route in Step H170), and registers information related to that error to a predetermined region (error information storage section) in the storing section 60 or the like (Step H220).

Thereafter, the shield pattern spacing check execution section 41 increments q (q=q+1) and repeats until q=Q before returning to Step H160 (Step H230).

In addition, when the number of shield pattern elements that contact or intersect with the periphery R3 is not zero (see the "NO" route in Step H170), the shield pattern spacing check execution section 41 generates a new geometry R4 by merging the geometry of the detected shield pattern element to geometry R4, as depicted in FIG. 57 (Step H180). Note that no geometry R4 is registered when a shield pattern element is detected for the first time, the geometry of the shield pattern element that is detected for the first time equals the geometry R4.

Then, the shield pattern spacing check execution section 41 tries to find a point of intersection between the periphery (constituting edges) R3 and the geometry R4 (Step H190), and checks whether or not one is identified (Step H200).

When a point of intersection is identified, the shield pattern spacing check execution section 41 determines as a shield pattern deficit error, specify that point of intersection as an error point (see "error point" in FIG. 57), and registers information related to that error to a predetermined region (error information storage section) in the storing section 60 or the like (Step H210).

After registering the information related to this error, or when no point of intersection is identified (see the "NO" route in Step H200), the shield pattern spacing check execution section 41 increments the value "q" (q=q+1) to go to the next periphery, and repeats the processing in the above-described Steps H160-H210 until q=Q (periphery loop; Steps H150-H230).

After all peripheries of the $p^{th}$ merged geometry R2 are checked, the shield pattern spacing check execution section 41 increments the value "p" (p=p+1) to go to the next merged geometry, and repeats the processing in the above-described Steps H140-H230 until p=P (merged geometry loop; Steps H130-H240). Then, the processing is terminated after all of the merged geometry is checked.

Figure 58:
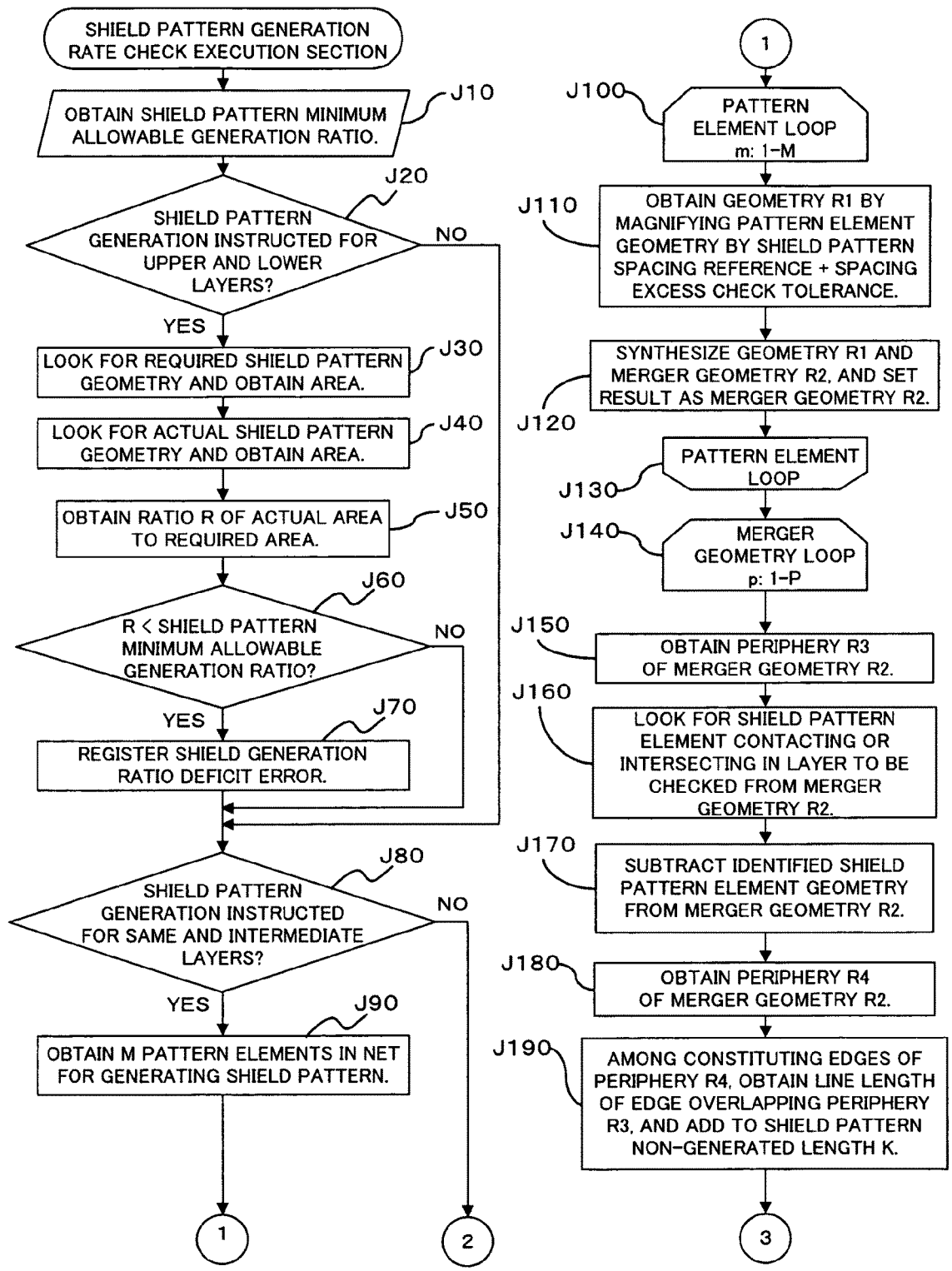
FIG. 58 is a flowchart illustrating a technique for checking a shield pattern generation rate in a circuit board design assistance apparatus as one embodiment.
Figure 59:
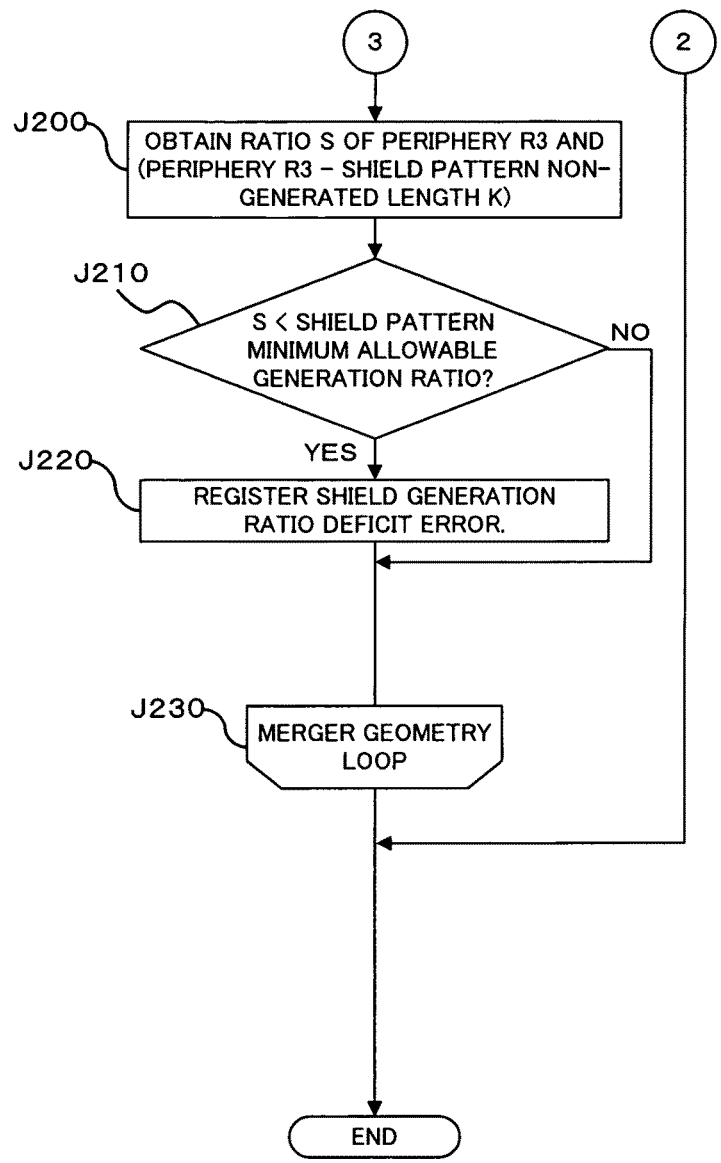
FIG. 59 is a flowchart illustrating a technique for checking a shield pattern generation rate in a circuit board design assistance apparatus as one embodiment.

Next, a technique for shield pattern generation rate check in the circuit board design aid apparatus 100 as one embodiment of the present invention will be described with reference to a flowchart (Steps J10-J230) depicted in FIG. 58 and FIG. 59 with reference to FIG. 55 and FIG. 56. Note that FIG. 58 illustrates processing related to Steps J10-J190, and FIG. 59 illustrates processing related to Steps J200-J230.

The shield pattern generation rate check execution section 42 obtains the shield pattern minimum allowable generation ratio (Step J10) based on the information entered through the shield pattern check command control screen 101 (see Step G10 in the flowchart depicted in FIG. 53), for example, or determines whether or not generation of a shield pattern to a upper or lower layer, same layer, or intermediate layer is instructed based on the information provided through the net selection screen 511 and the like.

Then, the shield pattern generation rate check execution section 42 checks whether or not generation of a shield pattern to an upper or lower layer is instructed (Step J20).

Here, when generation of a top shield pattern or bottom shield pattern is instructed (see the "YES" route in Step J20), the shield pattern generation rate check execution section 42 checks the geometry (geometry A2, B2, C1) of a basic shield pattern element generated by the same layer shield pattern element generation section 21, the top and bottom layer shield pattern element generation section 22, and the intermediate layer shield pattern element generation section 23, i.e., the required shield pattern geometry to determine the area thereof (Step J30), and store it to a predetermined region in the RAM 53 or the storing section 60.

Next, the shield pattern generation rate check execution section 42 checks the geometry of the shield pattern SP generated by the shield pattern geometry generation section 25 (actual shield pattern geometry) to determine the area thereof (Step J40), and store it to a predetermined region in the RAM 53 or the storing section 60.

Then, the shield pattern generation rate check execution section 42 determines the ratio R of the area of the actual shield pattern SP with respect to the area of required shield pattern based on the information (Step J50).

The shield pattern generation rate check execution section 42 compares this ratio R with the shield pattern minimum allowable generation ratio obtained at Step J10 (Step J60). When the ratio R is smaller than the shield pattern minimum allowable generation ratio (see the "YES" route in Step J60), the shield pattern generation rate check execution section 42 determines that the area of the shield pattern is not sufficient (shield generation ratio deficit error) and registers information related to that error to a predetermined region (error information storage section) in the storing section 60 or the like (Step J70).

In addition, the shield pattern generation rate check execution section 42 determines whether or not generation of a shield pattern for the same layer and intermediate layer is instructed based on the information provided through the net selection screen 511 and the like (Step J80).

When the ratio R is greater than the shield pattern minimum allowable generation ratio (see the "NO" route in Step J60), the flow goes to Step J80.

When generation of a shield pattern for the same layer and intermediate layer is not instructed (see the "NO" route in Step J80), the processing is terminated.

When generation of a shield pattern for the same layer and intermediate layer is instructed (see the "YES" route in Step J80), the shield pattern generation rate check execution section 42 captures M pattern elements of the net for generating a shield pattern (Step J90).

Then, the shield pattern generation rate check execution section 42 sets an initial value of 1 to a variable "m" (m is a natural number), and the processing in the following Steps J110-J130 is repeated while incrementing "m" until m=M (pattern element loop; Steps J100-J130).

That is, the shield pattern generation rate check execution section 42 generates a geometry R1 by magnifying the $m^{th}$ pattern element geometry by the value of (shield pattern reference spacing value+spacing excess check tolerance value) based on the reference information 65 and the spacing excess check tolerance value, as depicted in FIG. 55 (Step J110).

In addition, the shield pattern generation rate check execution section 42 generates a new merged geometry R2 by merging the geometry R1 to the merged geometry R2 (Step J120). At the first loop (m=1) wherein no merged geometry R2 is registered, the geometry R2 equals the geometry R1.

Then, the shield pattern generation rate check execution section 42 increments m (m=m+1) to go to the next pattern element, and repeats the processing in the above-described Steps J110-J120 until m=M (pattern element loop; Step J100-J130).

After the shield pattern generation rate check execution section 42 generates the merged geometry R2 for all of the pattern elements, the shield pattern generation rate check execution section 42 sets an initial value 1 to a variable p (p is a natural number), and repeats the processing of the following Steps J150-J220 by incrementing n until p=P (merged geometry loop; Steps J140-J230).

That is, the shield pattern generation rate check execution section 42 obtains a geometry R3 of each periphery of the geometry R2 generated in the $p^{th}$ pattern element loop (Steps J100-J130), as depicted in FIG. 56 (Step J150).

Then, the shield pattern generation rate check execution section 42 checks whether there are any shield patterns that contact or intersect with the merged geometry R2 on the layer to be checked (Step J160), and subtracts from the merged geometry R2, the overlapping portion of the shield pattern element geometry detected in Step J160 (Step J170).

In addition, the shield pattern generation rate check execution section 42 determines the periphery R4 of the merged geometry R2 after the subtraction (Step J180), and determines the line length of any edge(s) overlapping with the periphery R3 from the constituting edge of the periphery R4, and add the results to a shield pattern non-generated length K which is a variable having an initial value of 0 (Step J190).

Then, the shield pattern generation rate check execution section 42 calculates the ratio S between the periphery R3 and (periphery R3−shield pattern non-generated length K) (Step J200), and compares this ratio S with the shield pattern minimum allowable generation ratio (Step J210).

Here, when the ratio S is smaller than the shield pattern minimum allowable generation ratio (see the "YES" route in Step J210), the shield pattern generation rate check execution section 42 determines as a shield pattern generation ratio deficit error and registers information related to that error to a predetermined region (error information storage section) in the storing section 60 or the like (Step J220).

After the information related to this error is registered, or when the ratio S is equal to or greater than the shield pattern minimum allowable generation ratio (see the "NO" route in Step J210), the shield pattern generation rate check execution section 42 increments the value "p" (p=p+1) to go to the next merged geometry, and repeats the processing in the above-described Steps J150-J220 until p=P (merged geometry loop; Steps J140-J230). Then, the processing is terminated after all of the merged geometry is checked.

Figure 60:
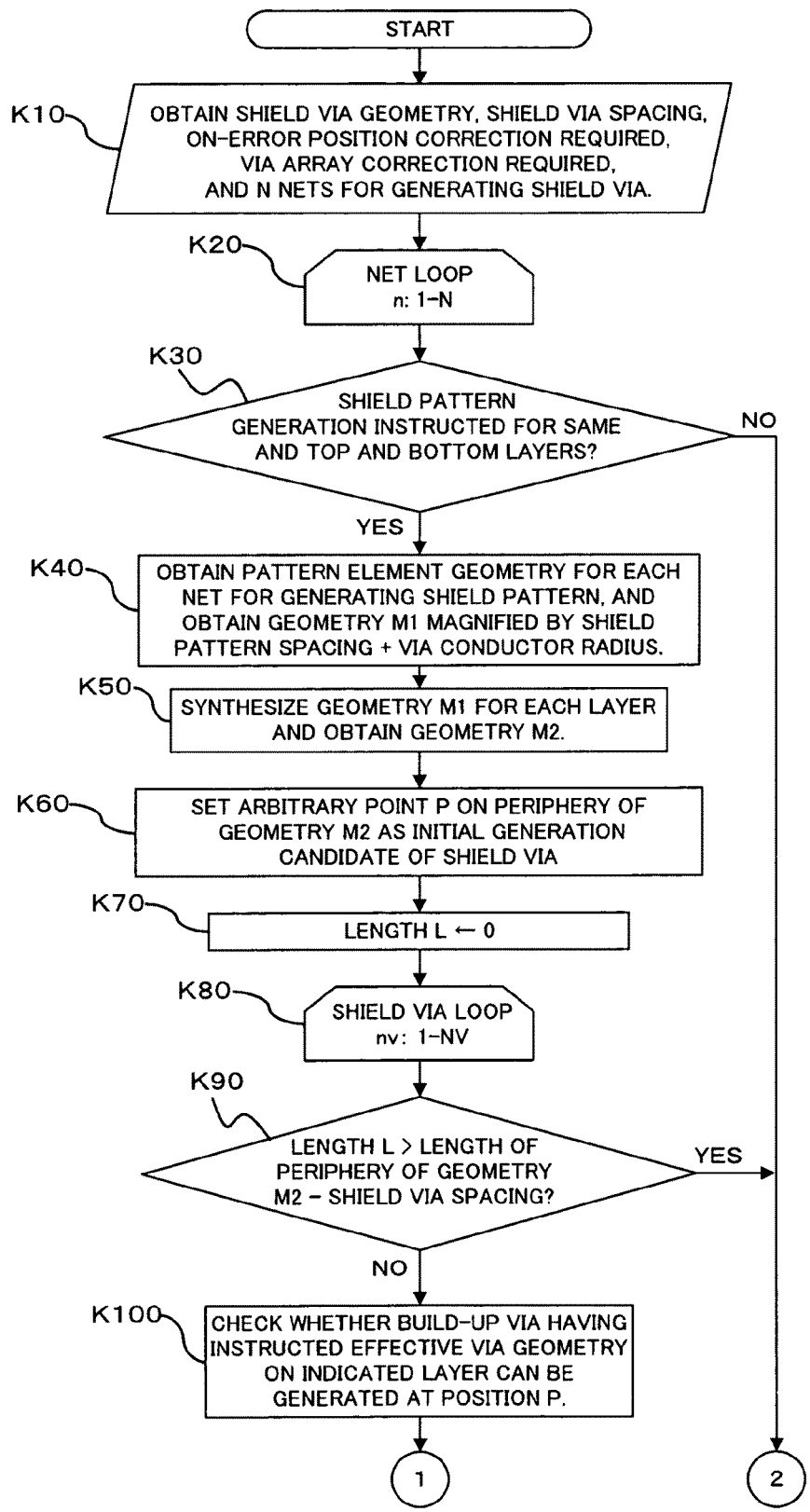
FIG. 60 is a flowchart illustrating a method for generating a shield via in a circuit board design aid apparatus as one embodiment.
Figure 61:
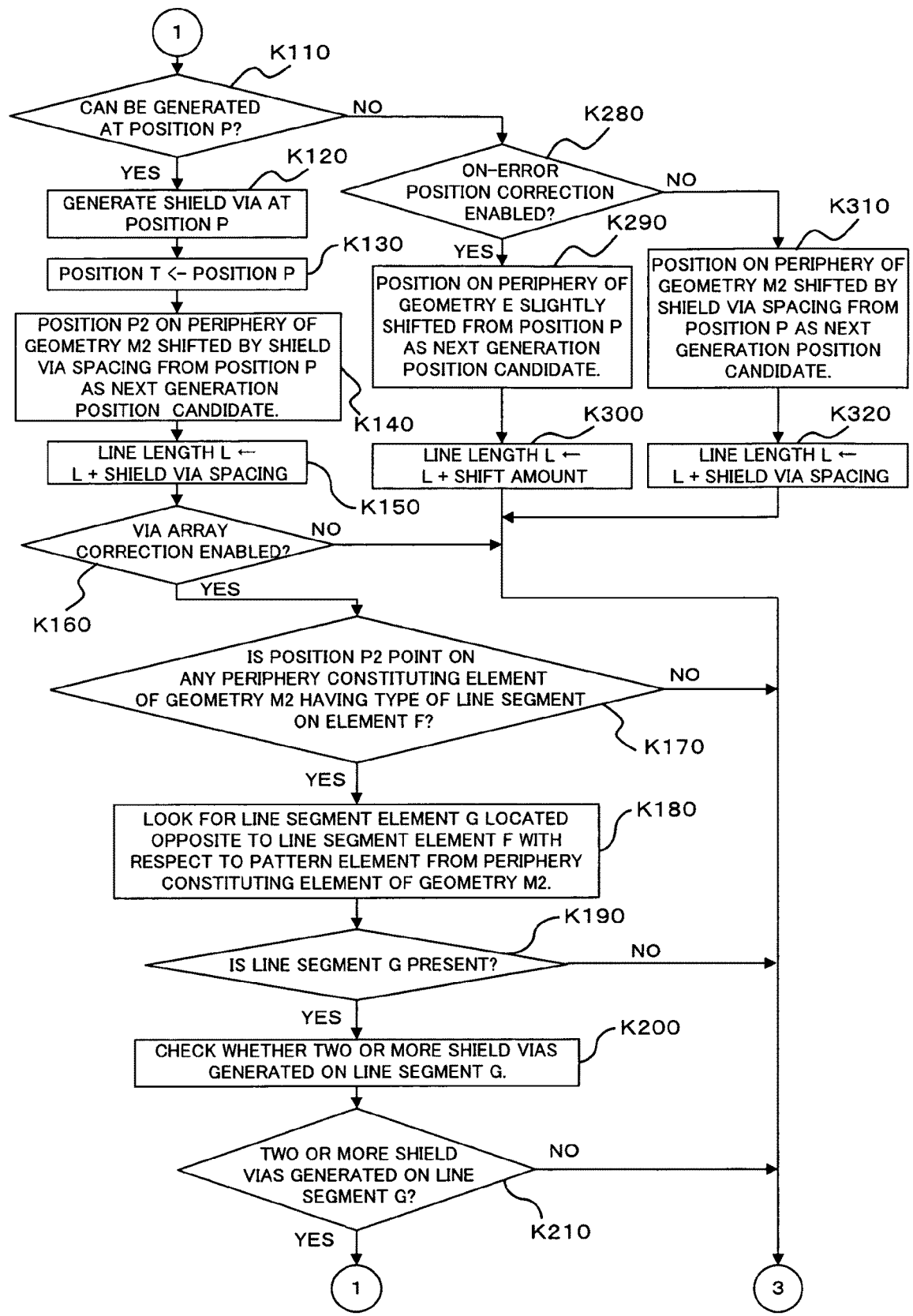
FIG. 61 is a flowchart illustrating a method for generating a shield via in a circuit board design aid apparatus as one embodiment.
Figure 62:
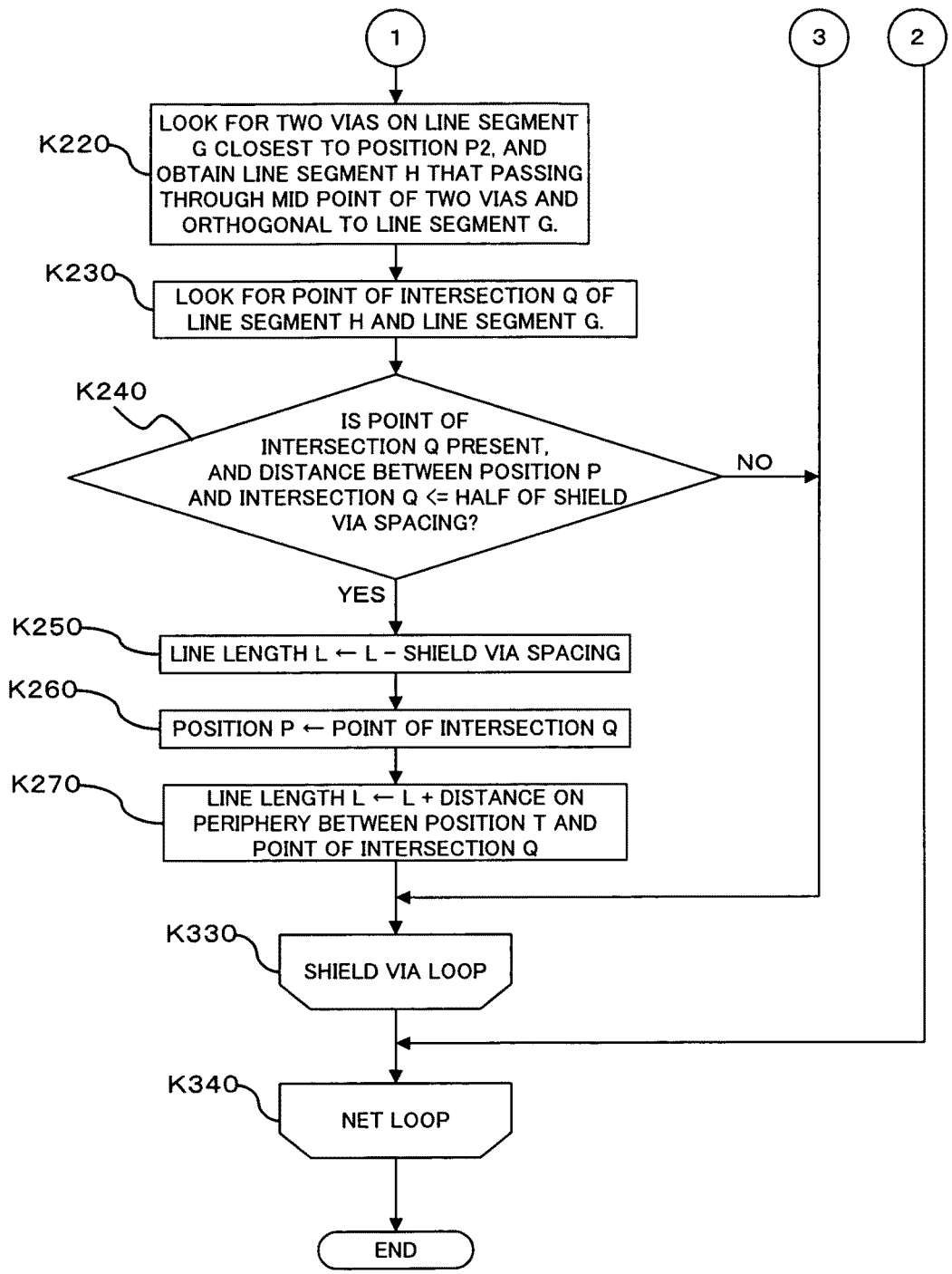
FIG. 62 is a flowchart illustrating a method for generating a shield via in a circuit board design aid apparatus as one embodiment.
Figure 63:
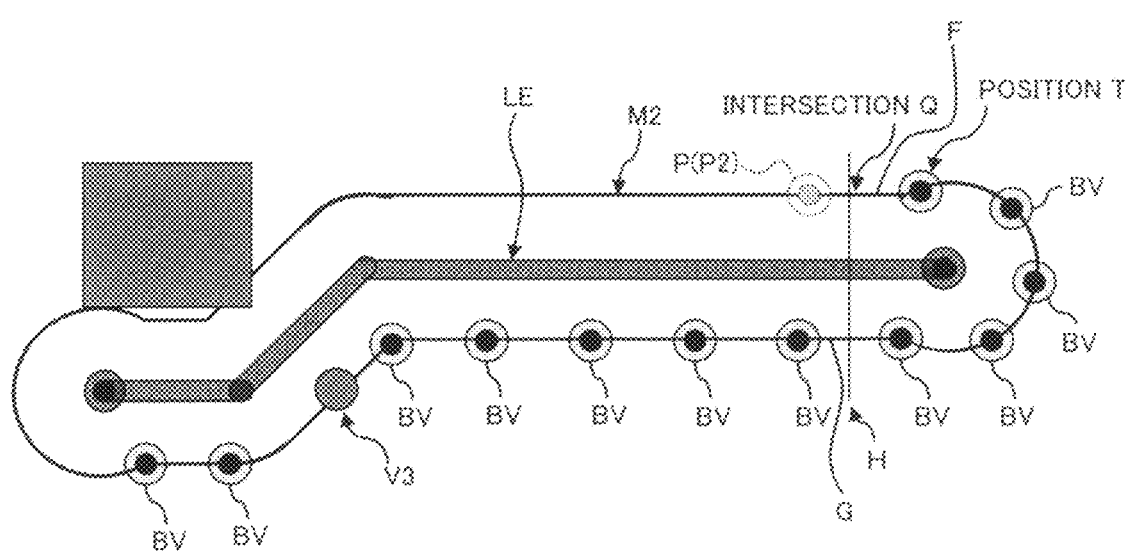
FIG. 63 is a diagram illustrating a technique for placing shield vias in this circuit board design aid apparatus.

Next, a technique for generating a shield via in the circuit board design aid apparatus 100 as one embodiment will be described with reference to a flowchart (Steps K10-K340) illustrated in FIG. 60 to FIG. 62. Note that FIG. 63 is a diagram illustrating a technique for placing shield vias in this circuit board design aid apparatus.

When generating a build-up via (shield via) BV, the operator enters a shield via geometry, a shield via spacing, whether on-error position correction is required, whether via array correction is required, and nets for generating shield vias (N), through an input screen (not illustrated), displayed on the display 51, for example, using the keyboard 52 and/or the mouse 55 (Step K10). The shield via execution generation section 26 obtains such information, stores it into a predetermined storing region in the RAM 53, the storing section 60, or the like.

Then, the shield via execution generation section 26 sets an initial value of 1 to a variable "n" (n is a natural number), and the processing in the following Steps K30-K330 is repeated while incrementing "n" until n=N (net loop; Steps K20-K340).

The shield via execution generation section 26 checks whether or not generation of a shield pattern is instructed for the upper layer and upper and lower layers by looking up the net information 61 or the pattern information 62 (Step K30). When generation of a shield pattern is not instructed for these upper layer and upper and lower layers (see the "NO" route in Step K30), the shield via execution generation section 26 increments the value "n" (n=n+1) to go to the next net. Thereafter, the processing of the following Steps K30-K330 is repeated until n=N (net loop; Steps K20-K340). When the all of the nets are processed, the processing is terminated.

In addition, when generation of a shield pattern is instructed for the upper layer and upper and lower layers (see the "YES" route in Step K30), the shield via execution generation section 26 obtains each wiring pattern element LE related to the net for generating shield vias (build-up vias BV), and generates each geometry M1 (see FIG. 38) by magnifying it by the value obtained by adding the via conductor radius D to the shield pattern spacing "d" (d+D) (Step K40).

Then, the shield via execution generation section 26 generates such a geometry M1 for each interconnection layer, and generates the outline geometry M2 thereof (see FIG. 39) (Step K50).

The shield via execution generation section 26 sets an arbitrary point P on the periphery of the geometry M2, sets this point P as an initial shield via generation position candidate (Step K60), and set an initial value of 0 to a variable L (length L) (Step K70).

In addition, the shield via execution generation section 26 calculates the number NV of shield vias that can be disposed on the outer periphery of the geometry M2 based on the shield via spacing entered in Step K10 and the length of the outer periphery of the geometry M2, for example.

Then, the shield via execution generation section 26 sets an initial value of 1 to a variable "nv" (nv is a natural number), and the processing in the following Steps K90-K230 is repeated while incrementing "nv" until nv=NV (shield via loop; Steps K80-K330).

The shield via execution generation section 26 determines whether or not the length L is greater than (the length of the outer periphery of the geometry M2−shield via spacing) (Step K90). When the length L is equal to or smaller than (the length of the outer periphery of the geometry M2−shield via spacing) (see the "NO" route in Step K90), the flow goes to Step K340 to go to the next net.

Otherwise, when the length L is greater than (the length of the outer periphery of the geometry M2−shield via spacing) (see the "YES" route in Step K90), the via position evaluation section 261 checks whether or not a valid build-up via having the instructed on instructed interconnection layer the via geometry can be generated at the position P (Step K100).

The via position evaluation section 261 determines whether or not a build-up via can be generated at the position P (Step K110). When a build-up via can be generated (see the "YES" route in Step K110), the shield via execution generation section 26 generates a build-up via at that position P (Step K120). In addition, the shield via execution generation section 26 sets the position of the position P to a variable "position T" (coordinate value) (Step K130).

In addition, the shield via execution generation section 26 sets a point (position P2) on the outer periphery of the geometry M2, which is displaced from the position P by the shield via spacing, as the next generation position candidate P (Step K140), and sets the value obtained by adding the shield via spacing to the line length L (the line length L=the line length L+shield via spacing) as the new line length L (Step K150).

Next, the shield via execution generation section 26 checks whether or not the via array correction function is enabled (Step K160).

When the via array correction function is enabled (see the "YES" route in Step K160), the via position adjustment section 263 checks whether or not the position P2 is on an element F of which geometry type is line segment from elements constituting the outer periphery of the geometry M2 (Step K170).

When the position P2 is on an element F of which geometry type is line segment from elements constituting the outer periphery of the geometry M2 (see the "YES" route in Step K170), the via position adjustment section 263 then checks whether or not there is any line segment element G at the position opposing to the wiring pattern element LE from line segment element F from the elements constituting the outer periphery of the geometry M2 (Step K180).

Then, the via position adjustment section 263 checks whether or not there is any line segment element G (line segment G) at the position opposing to the wiring pattern element LE from line segment element F (Step K190). When there is a line segment G (see the "YES" route in Step K190), the via position adjustment section 263 then checks whether or not two or more shield vias are generated on the line segment G (Step K200).

The via position adjustment section 263 checks whether or not two or more shield vias are generated on the line segment G (Step K210). When two or more shield vias are generated on the line segment G (see the "YES" route in Step K210), as depicted in FIG. 63, the via position adjustment section 263 identifies two vias on the line segment G closest to the position P2, and generates a virtual line segment H that pass the midpoint of these tow vias and is orthogonal to the line segment G (Step K220).

Then, the via position adjustment section 263 calculates the position of a point of intersection Q between the line segment H and the line segment F (Step K230), and checks whether or not such a point of intersection Q exists, and, if so, the distance between the position P and the point of intersection Q is equal to or smaller than a half of the shield via spacing (Step K240).

When the point of intersection Q exists and the distance between the position P and the point of intersection Q is equal to or smaller than a half of the shield via spacing (see the "YES" route in Step K240), the via position adjustment section 263 sets the value of (the line length L−shield via spacing) to the line length L (line length L=line length L−shield via spacing) (Step K250).

In addition, the via position adjustment section 263 sets the position of the point of intersection Q to the position P (Step K260), sets (line length L+distance between the position T and the point of intersection Q on outer periphery) to the line length L (line length L=line length L+distance between the position T and the point of intersection Q on outer periphery) (Step K270).

On the other hand, when a build-up via cannot be generated at the position P (see the "NO" route in Step K110), the shield via execution generation section 26 checks whether or not the on-error position correction function is enabled (Step K280).

When the on-error position correction function is enabled (see the "YES" route in Step K280), the via position modification section 262 sets a point on the outer periphery of the geometry M2, which is slightly displaced from the position P, as the next generation position candidate P (Step K290), and sets the value obtained by adding this displacement amount to the line length L as the new line length L (line length L=line length L+displacement amount (Step K300).

In addition, when the on-error position correction function is disabled (see the "NO" route in Step K280), the via position modification section 262 sets a point on the outer periphery of the geometry M2, which is displaced from the position P by the shield via spacing, as the next generation position candidate P (Step K310), and sets the value obtained by adding the shield via spacing to the line length L as the new line length L (line length L=line length L+shield via spacing) (Step K320).

Then, as set forth previously, after the line length L is updated (see Step K270, K300, or K320), or when the via correction is not enabled (see the "NO" route in Step K160), when the position P2 is not on an element F of which geometry type is line segment from elements constituting the outer periphery of the geometry M2 (see the "NO" route in Step K170), when the line segment G does not exist (see the "NO" route in Step K190), when only one shield via is generated on the line segment G or no shield via is generated (see the "NO" route in Step K210), when the point of intersection Q does not exist or the distance between the position P and the point of intersection Q is not equal to or smaller than a half of the shield via spacing (see the "NO" route in Step K240), "nv" is incremented (nv=nv+1) to go to the next shield via. Thereafter, the processing of the above-described Steps K90-K320 is repeated until nv=NV (shield via loop; Steps K80-K330).

In addition, when the all of the shield vias are processed, value "n" is incremented (n=n+1) to go to the next net. Thereafter, the processing of the above-described Steps K30-K330 is repeated until n=N (net loop; Steps K20-K340). When the all of the nets are processed, the processing is terminated.

Figure 64:
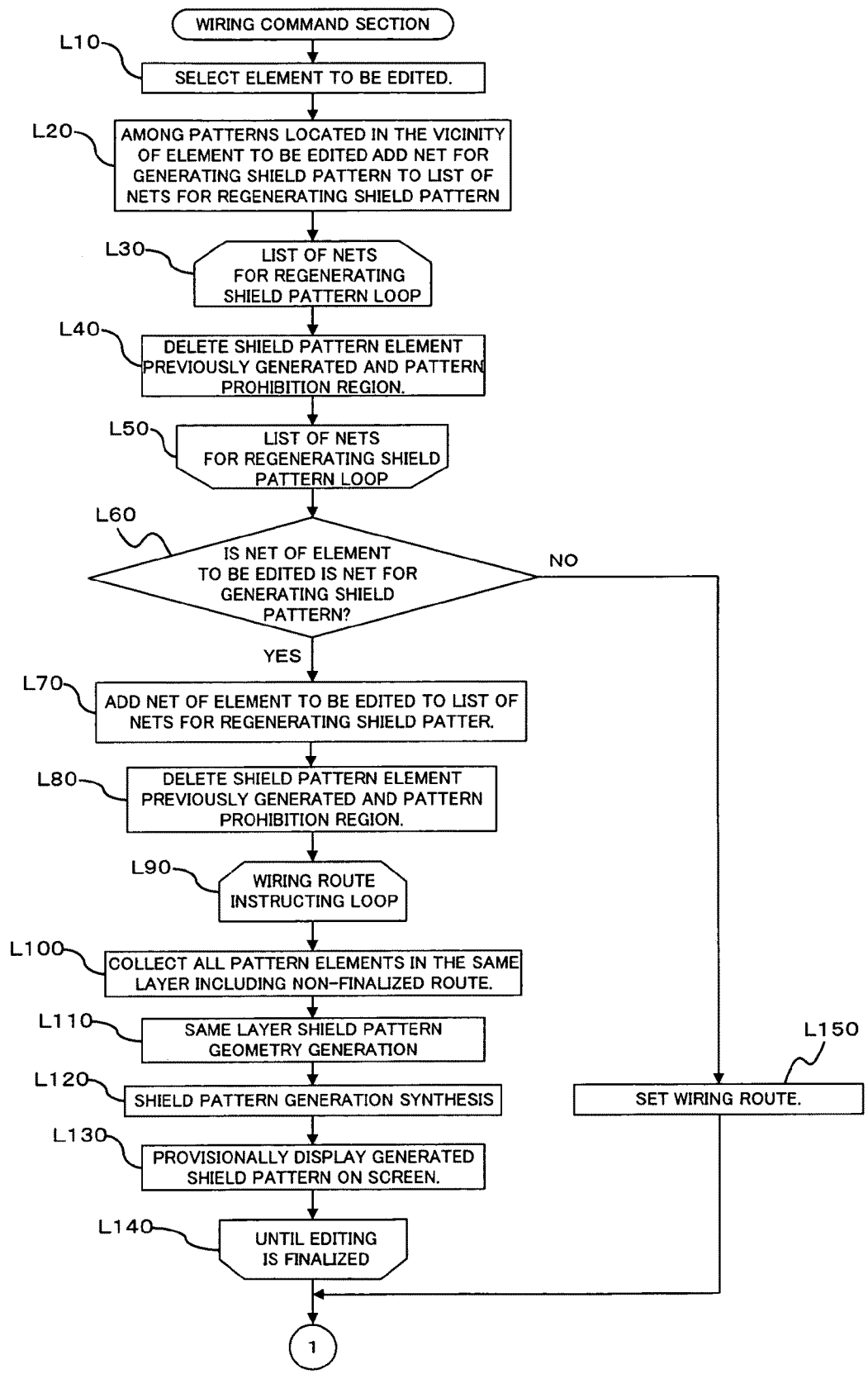
FIG. 64 is a flowchart illustrating processing for editing a shield pattern in a circuit board design aid apparatus as one embodiment.
Figure 65:
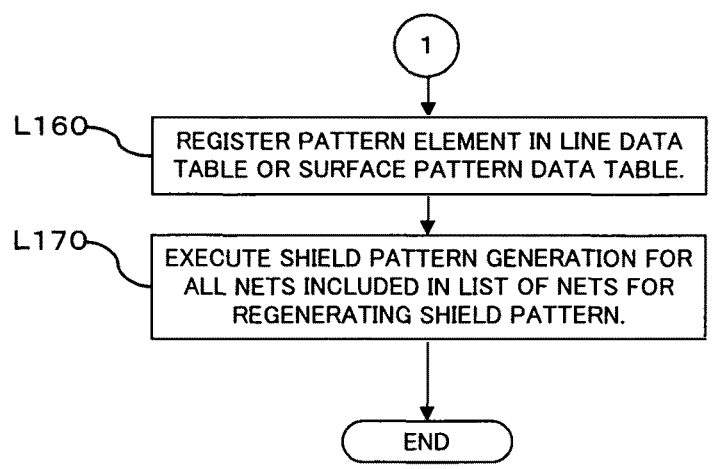
FIG. 65 is a flowchart illustrating processing for editing a shield pattern in a circuit board design aid apparatus as one embodiment.

Next, processing when editing a wiring pattern on a circuit board in the circuit board design aid apparatus 100 as one embodiment will be described with reference to a flowchart (Steps L10-L170) illustrated in FIG. 64 and FIG. 65. Note that FIG. 64 illustrates processing related to Steps L10-L150, and FIG. 65 illustrates processing related to Steps L160-L170.

For example, when an operator edits a wiring pattern L on a on a printed circuit board displayed on the display 51 using a function of the wiring the pattern editing command section 30, the shield pattern generation execution section 20 selects the edited wiring pattern element LE (element to be edited) (Step L10).

Then, the shield pattern generation execution section 20 adds nets for which a shield pattern is to be generated from patterns near the element to be edited in to a list of nets for which a shield pattern is to be generated (Step L20).

The shield pattern generation execution section 20 checks each net registered in the list of nets for which a shield pattern is to be generated, and sequentially delete a previously generated shield pattern element or a prohibition region (pattern prohibition region) from the pattern information 62 and the prohibition region information 63 (Steps L30-L50).

The shield pattern generation execution section 20 checks whether or not the net of element to be edited is a net for generating a shield pattern (Step L60). When the net of the element to be edited is a net for generating a shield pattern (see the "YES" route in Step L60), the shield pattern generation execution section 20 adds the net of the element to be edited to the list of nets for which a shield pattern is to be generated (Step L70).

Thereafter, the shield pattern generation execution section 20 deletes a previously generated shield pattern element and a pattern prohibition region (prohibition region) from the pattern information 62 (the surface pattern information 68, the line information 66b) and the prohibition region information 63 (Step L80).

Then, the shield pattern generation execution section 20 repeats the processing of the following Steps L100-L130 until the editing is finalized (Steps L90-L140; wiring route instruction loop).

That is, the shield pattern generation execution section 20 collects all pattern element on the same interconnection layer (same layer) including an non-finalized route (Step L100), generates a same layer shield pattern for the collected pattern elements by the same layer shield pattern element generation section 21 (Step L110), and generates a shield pattern geometry based on the generated same layer shield pattern by the shield pattern geometry generation section 25 (Step L120). In addition, the generated shield pattern geometry is displayed on the display 51 (Step L130).

On the other hand, the net of the element to be edited is not a net for generating a shield pattern (see the "NO" route in Step L60), a wiring route is set (Step L150).

Thereafter, the pattern element is registered to the line data table and the surface pattern table (Step L160), and generates a shield pattern for all nets in the list of nets for which a shield pattern is to be generated (Step L170).

As described above, according to the circuit board design aid apparatus 100 as one embodiment, shield patterns can be easily generated for a wiring pattern L (net), which is convenient Furthermore, surface patterns SPS and line patterns SPL can also be easily generated.

In addition, shield patterns SP satisfying various clearance conditions can be easily generated by generating, by the shield pattern geometry generation section 25, a shield pattern by excluding a prohibition region generated by the pattern prohibition region generation section 24 from a geometry of a shield pattern element SPSE or SPLE generated by the same layer shield pattern element generation section 21, the top and bottom layer shield pattern element generation section 22 and the intermediate layer shield pattern element generation section 23.

Furthermore, since the same layer shield pattern element generation section 21 generates a shield pattern element SPSE or SPLE relating to a same layer shield pattern, a same layer shield pattern can be easily generated, which is convenient.

Similarly, since the top and bottom layer shield pattern element generation section 22 generates a shield pattern element SPSE or SPLE relating to a top or bottom layer shield pattern, a top or bottom layer shield pattern can be easily generated. In addition, since the intermediate layer shield pattern element generation section 23 generates a shield pattern element SPSE or SPLE relating to an intermediate layer shield pattern, an intermediate layer shield pattern can be easily generated, which is convenient.

Since the shield pattern check section 40 performs a geometry evaluation generated shield patterns, the qualities of the generated shield patterns can be assured so that the qualities can be improved.

Especially since the shield pattern spacing check execution section 41 evaluates a spacing between a pattern element and a shield pattern element, a shield pattern SP satisfying a clearance condition between the pattern element and the shield pattern element can be generated.

In addition, the shield pattern generation rate check execution section 42 evaluates a generated shield pattern SP based on the ratio of the area of the geometry of the actually generated shield pattern with respect to the area of the required shield pattern geometry (area ratio; a shield pattern generation ratio). Thus, enhanced shield performances of shield patterns can be maintained, and the qualities of the generated shield pattern SP can be improved.

Furthermore, the shield pattern generation rate check execution section 42 determines the generation ratio of the shield pattern based on ratio of where no shield pattern is generated (length ratio; shield pattern generation ratio) and evaluates the generated shield pattern SP. Thus, enhanced shield performances of shield patterns can be maintained, and the qualities of the generated shield pattern SP can be improved.

In addition, in the shield pattern check section 40, the generated shield pattern SP can be evaluated by detecting a shield pattern that is spaced apart with a spacing greater than a defined spacing. Thus, enhanced shield performances of shield patterns can be maintained, and the qualities of the generated shield pattern SP can be improved.

Thus, shield vias (build-up vias) can be easily generated by the shield via generation execution section 26, which is convenient.

In addition, when the position of a build-up via is determined as inappropriate by the via position evaluation section 261, the via position modification section 262 modifies (corrects) the position of the build-up via determined as inappropriate. Thus, build-up vias can be easily positioned to appropriate positions, which is convenient.

The via position adjustment section 263 adjusts the position of a via in one array so that the via is equally distant from two neighboring vias in another array in the process of placing vias with a specific spacing on the shield pattern. Thus, shield vias can be effectively positioned, which is convenient.

Note that the present invention is not restricted to the embodiment described above, and various modifications may be made without departing from the spirit of the present invention.

For example, the configuration of the circuit board design aid apparatus 100 is not the one depicted in FIG. 1. For example, an LAN interface, an I/O device, a reader/recorder of a storage medium (not illustrated) are provided, and are communicatively connected to the Internet or other devices (e.g., computers) through a network. Various types of data may be exchanged with other devices through the Internet or various storage media.

That is, for example, design data (circuit board data) generated on a different CAD system can be obtain through the LAN interface, the I/O device, the reader/recorder of a storage medium. In addition, data of a shield pattern generated by the circuit board design aid apparatus 100 may be output to an external system through the LAN interface, the I/O device, the reader/recorder of a storage medium.

Note that those ordinary skilled in the art can practice and manufacture the present invention from the disclosure of the present invention.

According to the apparatus, the method, and computer-readable storage medium storing the program as disclosed, a shield pattern satisfying the clearance condition with an object fir which a clearance check is to be performed around the pattern element can be easily generated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment has been described in detail, it should be understood that the various changes, substitutions, and alterations could be made hereto without departing from the spirit and scope of the invention.

What is claimed is:

1. A circuit board design aid apparatus that includes a processor and that generates a shield pattern for a wiring pattern including a pattern element in a circuit board, the processor executing instructions comprising:
   generating a basic shield pattern element by increasing a width of a geometry of the pattern element by an amount equal to or more than a shield pattern spacing set as a preset pattern generation condition;
   generating a prohibition region based on a geometry of an element for which a clearance check is performed located around the wiring pattern and a clearance condition between the element for performing a clearance check and the wiring pattern; and
   generating the shield pattern by excluding the geometry of the prohibition region from a geometry of the basic shield pattern element.

2. The circuit board design aid apparatus according to claim 1, further comprising creating a surface pattern as a basic shield geometry.

3. The circuit board design aid apparatus according to claim 1, further comprising creating a line pattern as a basic shield geometry.

4. The circuit board design aid apparatus according to claim 1, further comprising evaluating a geometry of the shield pattern.

5. The circuit board design aid apparatus according to claim 4, further comprising evaluating a spacing between the pattern element and the shield pattern element.

6. The circuit board design aid apparatus according to claim 4, further comprising evaluating a shield pattern generation ratio based on the geometry of the basic shield pattern element and the geometry of the basic shield pattern element excluded by the shield pattern geometry generation.

7. The circuit board design aid apparatus according to claim 1, wherein:
   the circuit board is a multi-layered circuit board comprising a plurality of interconnection layers; and
   further comprising generating the basic shield pattern element on the same layer as the wiring pattern.

8. The circuit board design aid apparatus according to claim 7, further comprising generating the basic shield pattern element on multiple interconnection layers of the multi-layered circuit board, and generating a via between the plurality of interconnection layers on which the basic shield pattern element is created.

9. The circuit board design aid apparatus according to claim 8, further comprising:
   evaluating whether a candidate position at which the via is to be generated is appropriate or inappropriate by comparing the candidate position and the position of the element for performing a clearance check; and
   modifying the candidate position of the via when the candidate position of the via is determined as inappropriate.

10. The circuit board design aid apparatus according to claim 7, further comprising relocating the via at a position on a via placement line, so that the distances from the via to each of two adjacent vias located with a certain spacing on the side opposing to the side of the via with respect to the pattern element become the same.

11. The circuit board design aid apparatus according to claim 1, wherein the circuit board is a multi-layered circuit board comprising a plurality of interconnection layers, and
   further comprising generating the basic shield pattern element on a different layer from the wiring pattern.

12. The circuit board design aid apparatus according to claim 1, wherein the circuit board is a multi-layered circuit board comprising a plurality of interconnection layers, and
   further comprising generating the basic shield pattern element on an intermediate layer between the layer on which the basic shield pattern element is generated by the end layer shield pattern element generation section and the same layer as the wiring pattern.

13. The circuit board design aid apparatus according to claim 1, further comprising storing the basic shield pattern and the prohibition region by relating them to the wiring pattern.

14. A circuit board design aid method for generating a shield pattern for a wiring pattern including a pattern element in a circuit board, the method comprising:
   by a processor,
   generating a basic shield pattern element by increasing a width of a geometry of the pattern element by an amount equal to or more than a shield pattern spacing set as a preset pattern generation condition;
   generating a prohibition region based on a geometry of an element for which a clearance check is performed located around the wiring pattern and a clearance condition between the element for performing a clearance check and the wiring pattern; and
   generating the shield pattern by excluding a geometry of the prohibition region from a geometry of the basic shield pattern element.

15. The circuit board design aid method according to claim 14, further comprising creating a surface pattern as the basic shield geometry.

16. The circuit board design aid method according to claim 14, further comprising creating a line pattern as the basic shield geometry.

17. The circuit board design aid method according to claim 14, further comprising evaluating a geometry of the shield pattern.

18. The circuit board design aid method according to claim 17, wherein the evaluating comprises evaluating a spacing between the pattern element and the shield pattern element.

19. A computer-readable, non-transitory medium storing a circuit board design aid program for causing a computer to execute a process for generating a shield pattern for a wiring pattern including a pattern element in a circuit board, the process comprising:
  generating a basic shield pattern element by increasing a width of a geometry of the pattern element by an amount equal to or more than a shield pattern spacing set as a preset pattern generation condition;
  generating a prohibition region based on a geometry of an element for which a clearance check is performed located around the wiring pattern and a clearance condition between the element for performing a clearance check and the wiring pattern; and
  generating the shield pattern by excluding the geometry of the prohibition region from a geometry of the basic shield pattern element.

* * * * *

UNITED STATES PATENT AND TRADEMARK OFFICE
CERTIFICATE OF CORRECTION

PATENT NO. : 8,856,717 B2  
APPLICATION NO. : 12/883445  
DATED : October 7, 2014  
INVENTOR(S) : Kazunori Kumagai et al.

Page 1 of 1

It is certified that error appears in the above-identified patent and that said Letters Patent is hereby corrected as shown below:

On the Title Page, Item [54], and in the Specification, Column 1, Line 1 (Title), Delete "SHIELDED" and insert -- SHIELD --, therefor.

Signed and Sealed this
Thirtieth Day of December, 2014

Michelle K. Lee
*Deputy Director of the United States Patent and Trademark Office*